(12) United States Patent
Yamazaki et al.

(10) Patent No.: US 11,289,475 B2
(45) Date of Patent: Mar. 29, 2022

(54) SEMICONDUCTOR DEVICE AND MANUFACTURING METHOD OF SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Tatsuya Onuki, Kanagawa (JP); Katsuaki Tochibayashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 295 days.

(21) Appl. No.: 16/695,385

(22) Filed: Nov. 26, 2019

(65) Prior Publication Data
US 2020/0243514 A1    Jul. 30, 2020

(30) Foreign Application Priority Data

Jan. 25, 2019 (JP) .............................. JP2019-011582

(51) Int. Cl.
*H01L 29/786* (2006.01)
*H01L 27/06* (2006.01)
*H01L 29/45* (2006.01)

(52) U.S. Cl.
CPC ........ *H01L 27/0635* (2013.01); *H01L 29/458* (2013.01); *H01L 29/78696* (2013.01)

(58) Field of Classification Search
CPC ............... H01L 27/0635; H01L 29/458; H01L 29/78696
See application file for complete search history.

(56) References Cited

U.S. PATENT DOCUMENTS 7,674,650 B2    3/2010  Akimoto et al.
8,547,771 B2   10/2013  Koyama
(Continued)

FOREIGN PATENT DOCUMENTS

JP    2011-151383 A    8/2011
JP    2012-257187 A   12/2012

OTHER PUBLICATIONS

Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.

*Primary Examiner* — Khaja Ahmad
*Assistant Examiner* — Pavel G Ivanov
(74) *Attorney, Agent, or Firm* — Fish & Richardson P.C.

(57) ABSTRACT

A semiconductor device having favorable electrical characteristics is provided. The semiconductor device includes a transistor and a capacitor. The transistor includes a first conductor and a second insulator over a first insulator; a third insulator over the first conductor and the second insulator; a fourth insulator over the third insulator; a first oxide over the fourth insulator; a second oxide and a third oxide over the first oxide; a second conductor in contact with a top surface of the third insulator, a side surface of the fourth insulator, a side surface of the first oxide, a side surface of the second oxide, and a top surface of the second oxide; a third conductor in contact with the top surface of the third insulator, a side surface of the fourth insulator, a side surface of the first oxide, a side surface of the third oxide, and a top surface of the third oxide; a fourth oxide over the first oxide; a fifth insulator over the fourth oxide; and a fourth conductor over the fifth insulator. The capacitor includes a fifth conductor over the first insulator, the third insulator over the fifth conductor, and the second conductor over the third insulator.

4 Claims, 26 Drawing Sheets

(56) References Cited

U.S. PATENT DOCUMENTS

| | | |
|---|---|---|
| 8,629,437 B2 | 1/2014 | Ishida et al. |
| 8,835,918 B2 | 9/2014 | Yamazaki et al. |
| 8,860,108 B2 | 10/2014 | Yamazaki et al. |
| 9,006,733 B2 | 4/2015 | Yamazaki |
| 9,048,142 B2 | 6/2015 | Yamazaki |
| 9,048,321 B2 | 6/2015 | Kurata et al. |
| 9,082,663 B2 | 7/2015 | Isobe et al. |
| 9,123,632 B2 | 9/2015 | Yamazaki et al. |
| 9,171,959 B2 | 10/2015 | Kurata et al. |
| 9,287,405 B2 | 3/2016 | Sasagawa et al. |
| 9,431,435 B2 | 8/2016 | Ando et al. |
| 9,431,545 B2 | 8/2016 | Saito et al. |
| 9,455,349 B2 | 9/2016 | Suzawa et al. |
| 9,466,615 B2 | 10/2016 | Miyairi et al. |
| 9,472,682 B2 | 10/2016 | Yamazaki et al. |
| 9,614,062 B2 | 4/2017 | Yamazaki |
| 9,728,648 B2 | 8/2017 | Sasagawa et al. |
| 9,780,201 B2 | 10/2017 | Ando et al. |
| 9,865,588 B2 | 1/2018 | Isobe |
| 9,887,295 B2 | 2/2018 | Suzawa et al. |
| 9,923,097 B2 | 3/2018 | Koezuka et al. |
| 9,947,802 B2 | 4/2018 | Kimura et al. |
| 9,954,004 B2 | 4/2018 | Yamazaki |
| 9,997,545 B2 | 6/2018 | Yamazaki |
| 10,103,271 B2 | 10/2018 | Suzawa et al. |
| 10,153,375 B2 | 12/2018 | Sasagawa et al. |
| 10,186,604 B2 | 1/2019 | Ando et al. |
| 10,204,898 B2 | 2/2019 | Momo et al. |
| 2002/0014648 A1 | 2/2002 | Mizutani et al. |
| 2002/0028544 A1 | 3/2002 | Fujimoto et al. |
| 2009/0283763 A1 | 11/2009 | Park et al. |
| 2012/0068179 A1 | 3/2012 | Ishida et al. |
| 2012/0161220 A1 | 6/2012 | Yamazaki |
| 2012/0193697 A1 | 8/2012 | Takemura |
| 2012/0292615 A1 | 11/2012 | Saito |
| 2013/0075722 A1 | 3/2013 | Yamazaki et al. |
| 2013/0193493 A1 | 8/2013 | Yamazaki |
| 2014/0001468 A1 | 1/2014 | Yamazaki et al. |
| 2015/0108472 A1 | 4/2015 | Suzawa et al. |
| 2015/0108475 A1 | 4/2015 | Ando et al. |
| 2015/0187814 A1 | 7/2015 | Miyairi et al. |
| 2015/0279860 A1 | 10/2015 | Yamazaki |
| 2015/0348961 A1 | 12/2015 | Isobe |
| 2016/0035865 A1 | 2/2016 | Nagamatsu et al. |
| 2016/0043070 A1 | 2/2016 | Momo et al. |
| 2016/0225620 A1* | 8/2016 | Yamazaki ......... H01L 21/02631 |
| 2017/0033205 A1 | 2/2017 | Yamazaki et al. |
| 2017/0186749 A1* | 6/2017 | Ohshima ............... G06F 1/3275 |
| 2018/0219028 A1 | 8/2018 | Yamazaki |
| 2019/0157262 A1 | 5/2019 | Momo et al. |

\* cited by examiner

FIG. 15A
| Amorphous | Crystalline | Crystal |
|---|---|---|
| completely amorphous | ・CAAC<br>・nc<br>・CAC | ・single crystal<br>・poly crystal |
FIG. 15B
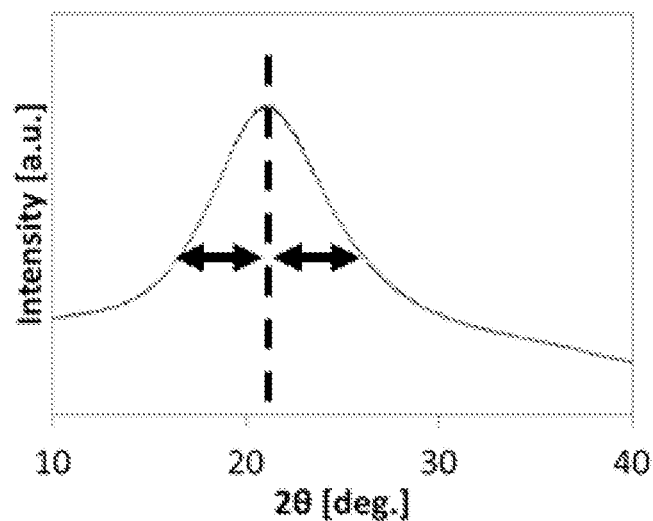
FIG. 15C
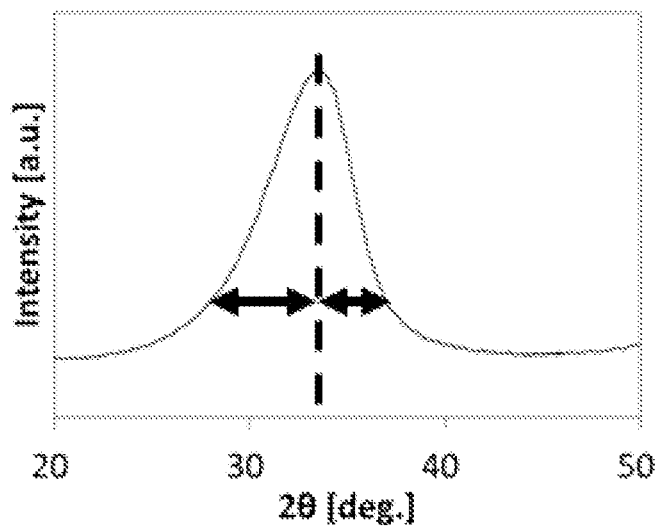

SEMICONDUCTOR DEVICE AND MANUFACTURING METHOD OF SEMICONDUCTOR DEVICE

BACKGROUND OF THE INVENTION

1. Field of the Invention

One embodiment of the present invention relates to a semiconductor device and a manufacturing method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

2. Description of the Related Art

In recent years, semiconductor devices have been developed to be used typically for an LSI, a CPU, and a memory. A CPU is an aggregation of semiconductor elements, and a CPU has a semiconductor integrated circuit (including at least a transistor and a memory) separated from a semiconductor wafer, and an electrode of a connection terminal.

A semiconductor circuit (IC chip) of an LSI, a CPU, a memory, or the like is mounted on a circuit board such as a printed wiring board to be used as one of components of a variety of electronic devices.

A technique by which a transistor is formed using a semiconductor thin film formed over a substrate having an insulating surface has attracted attention. The transistor is applied to a wide range of electronic devices such as an integrated circuit (IC) and an image display device (also simply referred to as a display device). Silicon-based semiconductor materials are widely known as materials for semiconductor thin films that can be used in a transistor. As other materials, oxide semiconductors have been attracting attention.

It is known that a transistor including an oxide semiconductor has an extremely low leakage current in an off state. For example, a low-power-consumption CPU utilizing a characteristic of a low leakage current of the transistor including an oxide semiconductor has been disclosed (see Patent Document 1). Furthermore, a memory device that can retain stored data for a long time by utilizing a characteristic of a low leakage current of the transistor including an oxide semiconductor has been disclosed, for example (see Patent Document 2).

Recently, integrated circuits are required to have a higher density as electronic devices become smaller and lighter. In addition, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

An object of one embodiment of the present invention is to provide a semiconductor device having favorable electrical characteristics. Another object of one embodiment of the present invention is to provide a semiconductor device with normally-off electrical characteristics. Another object of one embodiment of the present invention is to provide a highly reliable semiconductor device. Another object of one embodiment of the present invention is to provide a semiconductor device with a high on-state current. Another object of one embodiment of the present invention is to provide a semiconductor device with high frequency characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device with low power consumption. Another object of one embodiment of the present invention is to provide a novel semiconductor device.

Note that the descriptions of these objects do not disturb the existence of other objects. One embodiment of the present invention does not have to achieve all the objects. Other objects will be apparent from and can be derived from the descriptions of the specification, the drawings, the claims, and the like.

One embodiment of the present invention is a semiconductor device including an oxide in a channel formation region. The semiconductor device includes a transistor and a capacitor. The transistor includes a first conductor and a second insulator over a first insulator; a third insulator over the first conductor and the second insulator; a fourth insulator over the third insulator; a first oxide over the fourth insulator; a second oxide and a third oxide over the first oxide; a second conductor in contact with a top surface of the third insulator, a side surface of the fourth insulator, a side surface of the first oxide, a side surface of the second oxide, and a top surface of the second oxide; a third conductor in contact with the top surface of the third insulator, a side surface of the fourth insulator, a side surface of the first oxide, a side surface of the third oxide, and a top surface of the third oxide; a fourth oxide over the first oxide; a fifth insulator over the fourth oxide; and a fourth conductor over the fifth insulator. The capacitor includes a fifth conductor over the first insulator; the third insulator over the fifth conductor; and the second conductor over the third insulator.

The first to third oxides preferably include In, an element M (M is Al, Ga, Y, or Sn), and Zn.

The third insulator preferably includes any one of aluminum, hafnium, zirconium, and tantalum.

The first insulator preferably includes silicon and nitrogen.

One embodiment of the present invention can provide a semiconductor device having favorable electrical characteristics. One embodiment of the present invention can provide a semiconductor device with normally-off electrical characteristics. One embodiment of the present invention can provide a highly reliable semiconductor device. One embodiment of the present invention can provide a semiconductor device with a high on-state current. One embodiment of the present invention can provide a semiconductor device with high frequency characteristics. One embodiment of the present invention can provide a semiconductor device that can be miniaturized or highly integrated. One embodiment of the present invention can provide a semiconductor device that can be manufactured with high productivity.

One embodiment of the present invention can provide a semiconductor device capable of retaining data for a long time. One embodiment of the present invention can provide a semiconductor device capable of high-speed data writing. One embodiment of the present invention can provide a semiconductor device with high design flexibility. One embodiment of the present invention can provide a semiconductor device with low power consumption. One embodiment of the present invention can provide a novel semiconductor device.

Note that the descriptions of the effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

In the accompanying drawings:

FIG. 15A is a table showing a classification of crystal structures of IGZO, FIG. 15B is a graph showing an XRD spectrum of the quartz glass, and FIG. 15C is a graph showing an XRD spectrum of crystalline IGZO;

FIGS. 26A to 26D, 26E1 and 26E2, and 26F are diagrams showing electronic devices.

DETAILED DESCRIPTION OF THE INVENTION

Figure 1A:
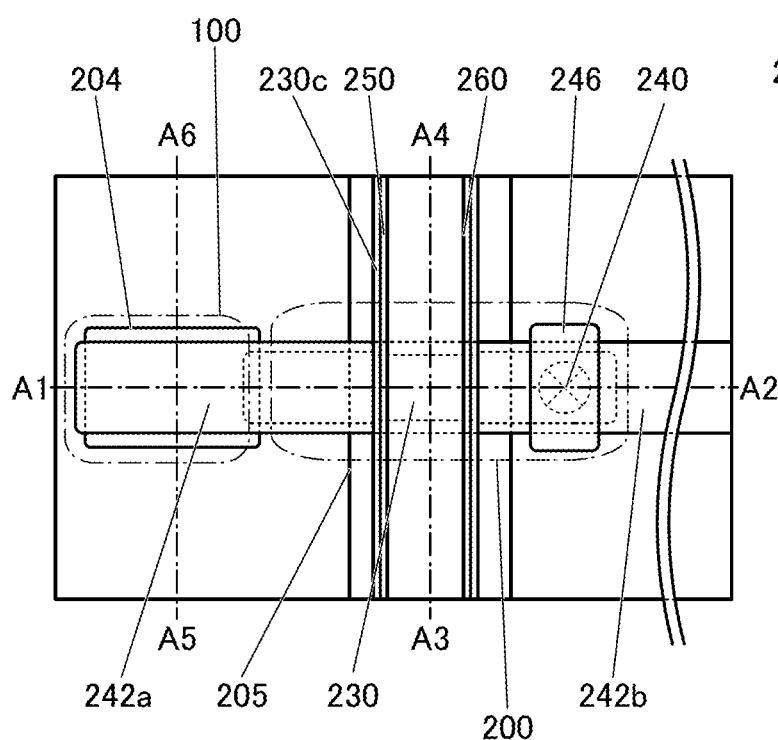
FIG. 1A is a top view of a structure example of a semiconductor device.

Embodiments will be hereinafter described with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is sometimes exaggerated for clarity. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. The same hatching pattern is applied to portions having similar functions, and the portions are not denoted by specific reference numerals in some cases.

In a top view (also referred to as a plan view), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as those used to specify one embodiment of the present invention.

In this specification and the like, the terms for describing arrangement, such as "over", "above", "under", and "below", are used for convenience to describe a positional relation between components with reference to drawings. Furthermore, the positional relation between components is changed as appropriate in accordance with the direction from which each component is described. Thus, the positional relation is not limited to that described with a term used in this specification and can be explained with other terms as appropriate depending on the situation.

For example, when this specification and the like explicitly state that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or when a direction of current flow is changed in circuit operation, for example. Therefore, the terms "source" and "drain" can be interchanged in some cases in this specification and the like.

Note that in this specification and the like, depending on the transistor structure, the channel width in a region where a channel is actually formed (channel formation region) (hereinafter also referred to as an effective channel width) is different from the channel width shown in a top view of a transistor (hereinafter also referred to as an apparent channel width) in some cases. For example, in a transistor having a gate covering a side surface of a semiconductor, an effective channel width is greater than an apparent channel width and has a non-negligible influence in some cases. For example, in a miniaturized transistor having a gate covering a side surface of a semiconductor, the proportion of a channel formation region formed in a side surface of a semiconductor is increased in some cases. In that case, the effective channel width is larger than the apparent channel width.

In such cases, an effective channel width is sometimes difficult to estimate by measuring. For example, to estimate an effective channel width from a design value, it is necessary to assume that the shape of a semiconductor is known. Accordingly, in the case where the shape of a semiconductor is not known exactly, it is difficult to measure an effective channel width accurately.

In this specification, the simple term "channel width" denotes an apparent channel width in some cases. In other cases, the simple term "channel width" denotes an effective channel width. Note that the values of a channel length, a channel width, an effective channel width, an apparent channel width, and the like can be determined by analyzing a cross-sectional TEM image and the like.

Note that an impurity in a semiconductor refers to, for example, elements other than the main components of the semiconductor. For example, an element with a concentration lower than 0.1 atomic % is regarded as an impurity. When an impurity is contained, the density of states (DOS) in a semiconductor may be increased, or the crystallinity may be decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor, such as hydrogen, lithium, sodium, silicon, boron, phosphorus, carbon, and nitrogen. Water may be an impurity for an oxide semiconductor. In the case of an oxide semiconductor, entry of impurities may form oxygen vacancies, for example. When the semiconductor is silicon, examples of an impurity which changes the characteristics of the semiconductor include oxygen, Group 1 elements except hydrogen, Group 2 elements, Group 13 elements, and Group 15 elements.

In this specification and the like, silicon oxynitride contains more oxygen than nitrogen as its composition and silicon nitride oxide contains more nitrogen than oxygen as its composition.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, the term "parallel" indicates that the angle formed between two straight lines is greater than or equal to $-10°$ and less than or equal to $10°$. Thus, the case where the angle is greater than or equal to $-5°$ and less than or equal to $5°$ is also included. The term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$. Thus, the case where the angle is greater than or equal to $85°$ and less than or equal to $95°$ is also included. In addition, the term "substantially perpendicular" indicates that the angle formed between two straight lines is greater than or equal to 60° and less than or equal to 120°.

Note that in this specification, a barrier film refers to a film having a function of inhibiting the transmission of oxygen and impurities such as water or hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. An OS FET or an OS transistor is a transistor including an oxide or an oxide semiconductor.

In this specification and the like, the term "normally off" means that current per micrometer of a channel width flowing in a transistor is lower than or equal to $1 \times 10^{-20}$ A at room temperature, lower than or equal to $1 \times 10^{-18}$ A at 85° C., or lower than or equal to $1 \times 10^{-16}$ A at 125° C. when potential is not applied to a gate or the gate is supplied with a ground potential.

Embodiment 1

An example of a semiconductor device of one embodiment of the present invention including a transistor 200 and a capacitor 100 and a manufacturing method of the semiconductor device are described below.

<Structure Example of Semiconductor Device>

FIGS. 1A to 1D are a top view and cross-sectional views of the semiconductor device including the transistor 200 and the capacitor 100 of one embodiment of the present invention.

Figure 1C:
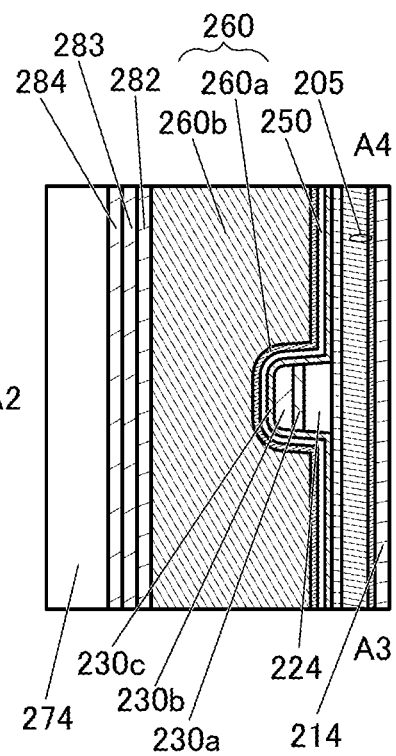
FIGS. 1B to 1D are cross-sectional views of a structure example of a semiconductor device.
Figure 1B:
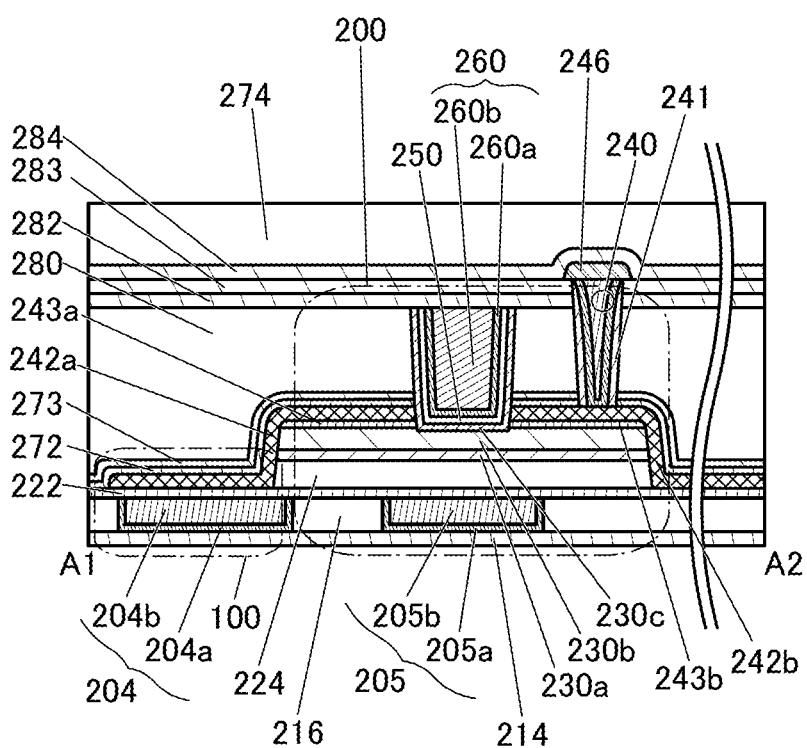
Figure 1D:
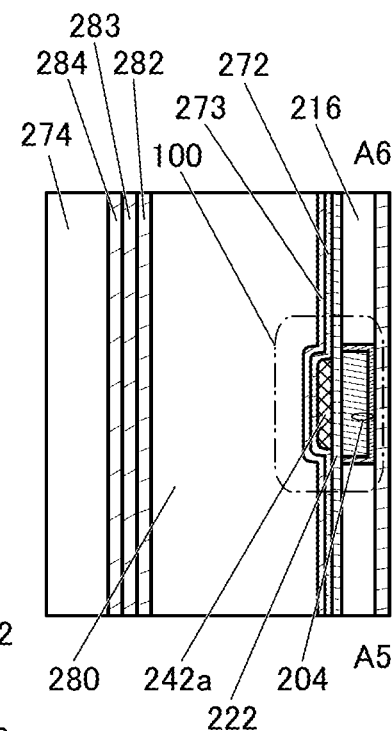

FIG. 1A is a top view of the semiconductor device including the transistor 200 and the capacitor 100. FIGS. 1B to 1D are cross-sectional views of the semiconductor device. FIG. 1B is a cross-sectional view taken along the dashed-dotted line A1-A2 in FIG. 1A, which is a cross-sectional view of the transistor 200 and the capacitor 100 in the channel length direction. FIG. 1C is a cross-sectional view taken along the dashed-dotted line A3-A4 in FIG. 1A, which is a cross-sectional view of the transistor 200 in the channel width direction. FIG. 1D is a cross-sectional view taken along the dashed-dotted line A5-A6 in FIG. 1A, which is a cross-sectional view of the capacitor 100 in the channel width direction. Note that for simplification, some components are not illustrated in the top view in FIG. 1A.

The semiconductor device of one embodiment of the present invention includes an insulator 214 over a substrate (not illustrated), the transistor 200 and the capacitor 100 over the insulator 214, an insulator 280 over the transistor 200 and the capacitor 100, an insulator 282 over the insulator 280, an insulator 283 over the insulator 282, an insulator 284 over the insulator 283, and an insulator 274 over the insulator 284. The insulators 214, 216, 280, 282, 283, and 274 each function as an interlayer film. The semiconductor device also includes a conductor 240 that is electrically connected to the transistor 200 and functions as a plug. Note that an insulator 241 is provided in contact with the side surface of the conductor 240 functioning as a plug. A conductor 246, which is electrically connected to the conductor 240 and functions as a wiring, is provided over the insulator 283 and the conductor 240. The insulator 284 is provided over the conductor 246 and the insulator 283.

The insulator 241 is provided in contact with the inner wall of an opening formed in the insulators 272, 273, 280, 282, and 283, a first conductor of the conductor 240 is provided in contact with the side surface of the insulator 241, and a second conductor of the conductor 240 is provided in contact with the side surface of the first conductor of the conductor 240. The top surface of the conductor 240 can be substantially level with the top surface of the insulator 283. Although the first conductor of the conductor 240 and the second conductor of the conductor 240 are stacked in the transistor 200, the present invention is not limited thereto. For example, the conductor 240 may have a single-layer structure or a stacked-layer structure of three or more layers. In the case where a stacked-layer structure is employed, the layers may be distinguished by numbers corresponding to the formation order.

[Transistor 200]

As shown in FIG. 1B, the transistor 200 includes an insulator 216 over the insulator 214; a conductor 205 (a conductor 205a and a conductor 205b) embedded in the insulator 216; an insulator 222 over the insulator 216 and the conductor 205; an insulator 224 over the insulator 222; an oxide 230a over the insulator 224; an oxide 230b over the oxide 230a, an oxide 243a and an oxide 243b over the oxide 230b; a conductor 242a in contact with a top surface of the insulator 222, a side surface of the insulator 224, a side surface of the oxide 230a, a side surface of the oxide 230b, a side surface of the oxide 243a, and a top surface of the oxide 243a; a conductor 242b in contact with the top surface of the insulator 222, a side surface of the insulator 224, a side surface of the oxide 230a, a side surface of the oxide 230b, a side surface of the oxide 243b, and a top surface of the oxide 243b; an insulator 272 in contact with the top surface of the insulator 222, a side surface of the conductor 242a, the top surface of the conductor 242a, a side surface of the conductor 242b, and a top surface of the conductor 242b; an insulator 273 over the insulator 272; an oxide 230c over the oxide 230b; an insulator 250 over the oxide 230c; and a conductor 260 (a conductor 260a and a conductor 260b) which is over the insulator 250 and overlaps with the oxide 230c. The oxide 230c is in contact with a side surface of the oxide 243a, a side surface of the oxide 243b, a side surface of the conductor 242a, a side surface of the conductor 242b, a side surface of the insulator 272 and a side surface of the insulator 273. The conductor 260 includes the conductor 260a and the conductor 260b. The conductor 260a is positioned to cover the bottom surface and the side surfaces of the conductor 260b. As shown in FIG. 1B, a top surface of the conductor 260 is substantially aligned with a top surface of the insulator 250 and a top surface of the oxide 230c. The insulator 282 is in contact with top surfaces of the conductor 260, the insulator 250, the oxide 230c, and the insulator 280.

Hereinafter, the oxide 243a and the oxide 243b are collectively referred to as an oxide 243 in some cases. The conductor 242a and the conductor 242b are collectively referred to as a conductor 242 in some cases.

Here, the conductor 260 functions as a gate electrode of the transistor 200, and the conductor 242a and the conductor 242b function as a source electrode and a drain electrode of the transistor 200. The conductor 260 functioning as a gate is formed in a self-aligned manner to be fit into an opening formed in the insulators 280, 273, and 272, the conductor 242, and the oxide 243. The formation of the conductor 260 in this manner allows the conductor 260 to be set in a desired position certainly between the conductor 242a and the conductor 242b without alignment.

At least one of the insulators 214, 222, 272, 273, 282, and 283 preferably has a function of inhibiting diffusion of hydrogen (at least one of hydrogen atoms and hydrogen molecules, for example) or water molecules. In particular, the insulators 214, 273, and 283 each preferably have an excellent function of inhibiting diffusion of hydrogen (at least one of hydrogen atoms and hydrogen molecules, for example) or water molecules. At least one of the insulators 214, 222, 272, 273, 282, and 283 preferably has a function of inhibiting diffusion of oxygen (at least one of oxygen atoms and oxygen molecules, for example). For example, at least one of the insulators 214, 222, 272, 273, 282, and 283 less easily transmits one or both of oxygen and hydrogen than the insulator 224. At least one of the insulators 214, 222, 272, 273, 282, and 283 less easily transmits one or both of oxygen and hydrogen than the insulator 250. At least one of the insulators 214, 222, 272, 273, 282, and 283 less easily transmits one or both of oxygen and hydrogen than the insulator 280.

Aluminum oxide, hafnium oxide, gallium oxide, indium gallium zinc oxide, silicon nitride, or silicon nitride oxide can be used for the insulators 214, 222, 272, 273, 282, and 283, for example. In particular, the insulator 214 and the insulator 283 are preferably formed using silicon nitride or silicon nitride oxide with a higher hydrogen barrier property.

In one embodiment of the semiconductor device described in this embodiment, part of side surfaces of the insulator 224 is in contact with the conductor 242, the conductor 242 is covered with the insulator 272, and the insulator 273 is positioned over the insulator 272, which is shown in FIG. 1B. The conductor 242 is sealed by the insulators 272 and 273; this inhibits oxidation of the conductor 242. The structure also yields a preferable result in some cases that hydrogen in the insulator 224 is absorbed into the insulator 272 through the conductor 242.

The oxide 230 preferably includes the oxide 230*a* over the insulator 224, the oxide 230*b* over the oxide 230*a*, and the oxide 230*c* that is over the oxide 230*b* and is at least partly in contact with the top surface of the oxide 230*b*. The side surfaces of the oxide 230*c* are preferably in contact with the oxides 243*a* and 243*b*, the conductors 242*a* and 242*b*, and the insulators 272, 273, and 280.

The transistor 200 employs a structure where the three layers of the oxides 230*a*, 230*b*, and 230*c* are stacked in the channel formation region and its vicinity; however, the present invention is not limited to this structure. For example, the transistor 200 may have a single-layer structure of the oxide 230*b*, a two-layer structure of the oxide 230*b* and the oxide 230*a* or 230*c*, or a stacked-layer structure of four or more layers. For example, the transistor 200 may have a four-layer structure of the oxides 230*a* and 230*b*, and two layers of the oxide 230*c*.

The oxide 230 (oxides 230*a*, 230*b*, and 230*c*) which includes the channel formation region preferably contains a metal oxide functioning as an oxide semiconductor (hereinafter referred to simply as oxide semiconductor). The metal oxide functioning as an oxide semiconductor preferably has an energy gap of 2 eV or more, preferably 2.5 eV or more, for example. The metal oxide with a wide energy gap makes leakage current in a non-conduction state (off-state current) of the transistor 200 extremely small. Such a transistor enables a semiconductor device with low power consumption.

For example, as the oxide 230, a metal oxide such as an In-M-Zn oxide (M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is used. In particular, aluminum, gallium, yttrium, or tin is preferably used as the element M. Alternatively, an In oxide, an In-M oxide, an In—Zn oxide, or an M-Zn oxide is used as the oxide 230.

The oxide 230 includes the oxide 230*a*, the oxide 230*b* over the oxide 230*a*, and the oxide 230*c* over the oxide 230*b*. The oxide 230*a* under the oxide 230*b* inhibits diffusion of impurities into the oxide 230*b* from the components formed below the oxide 230*a*. The oxide 230*c* over the oxide 230*b* inhibits diffusion of impurities into the oxide 230*b* from the components formed above the oxide 230*c*.

The oxide 230 preferably has a stacked-layer structure of oxides with different atomic ratios of each metal element. Specifically, the atomic ratio of the element M to constituent elements in the metal oxide used as the oxide 230*a* is preferably higher than that in the metal oxide used as the oxide 230*b*. The atomic ratio of the element M to In in the metal oxide used as the oxide 230*a* is preferably higher than that in the metal oxide used as the oxide 230*b*. The atomic ratio of In to the element M in the metal oxide used as the oxide 230*b* is preferably higher than that in the metal oxide used as the oxide 230*a*. The oxide 230*c* can be formed using a metal oxide that can be used as the oxide 230*a* or the oxide 230*b*.

Specifically, as the oxide 230*a*, a metal oxide having an atomic ratio of In:Ga:Zn=1:3:4 or in the vicinity thereof, or In:Ga:Zn=1:1:0.5 or in the vicinity thereof can be used. As the oxide 230*b*, a metal oxide having an atomic ratio of In:Ga:Zn=4:2:3 or in the vicinity thereof, or In:Ga:Zn=1:1:1 or in the vicinity thereof can be used. As the oxide 230*c*, a metal oxide having an atomic ratio of In:Ga:Zn=1:3:4 or in the vicinity thereof, In:Ga:Zn=4:2:3 or in the vicinity thereof, In:Ga:Zn=5:1:3 or in the vicinity thereof, In:Ga:Zn=10:1:3 or in the vicinity thereof, Ga:Zn=2:1 or in the vicinity thereof, or Ga:Zn=2:5 or in the vicinity thereof can be used. When the oxide 230*c* has a stacked-layer structure, a stacked layer structure of a metal oxide having an atomic ratio of In:Ga:Zn=4:2:3 or in the vicinity thereof and a metal oxide having an atomic ratio of In:Ga:Zn=1:3:4 or in the vicinity thereof, a stacked-layer structure of a metal oxide having an atomic ratio of In:Ga:Zn=4:2:3 or in the vicinity thereof and a metal oxide having an atomic ratio of In:Ga:Zn=5:1:3 or in the vicinity thereof, a stacked-layer structure of a metal oxide having an atomic ratio of Ga:Zn=2:1 or in the vicinity thereof and a metal oxide having an atomic ratio of In:Ga:Zn=4:2:3 or in the vicinity thereof, a stacked-layer structure of a metal oxide having an atomic ratio of Ga:Zn=2:5 or in the vicinity thereof and a metal oxide having an atomic ratio of In:Ga:Zn=4:2:3 or in the vicinity thereof, or a stacked-layer structure of gallium oxide and a metal oxide having an atomic ratio of In:Ga:Zn=4:2:3 or in the vicinity thereof can be given as specific examples. Note that the vicinity of the atomic ratio includes ±30% of an intended atomic ratio.

The oxide 230*b* preferably has crystallinity. For example, the oxide 230*b* preferably has a c-axis-aligned crystalline oxide semiconductor (CAAC-OS) described later. An oxide having crystallinity, such as a CAAC-OS, has a dense structure with small amounts of impurities and defects (e.g., oxygen vacancies) and high crystallinity. This reduces oxygen extraction from the oxide 230*b* by the source or the drain electrode. This inhibits oxygen extraction from the oxide 230*b* even when heat treatment is performed; hence, the transistor 200 is stable against high temperatures in the manufacturing process (i.e., thermal budget).

The energy of the conduction band minimum of each of the oxides 230a and 230c is preferably higher than that of the oxide 230b. In other words, the electron affinity of each of the oxides 230a and 230c is preferably smaller than that of the oxide 230b.

Here, Ec can be obtained from Ip and Eg, where Ec is the electron affinity or the energy level of the conduction band minimum; Ip is an ionization potential, which is a difference between the vacuum level and the energy level Ev of the valence band maximum; Eg is an energy gap. The ionization potential Ip can be measured with, for example, an ultraviolet photoelectron spectroscopy (UPS) apparatus. The energy gap Eg can be measured with, for example, a spectroscopic ellipsometer.

The energy level of the conduction band minimum gradually varies at a junction portion of each of the oxides 230a, 230b, and 230c. In other words, the energy levels of the conduction band minimum at a junction portion of each of the oxides 230a, 230b, and 230c continuously vary or are continuously connected. This can be achieved in such a way that the density of defect states in a mixed layer formed at the interface between the oxides 230a and 230b and the interface between the oxides 230b and 230c is decreased.

The oxide 230b serves as a main carrier path. When the oxides 230a, 230b, and 230c have the above composition, the density of defect states at the interface between the oxides 230a and 230b and the interface between the oxides 230b and 230c can be made low. This reduces the influence of interface scattering on carrier conduction, and the transistor 200 can have a high on-state current and high frequency characteristics.

An oxide semiconductor with low carrier density is preferably used for the oxide 230, such as the oxide 230b. The concentration of impurities and the density of defect states are lowered in order to make the carrier density of the oxide semiconductor low. In this specification and the like, a state with a low impurity concentration and a low density of defect states is referred to as a highly purified intrinsic or substantially highly purified intrinsic state. Examples of impurities contained in an oxide semiconductor include hydrogen, nitrogen, alkali metal, alkaline earth metal, iron, nickel, and silicon.

Hydrogen contained in an oxide semiconductor reacts with oxygen, which reacts with metal atoms, to generate oxygen vacancies (also referred to as Vo) in the oxide semiconductor in some cases. Defects which are formed by the bonding of oxygen vacancies and hydrogen (hereinafter referred to as VoH in some cases) serve as donors and generate electrons serving as carriers in some cases. In other cases, some hydrogen is bonded to oxygen, which reacts with metal atoms, to generate electrons serving as carriers. Thus, a transistor including an oxide semiconductor that contains much hydrogen tends to have normally-on characteristics. Moreover, hydrogen in an oxide semiconductor easily moves by stress such as heat and electric field; thus, the reliability of a transistor may be low when an oxide semiconductor contains a plenty of hydrogen.

VoH can serve as donors of an oxide semiconductor. However, it is difficult to evaluate the VoH quantitatively. In some cases, a carrier density is selected for evaluation of an oxide semiconductor instead of a donor density; accordingly, a carrier density is used for a parameter of an oxide semiconductor when an electric field is not applied, instead of a donor density. Hence, "carrier density" in this specification can be replaced with "donor density" in some cases.

Therefore, when an oxide semiconductor is used for the oxide 230, the VoH in the oxide 230 is reduced as long as possible to make the oxide semiconductor highly purified or substantially highly purified, which is preferable. It is effective to remove impurities such as water and hydrogen in an oxide semiconductor (sometimes described as dehydration or dehydrogenation treatment) and to compensate for oxygen vacancies by supplying oxygen to the oxide semiconductor (sometimes described as oxygen supplying treatment) to obtain an oxide semiconductor whose VoH is reduced enough. When an oxide semiconductor with an impurity such as VoH sufficiently reduced is used for a channel formation region of a transistor, the transistor can have stable electrical characteristics.

When an oxide semiconductor is used for the oxide 230, the carrier density of the oxide semiconductor at a channel formation region is preferably lower than or equal to $1 \times 10^{18}$ $cm^{-3}$, further preferably lower than $1 \times 10^{17}$ $cm^{-3}$, further preferably lower than $1 \times 10^{16}$ $cm^{-3}$, further preferably lower than $1 \times 10^{13}$ $cm^{-3}$, further preferably lower than $1 \times 10^{12}$ $cm^{-3}$. The minimum carrier density of an oxide semiconductor at a channel formation region is not limited and can be $1 \times 10^{-9}$ $cm^{-3}$, for example.

Interlayer insulating films, such as the insulators 216, 274, and 280, and gate insulating films such as the insulators 224 and 250, may be deposited by a gas with no or less hydrogen atoms to reduce hydrogen concentration in these insulating films, whereby the amount of hydrogen entering a channel formation region of an oxide semiconductor can be reduced.

A gas including molecules having silicon atoms is mainly used for depositing the insulating films described above. The gas including molecules having silicon atoms preferably includes a small amount of hydrogen, and further preferably includes no hydrogen to deposit the insulating films with reduced hydrogen. A deposition gas other than that including molecules having silicon atoms preferably includes less hydrogen atoms, further preferably includes no hydrogen atoms.

At least one of an isocyanate group (—N=C=O), a cyanate group (—O—C≡O), a cyano group (—O≡O), a diazo group (=N$_2$), an azido group (—N$_3$), a nitroso group (—NO), and a nitro group (—NO$_2$) can be used as a functional group R when the molecule having a silicon atom is represented by Si$_x$—R$_y$. For example, $1 \leq x \leq 3$ and $1 \leq y \leq 8$ may be employed. For example, tetraisocyanatesilane, tetracyanatesilane, tetracyanosilane, hexaisocyanatesilane, or octaisocyanatesilane can be used as the molecule having a silicon atom. The molecules with the same kind of functional group bonded are shown above, but this embodiment may include more kinds of examples other than the above examples. Different kinds of functional groups may be bonded to a silicon molecule.

A halogen (Cl, Br, I, or F) can be used for the functional group R, for example. For example, $1 \leq x \leq 2$, and $1 \leq y \leq 6$ are employed. Examples of such a molecule containing a silicon atom are tetrachlorosilane (SiCl$_4$), hexachlorodisilane (Si$_2$Cl$_6$), and the like. Although an example of using chlorine as the functional group is described here, halogens other than chlorine, such as bromine, iodine, or fluorine, can alternatively be used. Different kinds of halogens can be bonded to silicon atoms.

The insulators 216, 274, 280, 224, and 250 are deposited by a chemical vapor deposition (CVD) method using the gas, as described above, containing molecules having silicon atoms. A CVD method is preferable for depositing the insulators 280, 274, and 216, which are thick films, because a CVD method deposits films relatively fast.

For a CVD method, a plasma enhanced CVD (PECVD) method, which uses plasma, or a thermal CVD (TCVD), which uses heat, is preferable. For a TCVD method, an atmospheric pressure CVD (APCVD) method, which deposits a film in an atmospheric pressure, or a low pressure CVD (LPCVD) method, which deposits a film in a pressure lower than an atmospheric pressure, can be employed.

To deposit the insulators 216, 274, 280, 224, and 250 by a CVD method, an oxidizer is preferably used. For an oxidizer, a gas with no hydrogen atoms, such as $O_2$, $O_3$, NO, $NO_2$, $N_2O$, $N_2O_3$, $N_2O_4$, $N_2O_5$, CO, and $CO_2$, is preferably used.

An atomic layer deposition (ALD) method may be used for depositing the insulators 216, 274, 280, 224, and 250. For an ALD method, a first source gas (hereinafter referred to as a precursor or a metal precursor) and a second source gas (hereinafter referred to as a reactant or a nonmetal precursor) for reaction are alternately introduced into a chamber to deposit films.

An ALD method deposits a film by a single layer of atoms when deposition is performed by alternate introduction of source gases, using self-regulating characteristics of the atom. Hence, an ALD method has various advantages such as deposition of an extremely thin film, deposition on a component with a large aspect ratio, deposition of a film with a small number of detects such as pinholes, and deposition with excellent coverage. Thus, the insulators 250 and 224 are preferably formed by an ALD method.

For an ALD method, either a thermal ALD method, in which a precursor reacts with a reactant only by thermal energy, or a plasma enhanced ALD (PEALD) method, which uses a reactant excited by plasma, can be employed.

For an ALD method, an example of a precursor includes the gas containing molecules having silicon atoms mentioned above and an example of a reactant includes the oxidizer mentioned above. This yields a drastic reduction of hydrogen absorbed into the insulators 216, 274, 280, 224, and 250.

An example of molecules having silicon atoms without hydrogen atoms is shown above; however, this embodiment can include other examples. For the molecules having silicon atoms, some functional groups can be replaced with hydrogen atoms. The number of hydrogen atoms included in the above molecules having silicon atoms is less than that of silane ($SiH_4$). Accordingly, it is preferable that the molecules having silicon atoms include three or less hydrogen atoms on a silicon atom. It is also preferable that the gas containing molecules having silicon atoms include three or less hydrogen atoms on a silicon atom.

Depositing at least one of the insulators 216, 274, 280, 224, and 250 with the deposition methods described above, which uses a gas with less or no hydrogen atoms, can reduce the amount of hydrogen contained in these insulators 216, 274, 280, 224, and 250.

The transistor 200 shown in FIGS. 1B to 1D has a structure in which the insulators 282 and 250 are directly in contact with each other. The structure inhibits absorption of oxygen contained in the insulator 280 into the conductor 260. The insulator 280 can effectively provide oxygen to the oxides 230a and 230b via the oxide 230c, which reduce oxygen vacancies in the oxides 230a and 230b to improve the electric characteristics and the reliability of the transistor 200. The structure can also inhibit entry of impurities such as hydrogen in the insulator 280 into the insulator 250, which can further reduce the hydrogen concentration of the insulator 250 and the oxide 230. Thus, adverse effects on the electric characteristics and the reliability of the transistor 200 can be suppressed. For the insulator 282, silicon nitride, silicon nitride oxide, aluminum oxide, or hafnium oxide can be used.

[Capacitor 100]

As illustrated in FIG. 1B, the capacitor 100 includes the insulator 216 over the insulator 214, a conductor 204 (a conductor 204a and a conductor 204b) which is embedded in the insulator 216, the insulator 222 over the insulator 216 and the conductor 205, and the conductor 242a over the insulator 222.

For the capacitor 100, the conductor 204 functions as one electrode of the capacitor 100 and the conductor 242a functions as the other electrode of the capacitor 100. The insulator 222 functions as a dielectric of the capacitor 100. The conductor 204 is formed using the same material as the conductor 205.

The conductor 204 is formed in the same layer as the conductor 205 included in the transistor 200. The conductor 242a also functions as the source or the drain electrode of the transistor 200. The insulator 222 also functions as a gate insulator of the transistor 200. As described above, the transistor and the capacitor can share some components to shorten the process of fabricating a semiconductor device including the transistor 200 and the capacitor 100, whereby the cost is decreased and the yield is improved; this is a favorable result.

Consequently, a semiconductor device that has stable electrical characteristics with small variation and has high reliability can be provided. A semiconductor device with normally-off electrical characteristics can be provided. A semiconductor device including a transistor with a high on-state current can be provided. A semiconductor device including a transistor with high frequency characteristics can be provided. A semiconductor device including a transistor with a low off-state current can be provided.

The following describes a detailed structure of a semiconductor device including the transistor 200 and the capacitor 100 of one embodiment of the present invention.

The conductor 205 is overlapped by the oxide 230 and the conductor 260. The conductor 205 is preferably embedded in the insulator 216.

The conductor 260 functions as a first gate (also referred to as a top gate) of the transistor 200 in some cases. The conductor 205 functions as a second gate (also referred to as a bottom gate) of the transistor 200 in some cases. The conductor 205 with a potential independent of the potential of the conductor 260 can control the $V_{th}$ of the transistor 200. In particular, when a negative potential is applied to the conductor 205, the $V_{th}$ of the transistor 200 becomes higher than 0 V to reduce the off-state current of the transistor. This means that the conductor 205 with a negative potential can reduce drain current when 0 V is applied to the conductor 260, compared to the conductor 205 without a negative potential.

It is preferable that the conductor 205 have a larger size than the region of the oxide 230 which is not overlapped by the conductors 242a and 242b as shown in FIG. 1A. It is particularly preferable that the conductor 205 extend beyond the end portions in the channel width direction of the oxides 230a and 230b, as illustrated in FIG. 1C. That is, the conductor 205 and the conductor 260 preferably overlap with each other with the insulator positioned therebetween in a region beyond the side surfaces of the oxides 230a and 230b in the channel width direction. A large conductor 205 can sometimes reduce local charging, which is called "charge up", at a treatment using plasma after forming the conductor 205. However, one embodiment of the present invention is not limited thereto. The conductor 205 is at least overlapped by the oxide 230 positioned between the conductors 242a and 242b.

As illustrated in FIGS. 1A and 1B, the conductor 204 is preferably overlapped by a region of the conductor 242a where the conductor 242a does not overlap the oxides 230a and 230b.

As shown in FIG. 1C, in a region where the conductor 260 and the oxides 230a and 230b do not overlap, it is preferable that the bottom surface of the conductor 260 is lower than the bottom surface of the oxide 230b in a condition where the bottom surface of the insulator 224 is the bottom. The difference of the height between the bottom surfaces of the conductor 260 and the oxide 230b in the region is greater than or equal to 0 nm and less than or equal to 100 nm, preferably greater than or equal to 3 nm and less than or equal to 50 nm, and further preferably greater than or equal to 5 nm and less than or equal to 20 nm.

As described above, the conductor 260, which functions as the gate, covers the side surfaces and the top surface of the oxide 230b, which functions as the channel formation region, with the oxide 230c and the insulator 250 therebetween; this enables the electrical field of the conductor 260 to exert an effect over the oxide 230b. Hence, the transistor 200 can have a higher on-state current and higher frequency characteristics. In this specification, such a transistor structure in which the channel formation region is electrically surrounded by the electric fields of the first gate electrode and the second gate electrode is referred to as a surrounded channel (S-channel) structure.

The conductor 205a preferably suppresses transmission of impurities such as water or hydrogen. For example, titanium, titanium nitride, tantalum, or tantalum nitride can be used for the conductor 205a. A conductive material containing tungsten, copper, or aluminum as its main component is preferably used for the conductor 205b. Although the conductor 205 is illustrated as a two layers, the conductor 205 can have a multilayer structure including three or more layers.

It is preferable that an oxide semiconductor, an insulator or a conductor under the oxide semiconductor, and an insulator or a conductor over the oxide semiconductor are deposited successively with different kinds of materials without being exposed to the air, whereby a substantially highly purified intrinsic oxide semiconductor film whose impurity (hydrogen and water, in particular) concentration is reduced can be formed.

At least one of the insulators 214, 222, 272, 273, 282, 283, and 284 preferably functions as a barrier insulating film that inhibits entry of impurities such as water or hydrogen into the transistor 200 from the substrate side or the upper side. Thus, at least one of the insulators 214, 222, 272, 273, 282, 283, and 284 is preferably formed using an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms, that is, an insulating material through which the impurities are less likely to pass. Alternatively, at least one of the insulators 214, 222, 272, 273, 282, 283, and 284 is preferably formed using an insulating material having a function of inhibiting diffusion of oxygen (e.g., at least one of oxygen atoms and oxygen molecules), that is, an insulating material through which oxygen is less likely to pass.

For example, the insulators 283 and 284 are preferably formed using silicon nitride or silicon nitride oxide, and the insulators 214, 222, 272, 273, and 282 are preferably formed using aluminum oxide or hafnium oxide. Accordingly, it is possible to inhibit diffusion of impurities such as water or hydrogen into the transistor 200 from the substrate side through the insulator 214. Additionally, it is possible to inhibit diffusion of oxygen contained in the insulator 224 and the like to the substrate side through the insulator 214. In addition, it is possible to inhibit diffusion of impurities such as water or hydrogen into the transistor 200 from the insulators 280, 274, and the like, which are provided over the insulators 272, 273, 282, and 283.

It is sometimes preferable to reduce the resistivity of the insulator 284; for example, when the resistivity of the insulator 284 is approximately $1\times10^{13}$ Ωcm, the insulator 284 can relieve charge up of the conductor 204, 205, 242, 260, or 246 in some cases at a treatment using plasma after forming the insulator 284 in the process of fabricating a semiconductor device. The resistivity of the insulator 284 is preferably higher than or equal to $1\times10^{10}$ Ωcm and lower than or equal to $1\times10^{15}$ Ωcm.

The dielectric constants of the insulators 216, 280, and 274 are preferably lower than that of the insulator 214. The use of a material having a low dielectric constant for the interlayer film can reduce the parasitic capacitance between wirings. For example, for the insulators 216, 280, and 274, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulators 222 and 224 have a function as a gate insulator.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like may be used for the insulator 224 appropriately. When such an insulator containing oxygen is provided in contact with the oxide 230, oxygen vacancies in the oxide 230 can be reduced, leading to an improvement in reliability of the transistor 200.

Specifically, an oxide material that releases some oxygen by heating is preferably used for the insulator 224. An oxide that releases oxygen by heating is an oxide film in which the amount of released oxygen molecule is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

The insulator 222 preferably functions as a barrier insulating film that inhibits entry of impurities such as water or hydrogen into the transistor 200 from the substrate side. For example, it is preferable that the insulator 222 less transmit hydrogen than the insulator 224. Surrounding the insulator 224, the oxide 230, and the like with the insulators 222 and 283 can inhibit entry of impurities such as water or hydrogen into the transistor 200 from outside.

Furthermore, the insulator 222 preferably has a function of inhibiting oxygen (e.g., at least one of oxygen atoms and oxygen molecules) diffusion; that is, it is preferable that oxygen is less likely to pass through the insulator 222. For example, it is preferable that the insulator 222 less transmit oxygen than the insulator 224. The insulator 222 preferably has a function of inhibiting diffusion of oxygen and impurities, so that oxygen contained in the oxide 230 less reach the region under the insulator 222. The insulator 222 can also inhibit oxidization of the conductor 205 with oxygen contained in the insulator 224 and the oxide 230.

As the insulator 222, an insulator containing an oxide of aluminum and/or an oxide of hafnium, which are insulating materials, is preferably used. For the insulator containing an oxide of aluminum and/or an oxide of hafnium, aluminum oxide, hafnium oxide, an oxide containing aluminum and hafnium (hafnium aluminate), or the like is preferably used. The insulator 222 with such a material can function as a layer inhibiting oxygen diffusion from the oxide 230 and entry of impurities such as hydrogen into the oxide 230 from the periphery of the transistor 200.

Aluminum oxide, bismuth oxide, germanium oxide, niobium oxide, silicon oxide, titanium oxide, tungsten oxide, yttrium oxide, or zirconium oxide may be added to the insulators, for example. Alternatively, the insulators may be subjected to nitriding treatment. Silicon oxide, silicon oxynitride, or silicon nitride may be stacked over the insulator.

The insulator 222 may have a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST). For a stacked-layer structure of the insulator 222, a three-layer structure with zirconium oxide, aluminum oxide, and zirconium oxide in this order, or a four-layer structure with zirconium oxide, aluminum oxide, zirconium oxide, and aluminum oxide in this order can be employed, for example. For the insulator 222, a compound containing hafnium and zirconium may be employed. When the semiconductor is minimized and highly integrated, a dielectric used for a gate insulator and a capacitor become thin, which causes a problem of leak current from a transistor and a capacitor. When a high-k material is used for an insulator functioning as a gate insulator and a dielectric used for a capacitor, a gate potential at the time when the transistor operates can be reduced while the physical thickness of a gate insulator and a capacitor is maintained.

Note that the insulators 222 and 224 may each have a stacked-layer structure of two or more layers. In that case, the stacked layers are not necessarily formed of the same material and may be formed of different materials.

The oxide 243 (the oxides 243a and 243b) may be provided between the oxide 230b and the conductor 242 (the conductors 242a and 242b), which functions as the source electrode or the drain electrode. This structure eliminates the contact of the conductor 242 and the oxide 230, so that oxygen in the oxide 230 is less absorbed into the conductor 242. That is, inhibiting oxidization of the conductor 242 can inhibit the decrease in conductivity of the conductor 242. Accordingly, the oxide 243 preferably has a function of inhibiting oxidization of the conductor 242.

Accordingly, the oxide 243 preferably has a function of inhibiting oxygen transmission. When the oxide 243, which has a function of inhibiting oxygen transmission, is provided between the conductor 242, functioning as the source electrode or the drain electrode, and the oxide 230b, the electrical resistance between the conductor 242 and the oxide 230b can be reduced, which is preferable. Such a structure improves the electrical characteristics and reliability of the transistor 200.

A metal oxide including an element M may be used for the oxide 243. In particular, aluminum, gallium, yttrium, or tin is preferably used for the element M. The concentration of the element M in the oxide 243 is preferably higher than that in the oxide 230b. Alternatively, gallium oxide may be used for the oxide 243. A metal oxide such as In-M-Zn oxide may be used for the oxide 243. Specifically, the atomic ratio of the element M to In in the metal oxide used for the oxide 243 is preferably higher than that in the metal oxide used for the oxide 230b. The thickness of the oxide 243 ranges preferably from 0.5 nm to 5 nm, further preferably from 1 nm to 3 nm. The oxide 243 preferably has crystallinity. The oxide 243 with crystallinity efficiently inhibits release of oxygen from the oxide 230. When the oxide 243 has a hexagonal crystal structure, for example, release of oxygen from the oxide 230 can sometimes be inhibited.

Note that the oxide 243 is not necessarily provided. Without the oxide 243, the conductor 242 is sometimes oxidized by oxygen diffused from the oxide 230, when the conductor 242 (the conductors 242a and 242b) and the oxide 230 are in contact with the oxide 230. It is highly possible that oxidation of the conductor 242 lowers the conductivity of the conductor 242. Note that diffusion of oxygen from the oxide 230 into the conductor 242 can be interpreted as absorption of oxygen in the oxide 230 by the conductor 242.

When oxygen in the oxide 230 is diffused into the conductor 242 (the conductors 242a and 242b), other layers are sometimes formed between the conductor 242a and the oxide 230b, and between the conductor 242b and the oxide 230b. The layers contain more oxygen than the conductor 242, so that the layers presumably have an insulating property. The three-layer structure of the conductor 242, the layer, and the oxide 230b can be the structure with a metal, an insulator, and a semiconductor, which is sometimes called a metal-insulator-semiconductor (MIS) structure or a diode junction structure having an MIS structure as its main part.

The above another layer is not necessarily formed between the conductor 242 and the oxide 230b, but the another layer may be formed between the conductor 242 and the oxide 230c, or other layers are formed both between the conductor 242 and the conductor 230b, and the conductor 242 and the conductor 230c.

The conductor 242 (the conductors 242a and 242b) functioning as a source electrode and a drain electrode is provided over the oxide 243. The thickness of the conductor 242 is, for example, greater than or equal to 1 nm to less than or equal to 50 nm, preferably greater than or equal to 2 nm to less than or equal to 25 nm.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 272 is provided in contact with the top surface of the conductor 242 and preferably functions as a barrier layer. The structure enables less absorption of excess oxygen in the insulator 280 into the conductor 242. Furthermore, by suppressing oxidation of the conductor 242, an increase in the contact resistance between the transistor 200 and a wiring can be suppressed. Consequently, the transistor 200 can have favorable electrical characteristics and reliability.

Thus, the insulator 272 preferably has a function of inhibiting oxygen diffusion. For example, the insulator 272 preferably has a function of inhibiting oxygen diffusion more than the insulator 280. The insulator 272 can be formed of an insulator containing an oxide of one or both of aluminum and hafnium, for example. An insulator containing aluminum nitride can also be used for the insulator 272, for example.

As illustrated in FIG. 1D, the insulator 272 is in contact with the top surface and the side surfaces of the conductor 242a. Although not illustrated, the insulator 272 is in contact with the top surface and the side surfaces of the conductor 242b. The insulator 273 is provided over the insulator 272. This structure can prevent oxygen, which is added to the insulator 280, from being absorbed into the conductor 242.

The insulator 250 functions as a gate insulator. The insulator 250 is preferably positioned in contact with the top surface of the oxide 230c. For the insulator 250, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide can be used. Silicon oxide and silicon oxynitride, which have thermal stability, are particularly preferable.

The insulator 250 is preferably formed using an insulator from which oxygen is released by heating as in the insulator 224. When an insulator from which oxygen is released by heating is provided as the insulator 250 in contact with the top surface of the oxide 230c, oxygen can be efficiently supplied to the channel formation region of the oxide 230b. As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably prevents oxygen diffusion from the insulator 250 into the conductor 260. Providing the metal oxide that inhibits oxygen diffusion inhibits diffusion of oxygen from the insulator 250 to the conductor 260. That is, the reduction in the amount of oxygen supplied to the oxide 230 can be inhibited. Moreover, oxidation of the conductor 260 due to oxygen in the insulator 250 can be inhibited.

Note that the metal oxide has a function as the part of the gate insulator in some cases. Therefore, when silicon oxide, silicon oxynitride, or the like is used for the insulator 250, a metal oxide that is a high-k material with a high dielectric constant is preferably used as the metal oxide. The gate insulator having a stacked-layer structure of the insulator 250 and the metal oxide can be thermally stable and have a high dielectric constant. Accordingly, a gate potential applied during operation of the transistor can be reduced while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, for example, aluminum oxide, hafnium oxide, or an oxide containing aluminum and hafnium (hafnium aluminate).

The metal oxide has a function as part of the gate in some cases. In this case, a conductive material containing oxygen is preferably provided on the channel formation region side, in which case oxygen released from the conductive material is easily supplied to the channel formation region.

It is particularly preferable to use, for the conductor functioning as the gate electrode, a conductive material containing oxygen and a metal element contained in a metal oxide in which the channel is formed. A conductive material containing any of the above metal elements and nitrogen may also be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With use of such a material, hydrogen contained in the metal oxide in which the channel is formed can be captured in some cases. Hydrogen entering from a surrounding insulator or the like can also be captured in some cases.

Although the conductor 260 has a two-layer structure in FIGS. 1A to 1C, the conductor 260 may have a single-layer structure or a stacked-layer structure of three or more layers.

The conductor 260a is preferably formed using a conductive material which has a function of inhibiting diffusion of impurities such as hydrogen atoms, hydrogen molecules, water molecules, nitrogen atoms, nitrogen molecules, nitrogen oxide molecules (e.g., $N_2O$, $NO$, and $NO_2$), and copper atoms. Alternatively, the oxide 260a is preferably formed using a conductive material which has a function of inhibiting diffusion of oxygen (e.g., at least one of oxygen atoms, oxygen molecules, and the like).

When the conductor 260a has a function of inhibiting diffusion of oxygen, the conductivity of the conductor 260b can be prevented from being lowered because of oxidization of the conductor 260b due to oxygen in the insulator 250. As a conductive material which has a function of inhibiting diffusion of oxygen, for example, tantalum, tantalum nitride, ruthenium, ruthenium oxide, or the like is preferably used.

Furthermore, the conductor 260b is preferably formed using a conductive material including tungsten, copper, or aluminum as its main component. The conductor 260 also functions as a wiring and thus is preferably a conductor having high conductivity. For example, a conductive material containing tungsten, copper, or aluminum as its main component can be used. The conductor 260b may have a stacked-layer structure, for example, a stacked-layer structure of the above conductive material and titanium or titanium nitride.

The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. Silicon oxide and silicon oxynitride are particularly preferable because of their thermal stability. Silicon oxide, silicon oxynitride, and porous silicon oxide are particularly preferable because a region whose oxygen is released by heating can be easily formed in these materials. The insulator 280 may have a stacked-layer structure of the above materials; silicon oxide formed by a sputtering method and silicon oxynitride formed by a CVD method thereover, for example. Silicon nitride can be stacked over the above stacked structure.

The insulator 280 preferably contains a reduced concentration of impurities such as water or hydrogen. The top surface of the insulator 280 may be planarized.

The insulators 282 and 283 preferably function as barrier insulating films for inhibiting entry of impurities such as water or hydrogen into the insulator 280 from the upper side. The insulators 282 and 283 preferably function as barrier insulating films for inhibiting transmission of oxygen. The insulators 282 and 283 may be formed using an insulator such as aluminum oxide, silicon nitride, or silicon nitride oxide. The insulator 282 may be formed using aluminum oxide, which has high barrier property against oxygen and the insulator 283 may be formed from silicon nitride, which has high barrier property against hydrogen, for example.

The insulator 274 as an interlayer film is preferably provided over the insulator 283. As in the insulator 224 or the like, the concentration of impurities such as water or hydrogen in the insulator 274 is preferably lowered.

The conductor 240 is preferably formed using a conductive material containing tungsten, copper, or aluminum as its main component. The conductor 240 may have a stacked-layer structure. Although the conductor 240 has a circular shape in the top view of FIG. 1A, the shape is not limited thereto. For example, the conductor 240 may have an almost circular shape such as an ellipse, a polygonal shape such as a square, or a polygonal shape such as a square with rounded corners.

Moreover, the insulator 240 is preferably formed using a conductive material which has a function of inhibiting the transmission of oxygen and impurities such as water and hydrogen when the insulator 240 has a stacked-layer structure. For example, tantalum, tantalum nitride, titanium, titanium nitride, ruthenium, ruthenium oxide, or the like is preferably used. The conductive material having a function of inhibiting the transmission of oxygen and impurities such as water and hydrogen may have a single-layer structure or a stacked-layer structure. When the conductive material is used, the amount of impurities such as hydrogen and water that enter the oxide 230 from the insulator 280 through the conductor 240 can be further reduced. Moreover, oxygen added to the insulator 280 can be prevented from being absorbed by the conductor 240.

For the insulator 241, for example, an insulator such as silicon nitride, aluminum oxide, or silicon nitride oxide can be used. The insulator 241 is provided in contact with the insulators 283, 282, 280, 273, and 272, which inhibits entry of impurities such as water or hydrogen into the oxide 230 through the conductor 240. Silicon nitride is particularly preferable for the insulator 241 because of its high blocking property against hydrogen. Moreover, oxygen contained in the insulator 280 can be inhibited from being absorbed into the conductor 240.

The conductor 246 functioning as a wiring can be provided in contact with the top surface of the conductor 240. The conductor 246 is preferably formed using a conductive material containing tungsten, copper, or aluminum as its main component. The conductor may have a stacked-layer structure, for example, a stack of titanium or titanium nitride and the above conductive material. Note that the conductor may be formed to be embedded in an opening provided in an insulator.

The insulator 284 can be formed over the conductor 246 and the insulator 283. In such a structure, the conductor 246 can be surrounded by the insulators 283 and 284. This inhibits oxidization of the conductor 246 and entry of impurities such as hydrogen into the transistor 200 through the conductor 246. For the insulator 284, for example, an insulator such as silicon nitride, aluminum oxide, or silicon nitride oxide can be used. The insulator 274 may be formed over the insulator 284. The insulator 274 can be formed using the same material as that used for the insulator 280.

<Materials Constituting Semiconductor Device>

Materials that can be used for the semiconductor device are described below.

<Substrate>

As a substrate where the transistor 200 is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Other examples include a semiconductor substrate in which an insulator region is provided in the above semiconductor substrate such as a silicon on insulator (SOI) substrate. Examples of the conductor substrate include a graphite substrate, a metal substrate, an alloy substrate, and a conductive resin substrate. A substrate containing a nitride of a metal, a substrate including an oxide of a metal, or the like can also be used. Moreover, an insulator substrate provided with a conductor or a semiconductor, a semiconductor substrate provided with a conductor or an insulator, a conductor substrate provided with a semiconductor or an insulator, or the like may be used. Alternatively, any of these substrates provided with an element may be used. Examples of the element provided over the substrate include a capacitor, a resistor, a switching element, a light-emitting element, and a memory element.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current may arise because of a thin gate insulator. When a high-k material is used for an insulator functioning as a gate insulator, the driving voltage of the transistor can be reduced while the physical thickness of the gate insulator is kept. When a material having a low dielectric constant is used for an insulator functioning as an interlayer film, the parasitic capacitance between wirings can be reduced. A material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon oxide to which fluorine is added, silicon oxide to which carbon is added, silicon oxide to which carbon and nitrogen are added, porous silicon oxide, and a resin.

A transistor using an oxide semiconductor can have stable electrical characteristics when surrounded by an insulator having a function of inhibiting transmission of oxygen and impurities such as hydrogen. The insulator having a function of inhibiting transmission of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator preferably includes a region containing oxygen that is released by heating. For example, silicon oxide or silicon oxynitride that includes a region containing oxygen released by heating is provided in contact with the oxide 230 to compensate for the oxygen vacancies in the oxide 230.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electric conductivity, typified by polycrystalline silicon containing an impurity element such as phosphorus, or silicide such as nickel silicide may be used.

Conductive layers formed using any of the above materials may be stacked. For example, a stacked-layer structure combining a material containing any of the above metal elements and a conductive material containing oxygen may be used. Alternatively, a stacked-layer structure combining a material containing any of the above metal elements and a conductive material containing nitrogen may be used. Alternatively, a stacked-layer structure combining a material containing any of the above metal elements, a conductive material containing oxygen, and a conductive material containing nitrogen may be used.

When an oxide is used for the channel formation region of the transistor, a conductor functioning as the gate electrode preferably employs a stacked-layer structure using a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which the channel is formed. A conductive material containing any of the above metal elements and nitrogen can also be used. For example, a conductive material containing nitrogen, such as titanium nitride or tantalum nitride, can be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added can be used. Indium gallium zinc oxide containing nitrogen can be used. With the use of such a material, hydrogen contained in the metal oxide in which the channel is formed can be captured in some cases. Furthermore, hydrogen entering from a surrounding insulator or the like can be captured in some cases.

<Metal Oxide>

For the oxide 230, a metal oxide functioning as an oxide semiconductor is preferably used. A metal oxide that can be used for the oxide 230 according to the present invention is described below.

The metal oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is In-M-Zn oxide, which contains indium, an element M, and zinc is considered. The element M may be aluminum, gallium, yttrium, or tin. Other examples that can be used as the element M include boron, titanium, iron, nickel, germanium, zirconium, molybdenum, lanthanum, cerium, neodymium, hafnium, tantalum, tungsten, and magnesium. Note that two or more of the above elements can be used in combination as the element M in some cases.

Note that in this specification and the like, a metal oxide containing nitrogen is also referred to as a metal oxide in some cases. A metal oxide containing nitrogen may also be referred to as a metal oxynitride.

<Composition of Metal Oxide>

The compositions of a cloud-aligned composite oxide semiconductor (CAC-OS) and a c-axis-aligned crystalline oxide semiconductor (CAAC-OS), which are metal oxides that can be used in the OS transistor, will be described.

A CAC-OS or a CAC-metal oxide has a conducting function in part of the material and has an insulating function in other part of the material, and has a semiconductor function as a whole material. In the case where the CAC-OS or the CAC-metal oxide is used in an active layer of a transistor, the conducting function is to allow electrons (or holes) serving as carriers to flow, and the insulating function is to not allow electrons serving as carriers to flow. By the complementary function of the conducting function and the insulating function, the CAC-OS or the CAC-metal oxide can have a switching function (on/off function). In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

In the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In this case, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can have high current drive capability, that is, a high on-state current and high field-effect mobility.

In other words, the CAC-OS or the CAC-metal oxide can also be called a matrix composite or a metal matrix composite.

[Structure of Metal Oxide]

An oxide semiconductor (metal oxide) is classified into a single crystal oxide semiconductor and a non-single-crystal oxide semiconductor. Examples of a non-single-crystal oxide semiconductor include a CAAC-OS, a polycrystalline oxide semiconductor, an nc-OS, an amorphous-like oxide semiconductor (a-like OS), and an amorphous oxide semiconductor.

Oxide semiconductors might be classified in a manner different from the above-described one when classified in terms of the crystal structure. The classification of the crystal structures of oxide semiconductor will be explained with FIG. 15A. FIG. 15A is a diagram showing a classification of a crystal structures of an oxide semiconductor, typically IGZO (a metal oxide containing In, Ga, and Zn).

IGZO is classified into "amorphous", "crystalline", and "crystal", as shown in FIG. 15A. "Amorphous" includes completely amorphous structure. "Crystalline" includes c-axi-aligned crystalline (CAAC), nanocrystalline (nc), and cloud-aligned composite (CAC) structures. "Crystal" includes single crystal and poly crystal structures.

The structure shown in the thick frame in FIG. 15A is a new crystalline phase. This structure is positioned in a boundary region between "amorphous" and "crystal". "Amorphous", which is energetically unstable, and "crystalline" are completely different structures.

A crystal structure of a film or a substrate can be analyzed with X-ray diffraction (XRD) images. XRD spectra of quartz glass and IGZO, which has a crystal structure classified into crystalline, are shown in FIGS. 15B and 15C. FIG. 15B shows an XRD spectrum of quartz glass and FIG. 15C shows an XRD spectrum of crystalline IGZO. The crystalline IGZO whose spectrum is shown in FIG. 15C contains In:Ga:Zn=4:2:3 (atomic ratio) and has a thickness of 500 nm.

The peak of the XRD spectrum of quartz glass has a symmetrical shape, as shown by the arrows in FIG. 15B. On the other hand, the peak of the XRD spectrum of crystalline IGZO has an asymmetrical shape, as shown by arrows in FIG. 15C. The asymmetrical curve shows the existence of crystal. In other words, the structure cannot be regarded as "amorphous" unless it has a bilaterally symmetrical peak in the XRD spectrum.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is a metal oxide with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of a metal oxide. This means that the CAAC-OS has small amounts of impurities and defects such as oxygen vacancies ($V_O$). Thus, a metal oxide including the CAAC-OS is physically stable. Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. A regularity of crystal orientation of nanocrystals of the nc-OS is not observed. Thus, the orientation in a whole film is not observed. Accordingly, in some cases, the nc-OS cannot be distinguished from an a-like OS or an amorphous oxide semiconductor depending on the analysis method.

Indium-gallium-zinc oxide (hereinafter referred to as IGZO) that is a kind of metal oxide containing indium, gallium, and zinc has a stable structure in some cases when formed of the above-described nanocrystals. In particular, IGZO crystals tend not to grow in the air. Thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between that of the nc-OS and that of the amorphous oxide semiconductor. The a-like OS has a void or a low-density region. That is, the a-like OS has low crystallinity as compared with the nc-OS and the CAAC-OS.

An oxide semiconductor (metal oxide) can have various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

Note that a structure of an oxide semiconductor (metal oxide) in the semiconductor device of one embodiment of the present invention is not particularly limited; however, the oxide semiconductor (metal oxide) preferably has crystallinity. For example, the oxide 230 can have a CAAC-OS structure and the oxide 243 can have a hexagonal crystal structure. The semiconductor device can have high reliability when the oxides 230 and 243 have the above crystal structures. The oxide 230a, the oxide 230c, and the oxide 243 can have substantially the same composition.

<Transistor Including Oxide Semiconductor>

Next, a transistor using the above oxide semiconductor is described.

The transistor using the above oxide semiconductor can have high field-effect mobility and high reliability.

The transistor preferably has an oxide semiconductor with a low carrier concentration. In order to reduce the carrier density of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor film has a low density of defect states and accordingly has low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce impurity concentrations in the oxide semiconductor. In order to reduce the concentration of impurities in the oxide semiconductor, impurity concentrations in a film that is adjacent to the oxide semiconductor is preferably reduced. Examples of impurities include hydrogen, nitrogen, alkali metal, alkaline earth metal, iron, nickel, and silicon.

<Impurities>

The influence of impurities in the oxide semiconductor is described.

When silicon or carbon, which is a Group 14 element, is contained in an oxide semiconductor, defect states are formed in the oxide semiconductor. The concentration of silicon or carbon in the oxide semiconductor, the concentration thereof at the interface and in the vicinity of the interface between the oxide semiconductor and, for example, an insulator (measured by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. A transistor using an oxide semiconductor that contains alkali metal or alkaline earth metal tends to have normally-on characteristics. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor using an oxide semiconductor that contains nitrogen as the semiconductor tends to have normally-on characteristics. For this reason, the amount of nitrogen in the oxide semiconductor is preferably reduced as much as possible. The nitrogen concentration of the oxide semiconductor measured by SIMS is, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen, which reacts with metal atoms, to be water, and thus causes an oxygen vacancy in some cases. Entry of hydrogen into the oxygen vacancy generates an electron serving as a carrier in some cases. Furthermore, in some cases, some hydrogen reacts with oxygen, which reacts with metal atoms, to generate an electron serving as a carrier. Thus, a transistor including an oxide semiconductor that contains hydrogen tends to have normally-on characteristics. Accordingly, hydrogen in the oxide semiconductor is preferably reduced as much as possible. Specifically, the hydrogen concentration in the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

An oxide semiconductor with sufficiently reduced impurities is used for a channel formation region of a transistor, so that the transistor can have stable electrical characteristics.

<Other Semiconductor Materials>

Semiconductor materials that can be used for the oxide 230 is not limited to the above metal oxides. A semiconductor material which has a band gap (a semiconductor material that is not a zero-gap semiconductor) can be used. For example, a single element semiconductor such as silicon, a compound semiconductor such as gallium arsenide, and a layered material, which can be called as an atomic layered material or a two-dimensional material, are preferably used as a semiconductor material. A layered material having semiconductor property is preferably used for a semiconductor material.

In this specification and the like, the layered material is a group of materials having a layered crystal structure. In the layered crystal structure, layers formed by covalent bonding or ionic bonding are stacked with a bonding such as the Van der Waals force, which is weaker than covalent bonding or ionic bonding. The layered material has high electrical conductivity in a monolayer, that is, high two-dimensional electrical conductivity. When a material with a high two-dimensional electrical conductivity that functions as a semiconductor is used for a channel formation region, the transistor can have a high on current.

Examples of the layered material include graphene, silicene, and chalcogenide. Chalcogenide is a compound containing chalcogen. Chalcogen is a general term of elements belonging to Group 16, which contains oxygen, sulfur, selenium, tellurium, polonium, and livermorium. Chalcogenide includes transition metal chalcogenide and chalcogenide of Group 13 elements.

The oxide 230 is preferably formed using a transition metal chalcogenide functioning as a semiconductor, for example. Examples of transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), zirconium selenide ($ZrSe_2$).

<Method for Manufacturing Semiconductor Device>

A manufacturing method for a semiconductor device shown in FIGS. 1A to 1D including the transistor 200 and the capacitor 100 of the present invention will be described with reference to FIGS. 4A to 4C to FIGS. 14A to 14D. FIG. 4A, FIG. 5A, FIG. 6A, FIG. 7A, FIG. 8A, FIG. 9A, FIG. 10A, FIG. 11A, FIG. 12A, FIG. 13A, and FIG. 14A are top views. FIG. 4B, FIG. 5B, FIG. 6B, FIG. 7B, FIG. 8B, FIG. 9B, FIG. 10B, FIG. 11B, FIG. 12B, FIG. 13B, and FIG. 14B are cross-sectional views taken along dashed-dotted lines A1-A2 in FIG. 4A, FIG. 5A, FIG. 6A, FIG. 7A, FIG. 8A, FIG. 9A, FIG. 10A, FIG. 11A, FIG. 12A, FIG. 13A, and FIG. 14A which correspond to cross-sectional views in the channel length direction of the transistor 200 and the capacitor 100. FIG. 4C, FIG. 5C, FIG. 6C, FIG. 7C, FIG. 8C, FIG. 9C, FIG. 10C, FIG. 11C, FIG. 12C, FIG. 13C, and FIG. 14C are cross-sectional views taken along dashed-dotted lines A3-A4 in FIG. 4A, FIG. 5A, FIG. 6A, FIG. 7A, FIG. 8A, FIG. 9A, FIG. 10A, FIG. 11A, FIG. 12A, FIG. 13A, and FIG. 14A which correspond to cross-sectional views in the channel width direction of the transistor 200. FIG. 4D, FIG. 5D, FIG. 6D, FIG. 7D, FIG. 8D, FIG. 9D, FIG. 10D, FIG. 11D, FIG. 12D, FIG. 13D, and FIG. 14D are cross-sectional views taken along dashed-dotted lines A5-A6 in FIG. 4A, FIG. 5A, FIG. 6A, FIG. 7A, FIG. 8A, FIG. 9A, FIG. 10A, FIG. 11A, FIG. 12A, FIG. 13A, and FIG. 14A which correspond to cross-sectional views in the channel width direction of the capacitor 100. For simplification, some components are not illustrated in the top view in FIG. 4A, FIG. 5A, FIG. 6A, FIG. 7A, FIG. 8A, FIG. 9A, FIG. 10A, FIG. 11A, FIG. 12A, FIG. 13A, and FIG. 14A.

First, a substrate (not illustrated) is prepared, and the insulator 214 is formed over the substrate. The insulator 214 can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method according to a source gas. In addition, depending on the pressure in a deposition chamber, CVD methods can be classified into an atmospheric pressure CVD (APCVD) method, where deposition is performed under atmospheric pressure, a low pressure CVD (LPCVD) method, where deposition is performed under pressure lower than atmospheric pressure, and the like.

A high-quality film can be obtained at a relatively low temperature through a PECVD method. A thermal CVD method does not use plasma and thus causes less plasma damage to an object. For example, a wiring, an electrode, an element, such as a transistor or a capacitor included in a semiconductor device may be charged up by receiving charge from plasma. In that case, accumulated charge may break the wiring, electrode, element, or the like included in the semiconductor device. A thermal CVD method, which does not using plasma, does not cause such plasma damage, and thus can increase the yield of the semiconductor device. The thermal CVD method yields a film with few defects because of no plasma damage during film formation.

As an ALD method, a thermal ALD method, in which a precursor and a reactant react with each other only by a thermal energy, a plasma-enhanced ALD (PEALD) method, in which a reactant excited by plasma is used, and the like can be used.

In an ALD method, one atomic layer can be deposited at a time using self-regulating characteristics of atoms. Hence, an ALD method has various advantages such as deposition of an extremely thin film, deposition on a component with a large aspect ratio, deposition of a film with a small number of defects such as pinholes, deposition with excellent coverage, and low-temperature deposition. The use of plasma is sometimes preferable because deposition at a lower temperature is possible in a PEALD method. A precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike in the film formation method in which particles ejected from a target or the like are deposited, a film is formed by reaction at a surface of an object in a CVD method and an ALD method. Thus, a CVD method and an ALD method can provide good step coverage, almost regardless of the shape of an object. In particular, an ALD method allows excellent step coverage and excellent thickness uniformity and can be suitably used to cover a surface of an opening portion with a high aspect ratio, for example. Note that an ALD method has a relatively low deposition rate; hence, in some cases, an ALD method is preferably combined with another film formation method with a high deposition rate, such as a CVD method.

When a CVD method or an ALD method is employed, the composition of a film to be formed can be controlled with the flow rate ratio of the source gases. For example, in a CVD method or an ALD method, a film with a certain composition can be formed by adjusting the flow rate ratio of the source gases. Moreover, in a CVD method or an ALD method, by changing the flow rate ratio of the source gases during the film formation, a film whose composition is continuously changed can be formed. In the case where a film is formed while the flow rate ratio of the source gases is changed, as compared to the case where a film is formed using a plurality of deposition chambers, the time taken for the deposition can be shortened because the time taken for transfer and pressure adjustment is omitted. Consequently, semiconductor devices can be manufactured with high productivity in some cases.

In this embodiment, as the insulator 214, silicon nitride is formed by a CVD method. Next, the insulator 216 is formed over the insulator 214. The insulator 216 can be formed by a sputtering method, a CVD method, an MBE method, a PLD method, an ALD method, or the like. In this embodiment, silicon oxide or silicon oxynitride is used for the insulator 216. The insulator 216 is preferably formed by a deposition method using the gas in which the number of hydrogen atoms is reduced or hydrogen atoms are removed. In this case, the hydrogen concentration in the insulator 216 can be reduced.

Then, an opening reaching the insulator 214 is formed in the insulator 216. Examples of the opening include a groove and a slit. A region where an opening is formed may be referred to as an opening portion. The opening may be formed by wet etching; however, dry etching is preferable for microfabrication. The insulator 214 is preferably an insulator that functions as an etching stopper film when a groove is formed by etching of the insulator 216. For example, in the case where a silicon oxide film is used as the insulator 216 in which the groove is to be formed, the insulator 214 is preferably a silicon nitride film, an aluminum oxide film, or a hafnium oxide film.

After formation of the openings, conductive films to be the conductor 204a and the conductor 205a are formed. The conductive film preferably contains a conductor that has a function of inhibiting transmission of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 204a and the conductor 205a can be formed by a sputtering method, a CVD method, an MBE method, a PLD method, an ALD method, or the like.

In this embodiment, the conductive film to be the conductors 204a and 205a has a multi-layer structure. First, tantalum nitride is formed by a sputtering method and titanium nitride is formed over the tantalum nitride. Even when a metal that is easily diffused, such as copper, is used for the conductive film to be the conductors 204b and 205b that are described later, the use of such metal nitride for a lower layer of a conductive film to be conductors 204 and 205 can inhibit diffusion of the metal to the outside through the conductors 204a and 205a.

Next, the conductive film to be the conductors 204b and 205b is formed. This conductive film can be formed by a plating method, a sputtering method, a CVD method, an MBE method, a PLD method, an ALD method, or the like. The conductive film to be the conductors 204b and 205b is formed using a low-resistant conductive material such as copper.

Next, a chemical mechanical polishing (CMP) treatment is performed to remove part of the conductive film to be the conductors 204a and 205a, and the conductive film to be the conductors 204b and 205b, so that the insulator 216 is exposed. As a result, the conductors 204a, 204b, 205a, and 205b remain only in the opening portion. Thus, the conductors 204 and 205 having flat top surfaces can be formed. Note that the CMP treatment may remove part of the insulator 216 (referring to FIGS. 4A to 4D).

Although the conductors 204 and 205 are formed to be embedded in the opening portion of the insulator 216, this embodiment is not limited thereto. For example, the following process may be employed; the conductors 204 and 205 are formed over the insulator 214, the insulator 216 is formed over the conductors 204 and 205, and part of the insulator 216 is removed by a CMP treatment to expose the surfaces of the conductors 204 and 205.

Next, the insulator 222 is formed over the insulator 216, the conductor 204, and the conductor 205. The insulator 222 is preferably formed using an insulator containing an oxide of one or both of aluminum and hafnium. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor 200 into the transistor 200 through the insulator 222 is inhibited, and accordingly oxygen vacancies are less likely to be generated in the oxide 230.

The insulator 222 can be formed by a sputtering method, a CVD method, an MBE method, a PLD method, an ALD method, or the like.

Then, the insulator 224 is formed over the insulator 222. The insulator 224 can be formed by a sputtering method, a CVD method, an MBE method, a PLD method, an ALD method, or the like. In this embodiment, silicon oxide or silicon oxynitride is used for the insulator 224. The insulator 224 is preferably formed by a deposition method using a gas in which the number of hydrogen atoms is reduced or hydrogen atoms are removed. This reduces the hydrogen concentration in the insulator 224. The hydrogen concentration in the insulator 224 is preferably reduced because the insulator 224 is in contact with the oxide 230a in a later step.

Next, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed under a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed under a nitrogen atmosphere or an inert gas atmosphere, and then another heat treatment is performed under an atmosphere containing an oxidizing gas at 10 ppm or more, 1% or more, or 10% or more in order to compensate for released oxygen.

In this embodiment, heat treatment is performed at 400° C. under a nitrogen atmosphere for one hour, and another heat treatment is successively performed at 400° C. under an oxygen atmosphere for one hour. By the heat treatments, impurities such as water and hydrogen included in the insulator 224 can be removed.

The above heat treatment may be performed after the insulator 222 is formed. For the heat treatment, the above-described heat treatment conditions can be employed.

Plasma treatment using oxygen may be performed on the insulator 224 under a reduced pressure to form excess oxygen regions. The plasma treatment using oxygen is preferably performed with an apparatus including a power source for generating high-density plasma using microwaves, for example. Alternatively, a power source may be provided to apply a high-frequency such as RF to the substrate side. The use of high-density plasma generates high-density oxygen radicals, and application of the RF to the substrate side allows the oxygen radicals to be efficiently introduced into the insulator 224. Furthermore, after plasma treatment using an inert gas with the apparatus, plasma treatment using oxygen may be performed to compensate for released oxygen. Note that the impurities such as hydrogen and water contained in the insulator 224 can be removed by appropriate selection of the conditions of the plasma heat treatment. In this case, heat treatment is not necessarily performed.

Aluminum oxide may be deposited over the insulator 224 by a sputtering method, for example, and then subjected to CMP treatment until the insulator 224 is exposed. The CMP treatment can planarize and smooth the surface of the insulator 224. When the CMP treatment is performed on the aluminum oxide placed over the insulator 224, it is easy to detect the endpoint of the CMP treatment. Part of the insulator 224 may be polished by the CMP treatment so that the thickness of the insulator 224 may be reduced; the thickness of the insulator 224 can be adjusted at the time of forming the insulator 224. Planarizing and smoothing the surface of the insulator 224 can sometimes improve the coverage with an oxide deposited later and a decrease in yield of the semiconductor device. Aluminum oxide is preferably deposited over the insulator 224 by a sputtering method, in which case oxygen can be added to the insulator 224.

Next, oxide films 230A and 230B are formed in this order over the insulator 224 (see FIGS. 4A to 4D). The oxide films are preferably formed successively without exposure to the air. Formation of the oxide films 230A and 230B without exposure to the air prevents attachment of impurities or moisture from the air, so that the vicinity of the interface between the oxide films 230A and 230B can be kept clean.

The oxide films 230A and 230B can be formed by a sputtering method, a CVD method, an MBE method, a PLD method, an ALD method, or the like.

When the oxide films 230A and 230B are formed by a sputtering method, for example, oxygen or a mixed gas of oxygen and a rare gas is used as a sputtering gas. An increase in the proportion of oxygen in the sputtering gas can increase the amount of excess oxygen contained in the oxide film to be formed. In the case where the above oxide films are formed by a sputtering method, the above In-M-Zn oxide target can be used.

In particular, in the formation of the oxide film 230A, part of oxygen contained in the sputtering gas is supplied to the insulator 224 in some cases. Therefore, the proportion of oxygen in the sputtering gas for formation of the oxide film 230A is preferably 70% or higher, further preferably 80% or higher, and still further preferably 100%.

When the oxide film 230B is formed by a sputtering method and the oxygen proportion of the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility. In addition, when the oxide film is formed while the substrate is heated, the crystallinity of the oxide film can be improved. However, one embodiment of the present invention is not limited thereto. When the oxide film 230B is formed by a sputtering method and the oxygen proportion of oxygen in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability.

In this embodiment, the oxide film 230A is formed using a target with an atomic ratio of In:Ga:Zn=1:1:0.5 (In:Ga:Zn=2:2:1) or In:Ga:Zn=1:3:4 by a sputtering method. The oxide film 230B is formed using a target with an atomic ratio of In:Ga:Zn=4:2:4.1 or In:Ga:Zn=1:1:1 by a sputtering method. Note that each of the oxide films is formed by appropriate conditions of the film formation and the atomic ratio to have characteristics required for the oxide 230.

Next, heat treatment may be performed. For the heat treatment, the conditions for the heat treatment stated above can be used. The heat treatment can remove impurities such as water and hydrogen in the oxide films 230A and 230B. In this embodiment, treatment is performed at 400° C. under a nitrogen atmosphere for one hour, and another treatment is successively performed at 400° C. under an oxygen atmosphere for one hour.

Next, the oxide film 243A is formed over the oxide film 230B (see FIGS. 4A to 4D). The oxide film 243A can be formed by a sputtering method, a CVD method, an MBE method, a PLD method, an ALD method, or the like. The atomic ratio of Ga to In in the oxide film 243A is preferably greater than that in the oxide film 230B. In this embodiment, the oxide film 243A is formed using a target with an atomic ratio of In:Ga:Zn=1:3:4 by a sputtering method.

Next, the insulator 224, the oxide film 230A, the oxide film 230B, and the oxide film 243A are processed into an island shape by a lithography method, so that the insulator 224, the oxide 230a, the oxide 230b, and an oxide layer 243B are formed (see FIGS. 5A to 5D). The insulator 224, the oxides 230a and 230b, and the oxide layer 243B are formed to overlap with the conductor 205 at least partly. The insulator 224, the oxides 230a and 230b, and the oxide layer 243B are formed to include a region not overlapping at least with the conductor 204. The processing can be performed by a dry etching method or a wet etching method. A dry etching method is suitable for microfabrication.

It is preferable that side surfaces of the oxide 230a, the oxide 230b, and the oxide layer 243B be substantially perpendicular to the top surface of the insulator 222. It is preferable that the side surfaces of the oxide 230a, the oxide 230b and the conductive layer 243B be substantially perpendicular to the top surface of the insulator 222, in which case a plurality of transistors 200 can be provided in a smaller area and at a higher density. Not limited to this, the angle formed between the side surfaces of the oxide 230a, the oxide 230b, and the oxide layer 243B, and the top surface of the insulator 224 may be an acute angle.

In the lithography method, first, a resist is exposed to light through a mask. Next, a region exposed to light is removed or left using a developing solution, so that a resist mask is formed. Then, etching through the resist mask is conducted to form a conductor, a semiconductor, or an insulator into a desired shape. The resist mask is formed, for example, by exposing the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be performed; alternatively, wet etching treatment may be performed after dry etching treatment or dry etching treatment may be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the oxide layer 243B, a resist mask is formed thereover, and then the material of the hard mask is etched. The etching of the oxide layer 243B may be performed after or without removal of the resist mask. In the latter case, the resist mask sometimes disappears during the etching. The hard mask may be removed by etching after the etching of the oxide layer 243B. The hard mask does not need to be removed when the hard mask material does not affect the following process or can be utilized in the following process.

As a dry etching apparatus, a capacitively coupled plasma (CCP) etching apparatus including parallel plate electrodes can be used. The apparatus may have a structure in which high-frequency power is applied to one of the parallel plate electrodes. Alternatively, different high-frequency powers may be applied to one of the parallel plate electrodes. Alternatively, high-frequency powers with the same frequency may be applied to the parallel plate electrodes. Alternatively, high-frequency powers with different frequencies may be applied to the parallel plate electrodes. A dry etching apparatus including a high-density plasma source can be used. As the dry etching apparatus including a high-density plasma source, an inductively coupled plasma (ICP) etching apparatus can be used, for example.

Next, a conductive film to be the conductor layer 242A is formed over the oxide layer 243B (see FIGS. 6A to 6D). The conductive film to be the conductor layer 242A can be formed by a sputtering method, a CVD method, an MBE method, a PLD method, an ALD method, or the like.

Next, the conductive film to be the conductor layer 242A is processed by a lithography method, so that the conductor layer 242A is formed (see FIGS. 7A to 7D).

Next, the insulator 272 is formed over the conductor layer 242A (see FIGS. 7A to 7D). The insulator 272 can be formed by a sputtering method, a CVD method, an MBE method, a PLD method, an ALD method, or the like. In this embodiment, aluminum oxide is deposited as the insulator 272 by a sputtering method. When aluminum oxide is deposited by a sputtering method, oxygen can be supplied to the insulator 224.

Then, the insulator 273 is formed over the insulator 272. The insulator 273 can be formed by a sputtering method, a CVD method, an MBE method, a PLD method, an ALD method, or the like. In this embodiment, aluminum oxide is formed by an ALD method as the insulator 273 (see FIGS. 7A to 7D).

Next, an insulating film to be the insulator 280 is formed. The insulating film can be formed by a sputtering method, a CVD method, an MBE method, a PLD method, an ALD method, or the like. For example, as the insulator 280, a silicon oxide film is formed by a sputtering method, and a silicon oxide film may be formed thereover by a PEALD method or a thermal ALD method. The insulating film to be the insulator 280 is preferably formed by a deposition method using a gas in which the number of hydrogen atoms is reduced or hydrogen atoms are removed. This reduces the hydrogen concentration of the insulator 280.

Next, a CMP treatment is performed to form the insulator 280 with a flat top surface (see FIGS. 7A to 7D). As in the insulator 224, aluminum oxide is formed over the insulator 280 by a sputtering method, and then the aluminum oxide is subjected to a CMP treatment to expose the insulator 280.

Next, an opening is formed to reach the oxide 230b by removing part of the insulator 280, part of the insulator 273, part of the insulator 272, part of the conductor layer 242A, and part of the oxide layer 243B (see FIGS. 8A to 8D). The opening is preferably formed to overlap with the conductor 205. The conductors 242a and 242b and the oxides 243a and 243b are formed by the formation of the opening.

The insulator 280, the insulator 273, the insulator 272, the oxide layer 243B, and the conductor layer 242A can be partly processed by a dry etching method or a wet etching method. A dry etching method is suitable for microfabrication. The process may be performed under different conditions. For example, part of the insulator 280 may be processed by a dry etching method, part of the insulator 273 may be processed by a wet etching method, part of the insulator 272 may be processed by a dry etching method, and part of the oxide layer 243B and part of the conductor layer 242A may be processed by a dry etching method.

In some cases, treatment such as dry etching performed in the above process causes the attachment or diffusion of impurities due to an etching gas or the like to the surface or an inside of the oxide 230a, the oxide 230b, or the like. Examples of the impurities include fluorine and chlorine.

Cleaning is performed to remove the impurities. Examples of the cleaning method include a wet cleaning using a cleaning solution or the like, plasma treatment using plasma, cleaning by heat treatment, and any of these cleaning methods may be used in appropriate combination. The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

Through the processing such as dry etching or the cleaning treatment, a region of the oxide 230b that does not overlap with the oxides 243a and 243b is sometimes thinner than regions of the oxide 230b that overlap with the oxides 243a and 243b (see FIGS. 8A to 8D).

After the etching or the cleaning, heat treatment may be performed. The heat treatment may be performed at a temperature higher than or equal to 100° C. and lower than or equal to 450° C., preferably higher than or equal to 350° C. and lower than or equal to 400° C., for example. The heat treatment is performed under an atmosphere of a nitrogen gas or an inert gas, or an atmosphere containing an oxidizing gas at 10 ppm or more, 1% or more, or 10% or more. For example, the heat treatment is preferably performed under an oxygen atmosphere. This provides oxygen to the oxides 230a and 230b, and reduces oxygen vacancies. The heat treatment may be performed under a reduced pressure. Alternatively, the heat treatment may be performed under an oxygen atmosphere and then, without exposure to the air, heat treatment may be successively performed under a nitrogen atmosphere.

Next, an oxide film 230C is formed (see FIGS. 9A to 9D). Heat treatment can be performed before the oxide film 230C is formed; it is preferable that the heat treatment be performed under a reduced pressure and the oxide film 230C be successively formed without exposure to the air. The heat treatment is preferably performed in an atmosphere containing oxygen. The treatment removes moisture and hydrogen absorbed onto the surface of the oxide 230b and the like, and reduces moisture concentration and hydrogen concentration in the oxides 230a and 230b. The heat treatment is preferably performed at a temperature higher than or equal to 100° C. and lower than or equal to 400° C., further preferably performed at a temperature higher than or equal to 150° C. and lower than or equal to 350° C. In this embodiment, the heat treatment is performed at 200° C. under a reduced pressure.

It is preferable that the oxide film 230C be provided in contact with at least part of the top surface of the oxide 230b, part of the side surfaces of the oxide 243, part of the side surfaces of the conductor 242, part of the side surfaces of the insulator 272, part of the side surfaces of the insulator 273, and part of the side surfaces of the insulator 280. When the conductor 242 is surrounded by the oxide 243, the insulator 272, the insulator 273, and the oxide film 230C, a decrease in the conductivity of the conductor 242 due to oxidation in a later step can be inhibited.

The oxide film 230C can be formed by a sputtering method, a CVD method, an MBE method, a PLD method, an ALD method, or the like. The oxide film 230C is formed by a sputtering method using a target having an atomic ratio of In:Ga:Zn=4:2:4.1, a target having an atomic ratio of In:Ga:Zn=5:1:3, a target having an atomic ratio of 10:1:3, a target having an atomic ratio of In:Ga:Zn=1:3:4, or a target of indium oxide. A target with a high proportion of indium for the oxide film 230C can improve the on current and the field-effect mobility of the transistor 200.

The oxide film 230C may have a stacked-layer structure. For example, the oxide film 230C may be formed by a sputtering method using a target with an atomic ratio of In:Ga:Zn=4:2:4.1 and successively using a target with an atomic ratio of In:Ga:Zn=1:3:4.

Some oxygen contained in a sputtering gas which is used for forming the oxide film 230C is sometimes supplied to the oxides 230a and 230b. Some oxygen contained in a sputtering gas which is used for forming the oxide film 230C is also sometimes supplied to the insulator 280. Therefore, the proportion of oxygen in the sputtering gas for the oxide film 230C is preferably 70% or higher, further preferably 80% or higher, still further preferably 100%.

Next, heat treatment may be performed. The heat treatment may be performed under a reduced pressure, and an insulating film 250A may be successively formed without exposure to the air. The heat treatment can remove moisture and hydrogen absorbed onto the surface of the oxide film 230C or the like, and can reduce the moisture and hydrogen concentration of the oxides 230a and 230b and the oxide film 230C. The heat treatment is preferably performed at a temperature higher than or equal to 100° C. and lower than or equal to 400° C. In this embodiment, the heat treatment is performed at 200° C.

Next, an insulating film 250A is formed over the oxide film 230C (see FIGS. 9A to 9D). The insulating film 250A can be formed by a sputtering method, a CVD method, an MBE method, a PLD method, an ALD method, or the like. The insulating film 250A is preferably formed by a deposition method using a gas in which the number of hydrogen atoms is reduced or hydrogen atoms are removed. This reduces the hydrogen concentration of the insulating film 250A. The hydrogen concentration in the insulating film 250A is preferably reduced because the insulating film 250A becomes the insulator 250 that is in contact with the oxide 230c in a later step.

Next, microwaves or high-frequency waves such as RF may be irradiated with. The microwaves or the high-frequency waves such as RF permeate the insulator 280, oxide 230b, and the oxide 230a to remove hydrogen therein. In particular, in the oxides 230a and 230b, a reaction in which a bond of $V_OH$ is cut, i.e., a reaction of $V_OH \rightarrow V_O+H$, occurs, and the oxides 230a and 230b are dehydrogenated. Some hydrogen generated at this time is bonded to oxygen to be $H_2O$, and removed from the oxide 230 and insulator 280, in some cases. Some hydrogen may be gettered by into the conductor 242. The irradiation with the microwaves or the high-frequency waves such as RF can reduce hydrogen in the insulator 280, the oxide 230a and the oxide 230b.

Oxygen gas is irradiated with the microwaves or the high-frequency waves such as RF to be plasma, which generates oxygen radicals. The treatment can be performed on the insulator 280, the oxides 230a and 230b under an atmosphere containing oxygen. The treatment may be referred to as oxygen plasma treatment below. The oxygen radicals can supply oxygen to the insulator 280, the oxide 230a, and the oxide 230b. When the plasma treatment is performed on the insulator 280, the oxide 230a, and the oxide 230b under an atmosphere containing oxygen, the oxide 230 may be less likely to be irradiated with a microwave or a high-frequency wave such as RF.

The oxygen plasma treatment is preferably performed with a microwave treatment apparatus including a power source for generating high-density plasma using microwaves, for example. A power source may be provided to the microwave treatment apparatus to apply RF to the substrate side. Oxygen radicals at a high density can be generated with high-density plasma. Furthermore, application of RF to the substrate side allows oxygen ions generated by the high-density plasma to permeate the insulator 280 and the oxide 230 efficiently. The oxygen plasma treatment is preferably performed under a reduced pressure, and the pressure is set to be 60 Pa or higher, preferably 133 Pa or higher, further preferably 200 Pa or higher, and still further preferably 400 Pa or higher. The treatment is performed with the oxygen flow rate ($O_2/O_2+Ar$) of 50% or lower, preferably 10% or more and 30% or lower. The treatment can be performed at approximately 400° C., for example. The oxygen plasma treatment can be followed successively by heat treatment without exposure to air.

Next, a conductive film 260Aa and a conductive film 260Ab are formed (see FIGS. 10A to 10D). The conductive film 260Aa and the conductive film 260Ab can be formed by a sputtering method, a CVD method, an MBE method, a PLD method, an ALD method, or the like. A CVD method is preferably used, for example. In this embodiment, the conductive film 260Aa is formed by an ALD method, and the conductive film 260Ab is formed by a CVD method.

Then, the oxide film 230C, the insulating film 250A, the conductive film 260A, and the conductive films 260Aa and 260Ab are polished by a CMP treatment until the insulator 280 is exposed, whereby the oxide 230c, the insulator 250, and the conductor 260 (the conductors 260a and 260b) are formed (see FIGS. 11A to 11D).

Next, heat treatment may be performed. In this embodiment, the heat treatment is performed at 400° C. under a nitrogen atmosphere for one hour. The heat treatment can reduce the moisture concentration and the hydrogen concentration in the insulators 250 and 280. The insulator 282 can be deposited successively after the heat treatment without exposure to the air.

Next, the insulator 282 is formed over the conductor 260, the oxide 230c, the insulator 250, and the insulator 280. The insulator 282 can be formed by a sputtering method, a CVD method, an MBE method, a PLD method, an ALD method, or the like (see FIGS. 12A to 12D). The insulator 282 is preferably formed using aluminum oxide by a sputtering method. Forming the insulator 282 with an atmosphere containing oxygen by a sputtering method can provide oxygen to the insulator 280. The formation of the insulator 282 is preferably performed while the substrate is heated. The formation of the insulator 282 in contact with the top surface of the conductor 260 inhibits absorption of oxygen in the insulator 280 into the conductor 260 in the later heat treatment.

Then, the insulator 283 is formed over the insulator 282 (see FIGS. 13A to 13D). The insulator 283 can be formed by a sputtering method, a CVD method, an MBE method, a PLD method, an ALD method, or the like. The insulator 283 may have a multilayer structure. For example, silicon nitride may be formed by a sputtering method and silicon nitride may be formed by a CVD method over the silicon nitride.

Next, heat treatment may be performed. In this embodiment, the heat treatment is performed at 400° C. in a nitrogen atmosphere for one hour. The heat treatment allows oxygen added by forming the insulator 282 to diffuse in the insulator 280, and to be provided to the oxides 230a and 230b through the oxide 230c. The oxygen adding treatment performed in this manner on the oxide 230 can promote a reaction in which oxygen vacancies in the oxide 230 (the oxide 230b) are filled with oxygen, i.e., a reaction of $V_O + O \rightarrow$ null. Furthermore, hydrogen remaining in the oxide 230 reacts with supplied oxygen, so that the hydrogen can be removed as $H_2O$ (dehydrogenation). This can inhibit recombination of hydrogen remaining in the oxide 230 with oxygen vacancies and formation of $V_OH$. Note that the heat treatment is not necessarily performed after the formation of the insulator 283 and may be performed after the formation of the insulator 282.

Next, an opening is formed in the insulators 272, 273, 280, 282, and 283 to reach the conductor 242b (see FIGS. 13A to 13D). The opening are formed by a lithography method. Although the opening in FIG. 13A has a circular shape in the top view, the shape is not limited thereto. For example, the opening may have an almost circular shape such as an ellipse, a polygonal shape such as a square, or a polygonal shape such as a square with rounded corners.

Next, an insulating film to be the insulator 241 is formed and subjected to anisotropic etching, so that the insulator 241 is formed. The insulating film to be the insulator 241 can be formed by a sputtering method, a CVD method, an MBE method, a PLD method, an ALD method, or the like. The insulating film to be the insulator 241 preferably has a function of inhibiting the transmission of oxygen. For example, an aluminum oxide film is preferably formed by a PEALD method. Alternatively, silicon nitride is preferably formed by a PEALD method. Silicon nitride is preferable because it has high blocking property against hydrogen.

As an anisotropic etching for the insulating film to be the insulator 241, a dry etching method may be performed, for example. The insulator 241 is provided on the sidewall of the opening. This inhibits transmission of oxygen from outside to inhibit oxidation of the conductor 240. Furthermore, impurities such as water and hydrogen can be prevented from diffusing from the conductor 240 to the outside.

Next, a conductive film to be the conductor 240 is formed. The conductive film to be the conductor 240 preferably has a stacked-layer structure which includes a conductor having a function of inhibiting the transmission of impurities such as water and hydrogen. For example, a stacked-layer structure of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, a CMP treatment removes part of the conductive film to be the conductor 240 to expose the top surface of the insulator 283. Thus, the conductive film remains only in the opening (see FIGS. 13A to 13D), which yields the conductor 240 with a flat surface. The CMP treatment may remove part of the top surface of the insulator 283.

Next, a conductive film to be the conductor 246 is formed. The conductive film to be the conductor 246 can be formed by a sputtering method, a CVD method, an MBE method, a PLD method, an ALD method, or the like.

Next, the conductive film to be the conductor 246 is processed by a lithography method to form the conductor 246, which is in contact with the top surface of the conductor 240 (see FIGS. 14A to 14D). Although not illustrated, the thickness of the insulator 283 in a region that does not overlap with the insulator 283 might be reduced.

Next, the insulator 284 is formed over the conductor 246 and the insulator 283 (see FIGS. 1A to 1D). The insulator 284 can be formed by a sputtering method, a CVD method, an MBE method, a PLD method, an ALD method, or the like. The insulator 284 may have a multilayer structure. For example, silicon nitride may be deposited by a sputtering method and another silicon nitride may be deposited by a CVD method over the silicon nitride. By depositing the insulator 284 over the conductor 246 and the insulator 283, the top surface and a side surface of the conductor 246 are in contact with the insulator 284, and part of the bottom surface of the conductor 246 is in contact with the insulator 283. In other words, the conductor 246 can be surrounded by the insulators 284 and 283. The structure can inhibit transmission of oxygen from the outside and oxidation of the conductor 246. Furthermore, this can inhibit diffusion of impurities such as water or hydrogen from the conductor 246 to the outside, which is preferable.

Next, the insulator 274 can be formed over the insulator 284 (see FIGS. 1A to 1D). The insulator 274 can be formed by a sputtering method, a CVD method, an MBE method, a PLD method, an ALD method, or the like. The insulator 274 is preferably formed by the deposition method using a gas in which hydrogen atoms are reduced or removed. This reduces the hydrogen concentration of the insulator 274.

Through the above process, the semiconductor device including the transistor 200 shown in FIGS. 1A to 1D can be manufactured. By the manufacturing method of a semiconductor device which is described in this embodiment and illustrated in FIGS. 4A to 4D to FIGS. 14A to 14D, the semiconductor device including the transistor 200 and the capacitor 100 can be formed.

<Modification Example of Semiconductor Device>

Examples of a semiconductor device of one embodiment of the present invention including the transistor 200 and the capacitor 100 which is different from the semiconductor device described above in <Structure example of semiconductor device> will be described below with reference to FIGS. 2A to 2D, FIGS. 3A to 3D, FIGS. 15A to 15C, FIG. 16, FIG. 17, FIG. 18, and FIG. 19. Note that in the semiconductor devices illustrated in FIGS. 2A to 2D, FIGS. 3A to 3D, FIGS. 15A to 15C, FIG. 16, FIG. 17, FIG. 18, and FIG. 19, components having the same functions as the components in the semiconductor device described in <Structure example of semiconductor device> (see FIGS. 1A to 1D) are denoted by the same reference numerals. Note that the materials for the transistor 200 and the capacitor 100 described in detail in <Structure example of semiconductor device> can be used as materials for the transistor 200 and the capacitor 100 in this section.

<Modification Example 1 of Semiconductor Device>

Figure 2A:
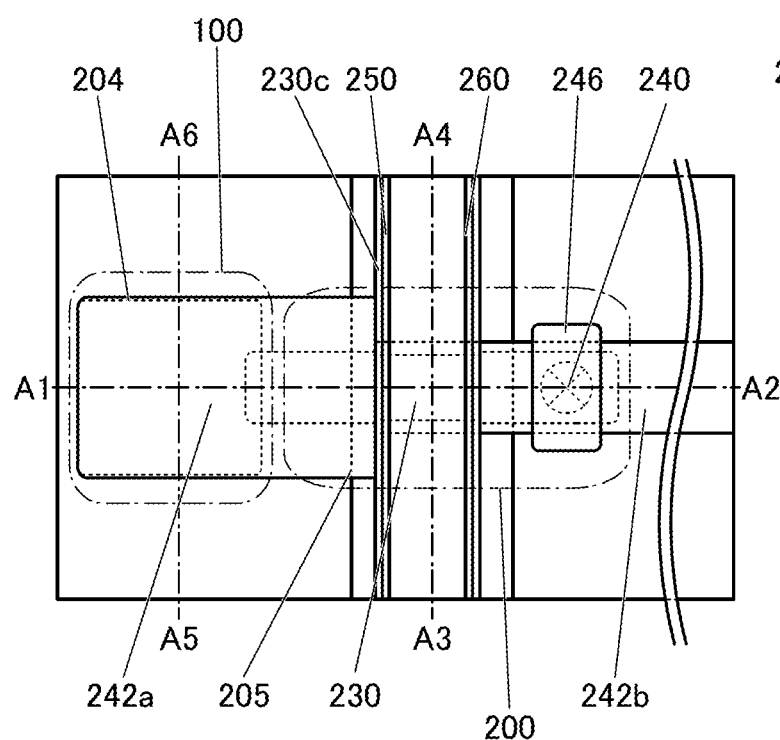
FIG. 2A is a top view of a structure example of a semiconductor device.
Figure 2C:
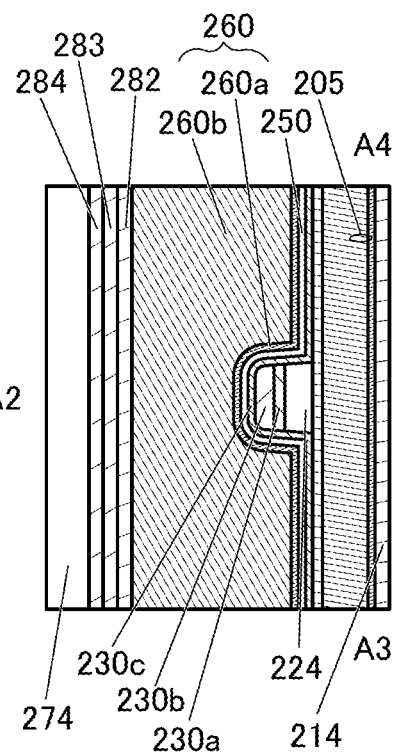
FIGS. 2B to 2D are cross-sectional views of a structure example of a semiconductor device.
Figure 2B:
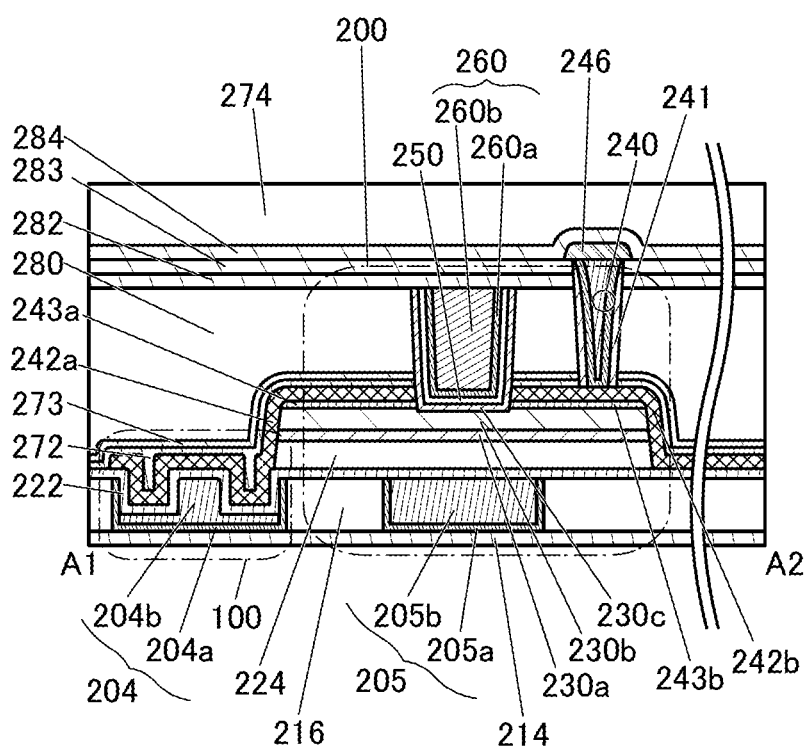
Figure 2D:
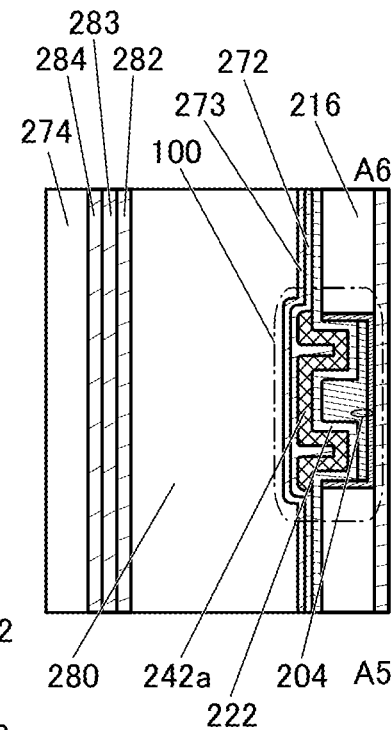

FIG. 2A is a top view of the semiconductor device including the transistor 200 and the capacitor 100. FIGS. 2B to 2D are cross-sectional views of the semiconductor device. FIG. 2B is a cross-sectional view taken along the dashed-dotted line A1-A2 in FIG. 2A, which corresponds to a cross-sectional view in the channel length direction of the transistor 200 and the capacitor 100. FIG. 2C is a cross-sectional view taken along the dashed-dotted line A3-A4 in FIG. 2A, which corresponds to a cross-sectional view in the channel width direction of the transistor 200. FIG. 2D is a cross-sectional view taken along the dashed-dotted line A5-A6 in FIG. 2A, which corresponds to a cross-sectional view in the channel width direction of the capacitor 100. Note that for simplification, some components are not illustrated in the top view in FIG. 2A.

The cross sectional-views of the capacitor 100 shown in FIGS. 2B and 2D are different from those of the capacitor 100 shown in FIGS. 1B and 1D. Specifically, the conductor 204b forms projections and depressions in the channel length direction and in the channel width direction and the insulator 222 over the conductor 204b is formed along the projections and the depressions, as is shown in FIGS. 2B and 2D. This structure allows the conductor 204, which serves as one electrode of the capacitor 100, and the conductor 242a, which serves as the other electrode of the capacitor 100, to overlap with the insulator 222, which is a dielectric of the capacitor 100, therebetween with a wider area than an area seen from the top. In other words, this structure can increase the capacity of the capacitor 100 without increasing the area in the top view where one electrode and the other electrode overlap with each other, which yields miniaturization of the capacitor.

To form the projections and the depressions as shown in FIGS. 2B and 2D, for example, the conductor 204 which is the conductor 204b with a flat top surface is formed shown in FIGS. 1B and 1D, and then a lithography method forms the projections and the depressions on the conductor 204b. In this modification example, the projections and the depressions are formed both in the channel length direction and in the channel width direction, but this example can include another structure. For example, the projections and the depressions can be formed in either the channel length direction or the channel width direction. The number of the projections and the depressions is not limited. The number and the direction of the projections and the depressions to be formed can be determined by the required capacity of the capacitor of the semiconductor device. The other structures and the effects can refer to those in FIGS. 1A to 1D.

<Modification Example 2 of Semiconductor Device>

Figure 3A:
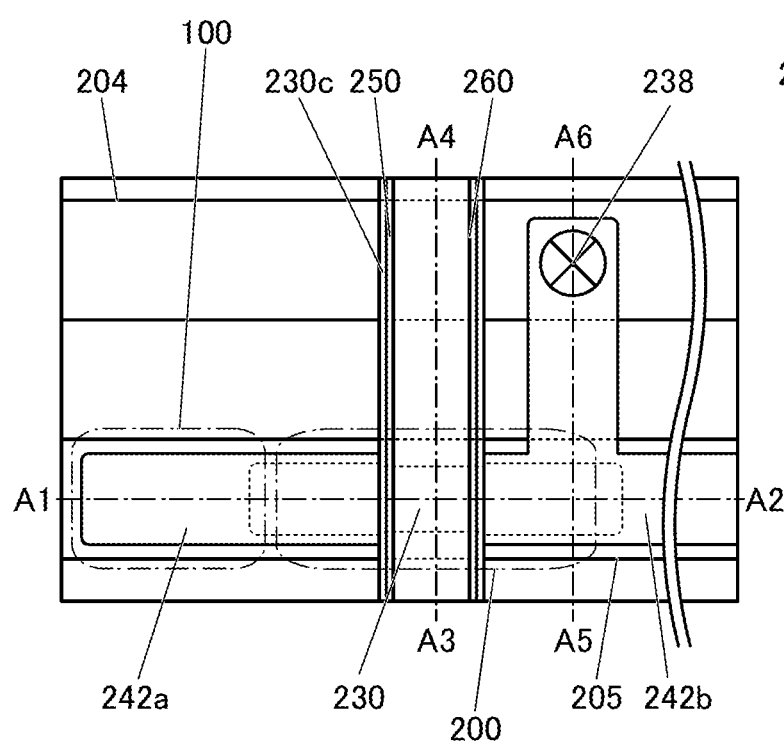
FIG. 3A is a top view of a structure example of a semiconductor device.
Figure 3C:
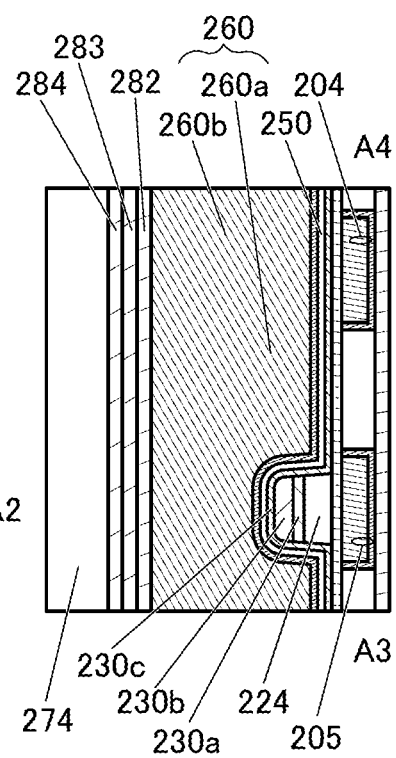
FIGS. 3B to 3D are cross-sectional views of a structure example of a semiconductor device.
Figure 3B:
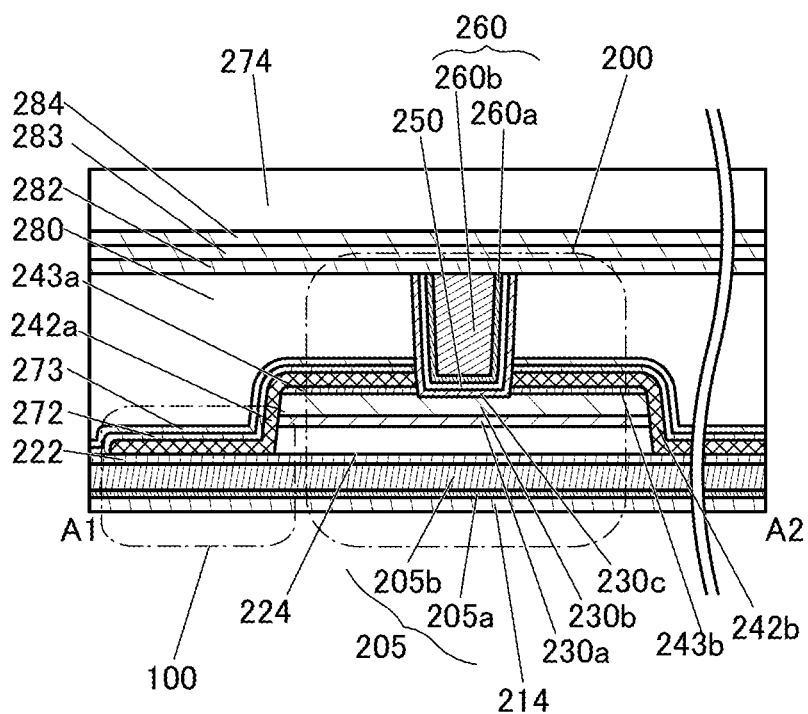
Figure 3D:
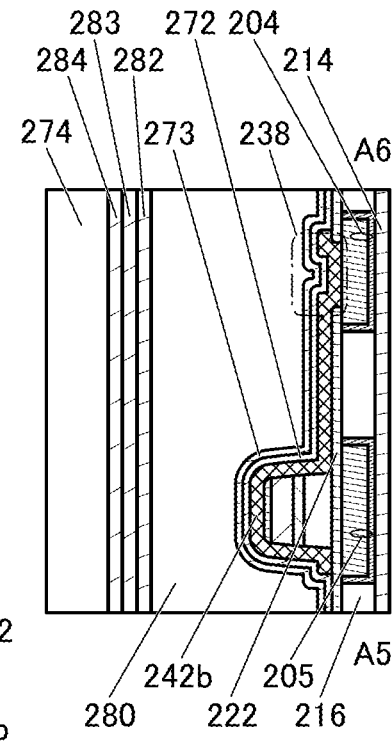
Figure 4A:
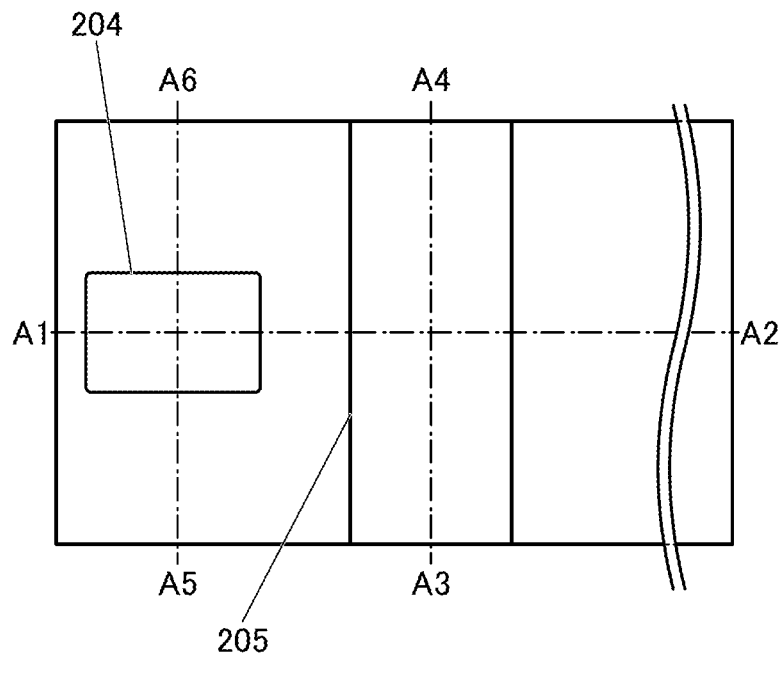
FIG. 4A is a top view illustrating a manufacturing method of a semiconductor device.
Figure 4C:
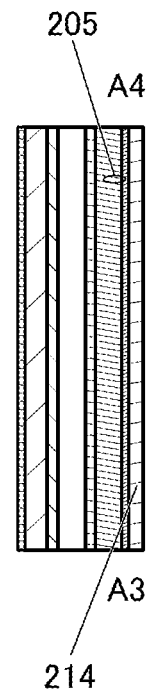
FIGS. 4B to 4D are cross-sectional views illustrating a manufacturing method of a semiconductor device.
Figure 4B:
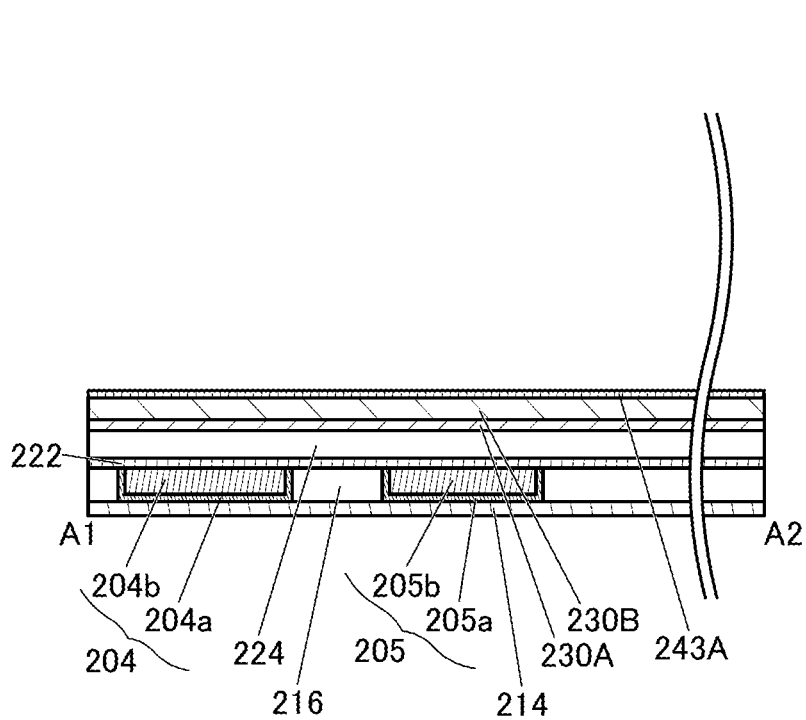
Figure 4D:
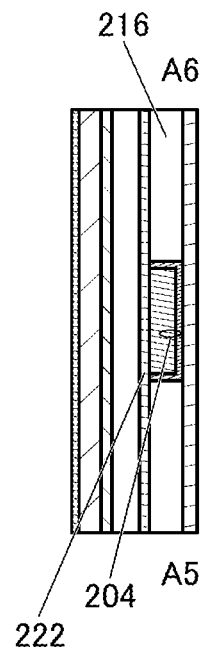
Figure 5A:
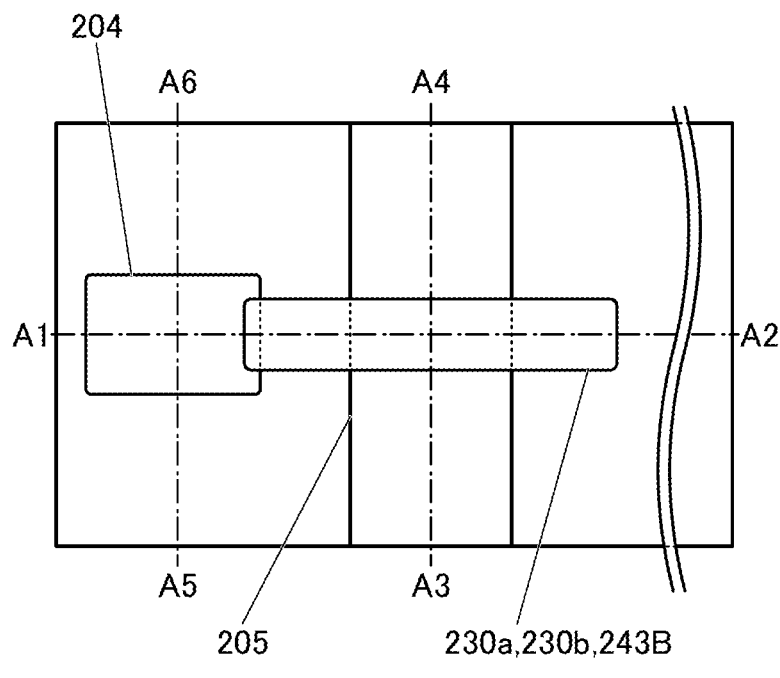
FIG. 5A is a top view illustrating a manufacturing method of a semiconductor device.
Figure 5C:
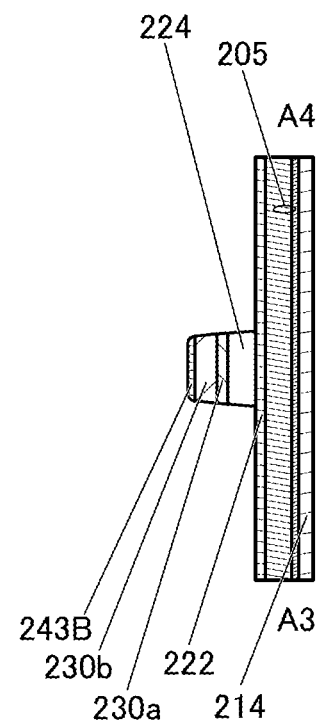
FIG. 5B to 5D are cross-sectional views illustrating a manufacturing method of a semiconductor device.
Figure 5B:
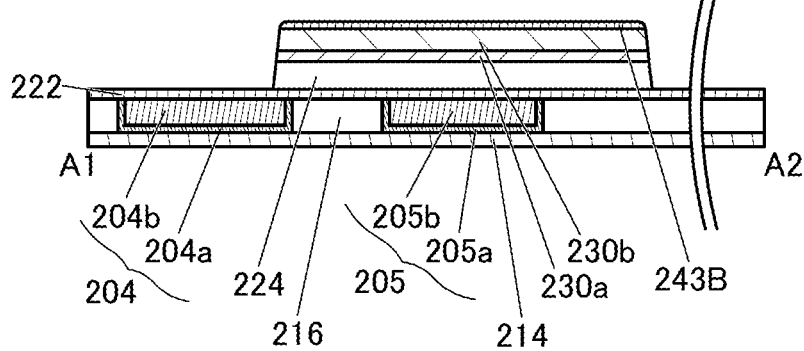
Figure 5D:
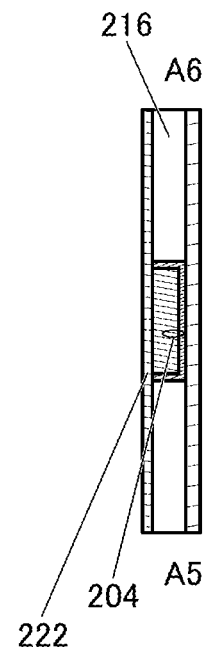
Figure 6A:
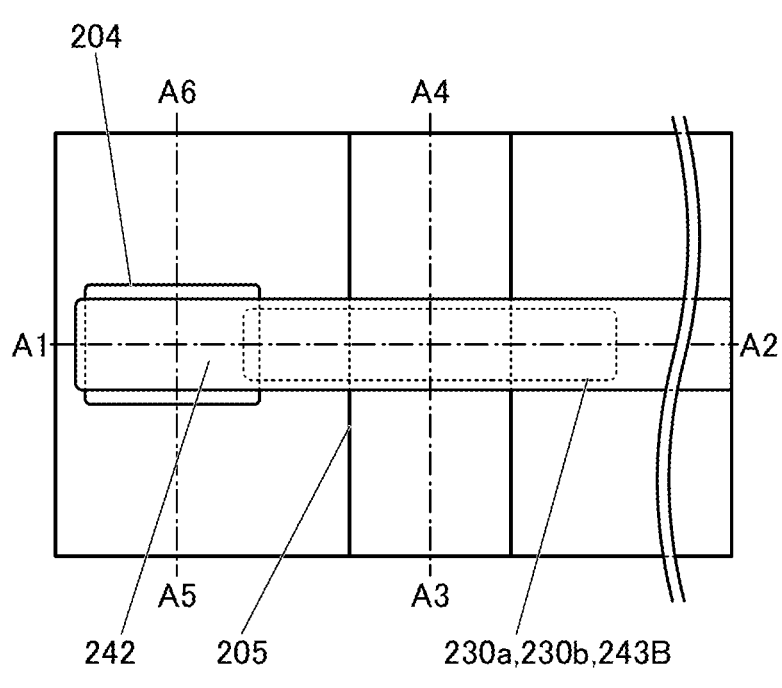
FIG. 6A is a top view illustrating a manufacturing method of a semiconductor device.
Figure 6C:
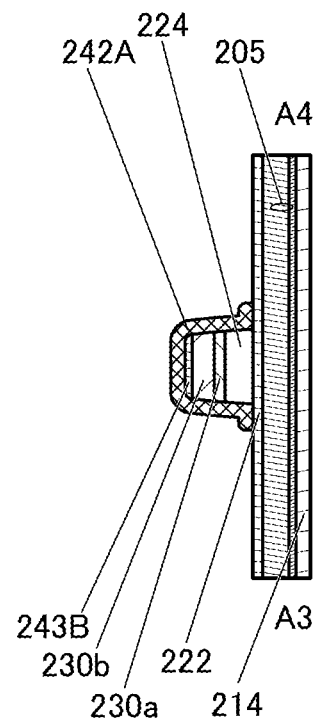
FIGS. 6B to 6D are cross-sectional views illustrating a manufacturing method of a semiconductor device.
Figure 6B:
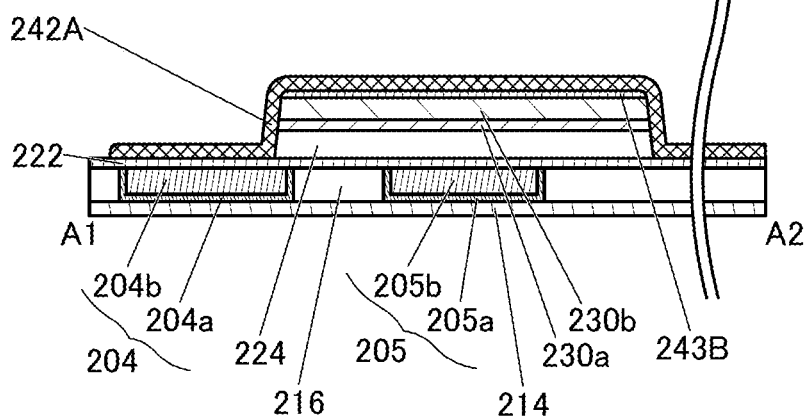
Figure 6D:
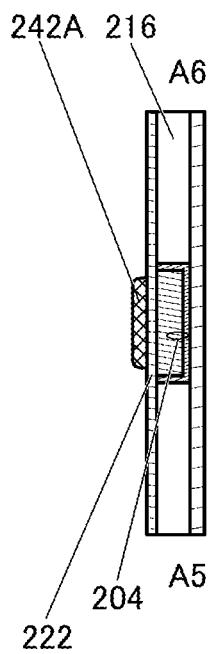
Figure 7A:
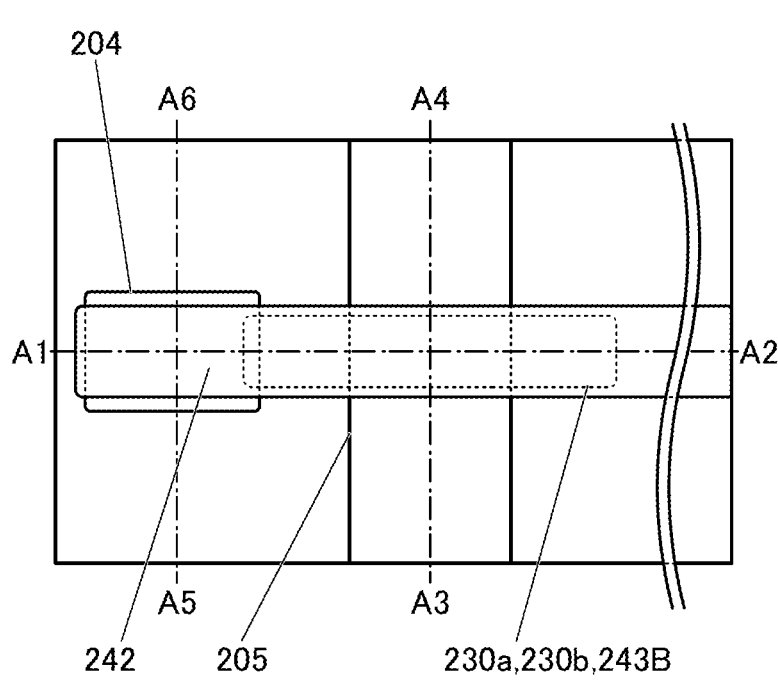
FIG. 7A is a top view illustrating a manufacturing method of a semiconductor device.
Figure 7C:
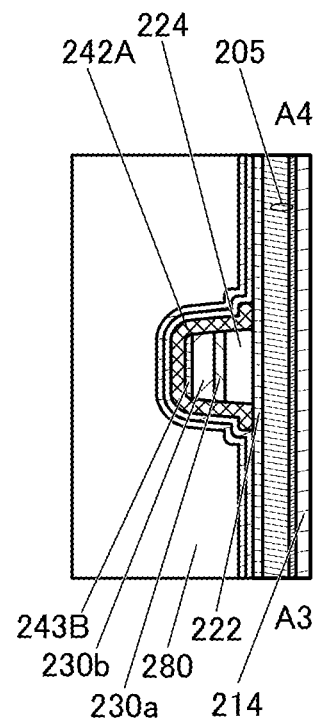
FIGS. 7B to 7D are cross-sectional views illustrating a manufacturing method of a semiconductor device.
Figure 7B:
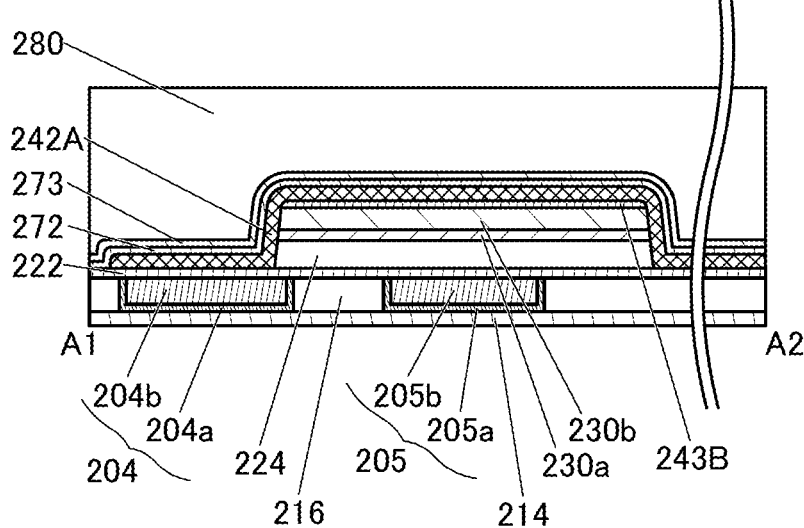
Figure 7D:
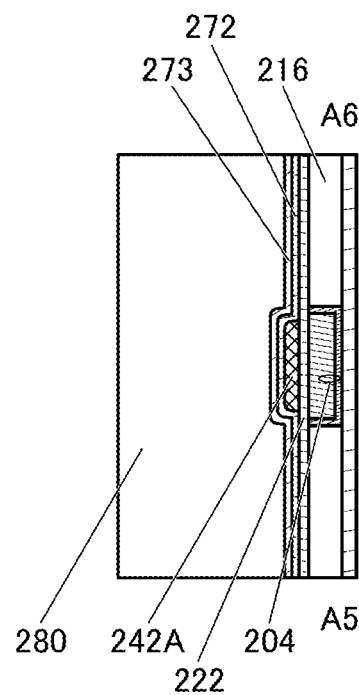
Figure 8A:
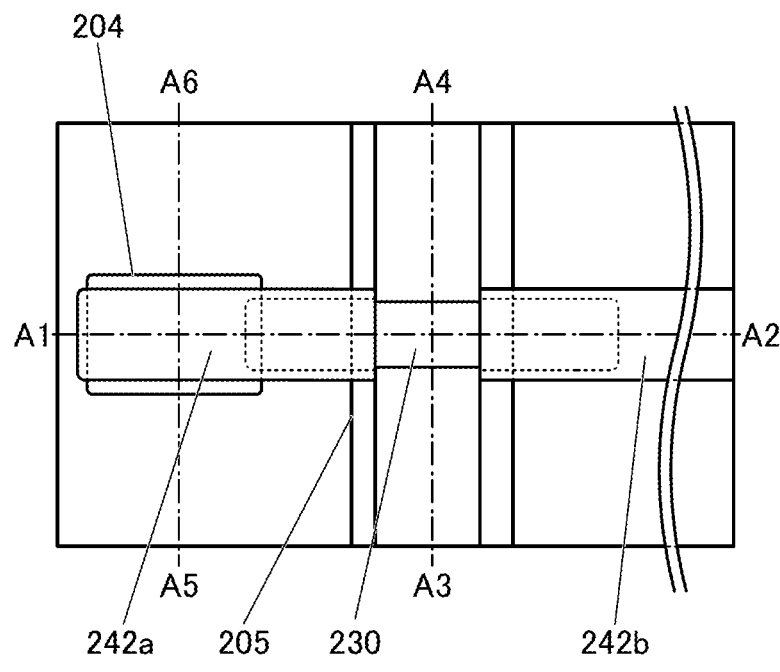
FIG. 8A is a top view illustrating a manufacturing method of a semiconductor device.
Figure 8C:
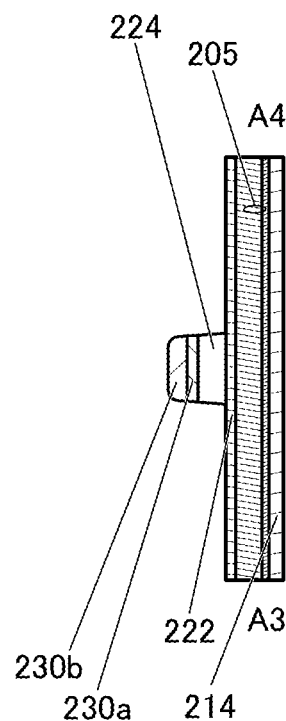
FIGS. 8B to 8D are cross-sectional views illustrating a manufacturing method of a semiconductor device.
Figure 8B:
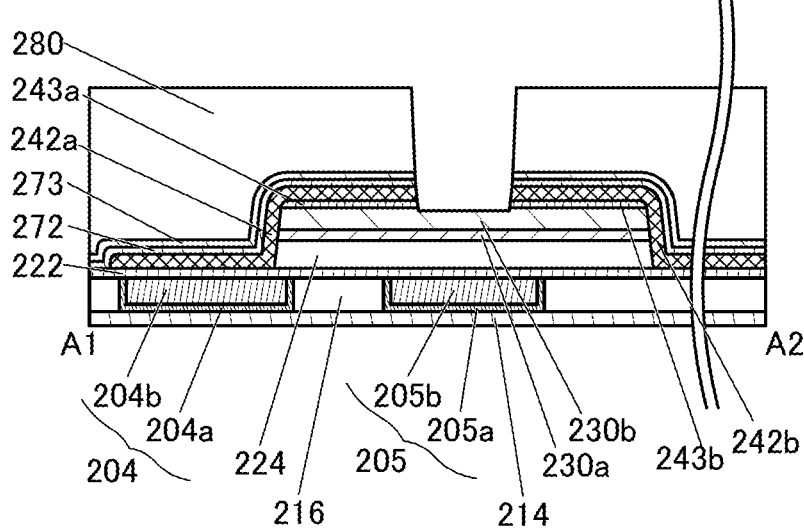
Figure 8D:
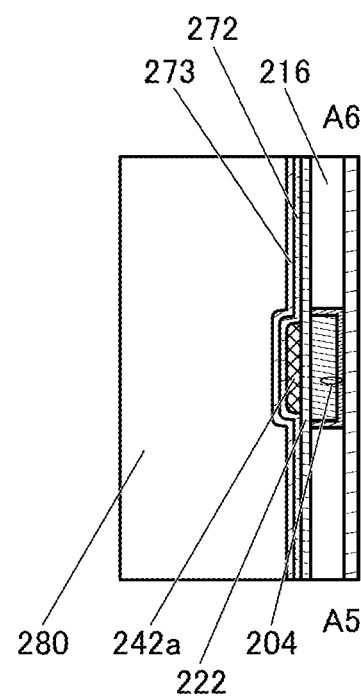
Figure 9A:
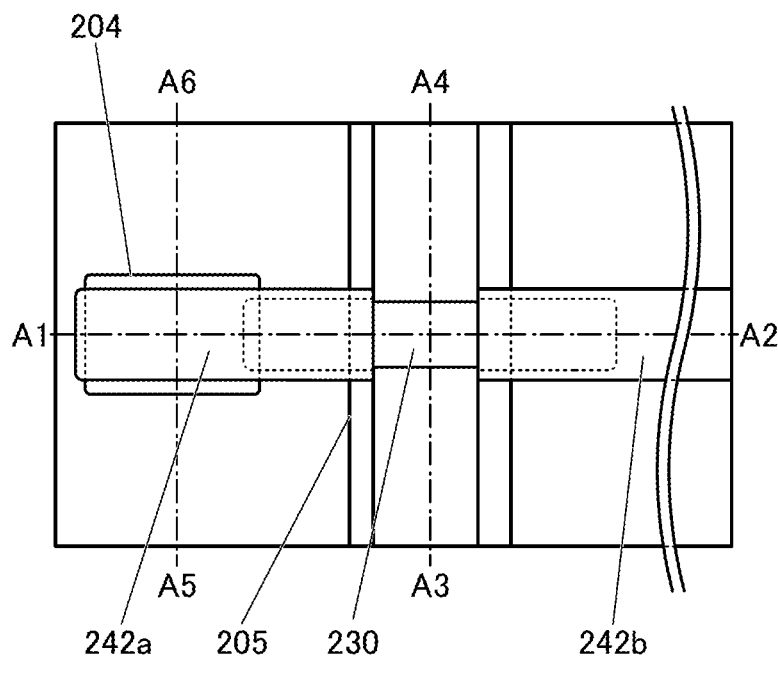
FIG. 9A is a top view illustrating a manufacturing method of a semiconductor device.
Figure 9C:
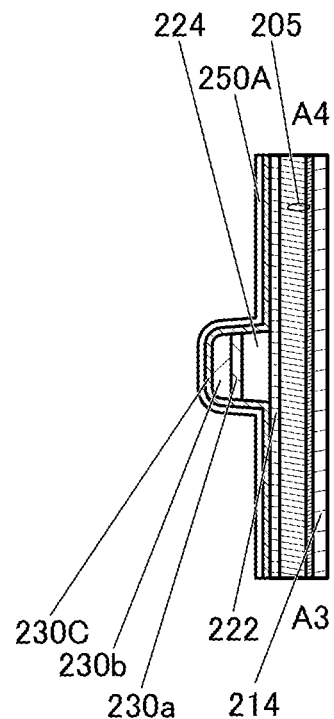
FIGS. 9B to 9D are cross-sectional views illustrating a manufacturing method of a semiconductor device.
Figure 9B:
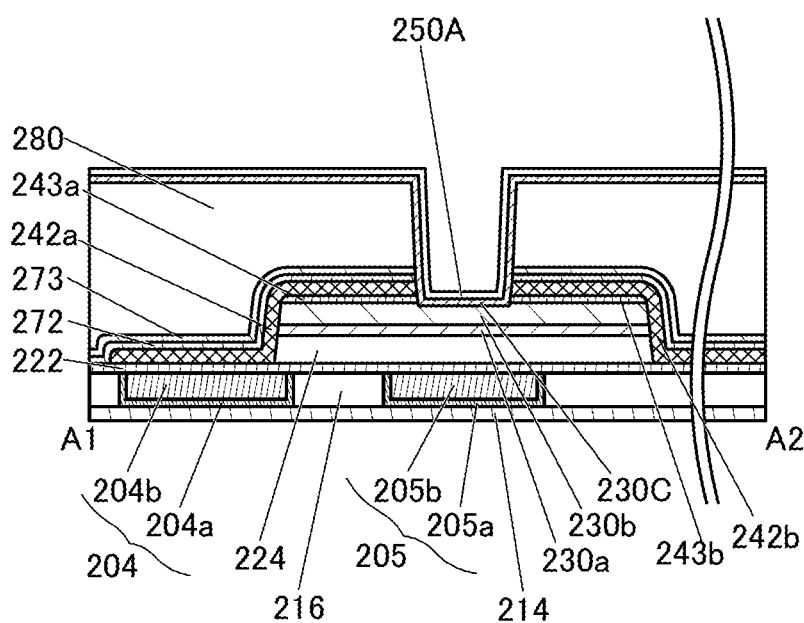
Figure 9D:
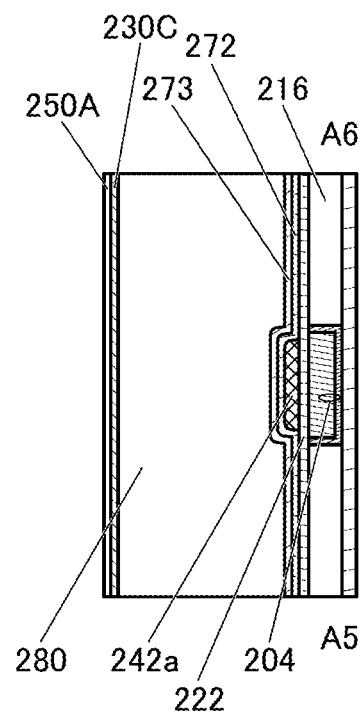
Figure 10A:
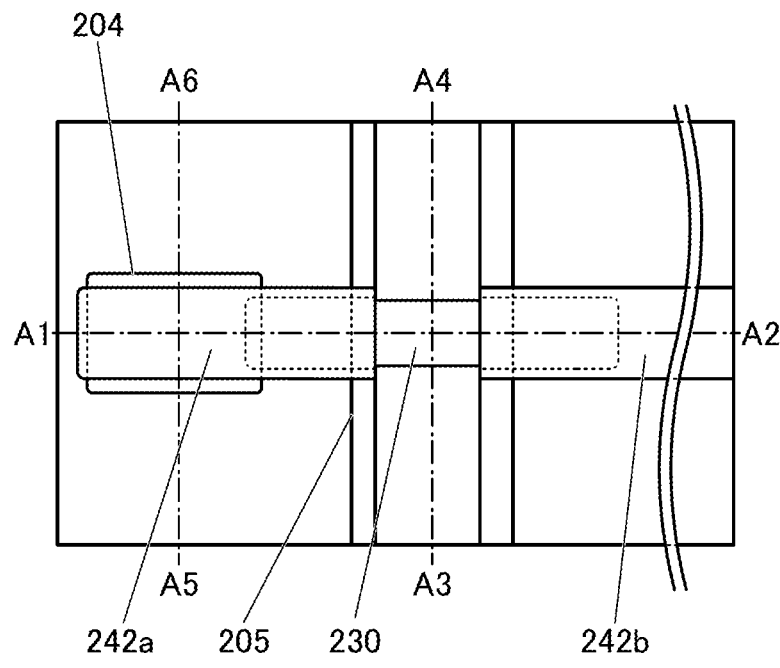
FIG. 10A is a top view illustrating a manufacturing method of a semiconductor device.
Figure 10C:
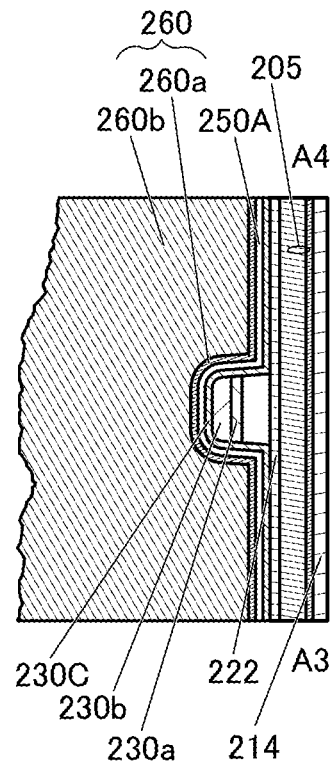
FIGS. 10B to 10D are cross-sectional views illustrating a manufacturing method of a semiconductor device.
Figure 10B:
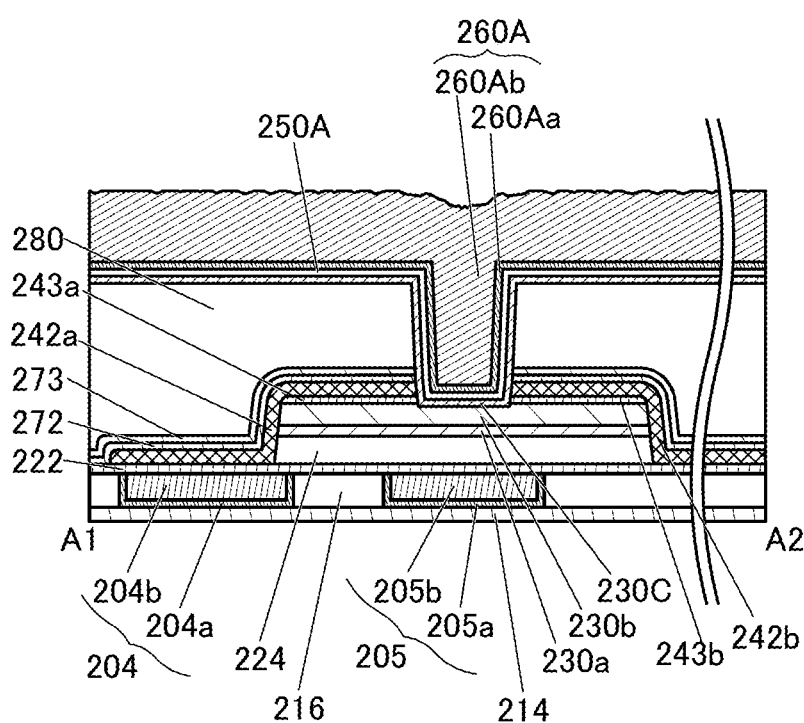
Figure 10D:
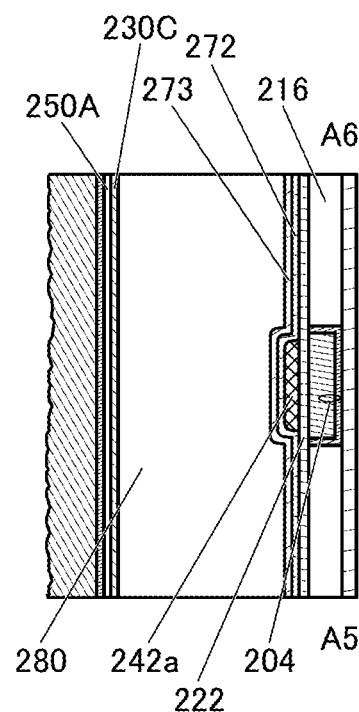
Figure 11A:
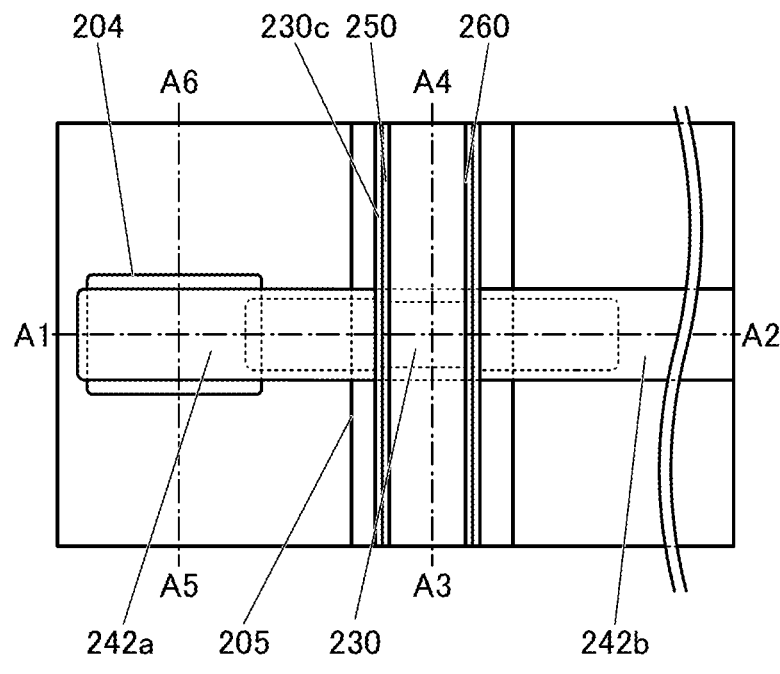
FIG. 11A is a top view illustrating a manufacturing method of a semiconductor device.
Figure 11C:
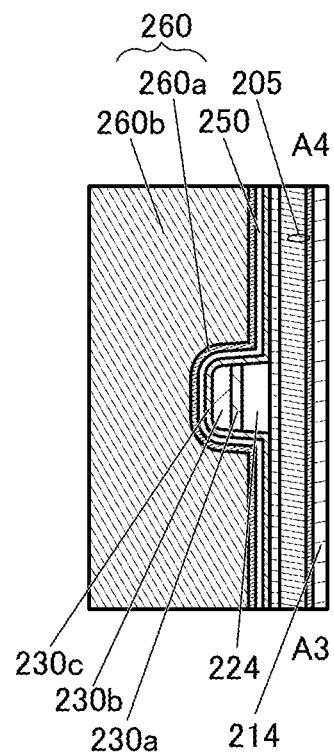
FIGS. 11B to 11D are cross-sectional views illustrating a manufacturing method of a semiconductor device.
Figure 11B:
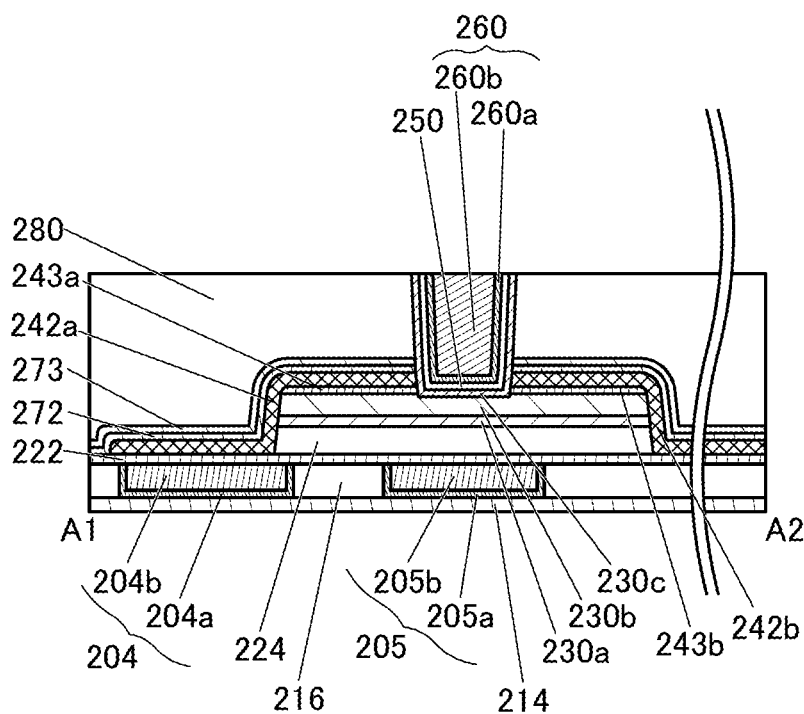
Figure 11D:
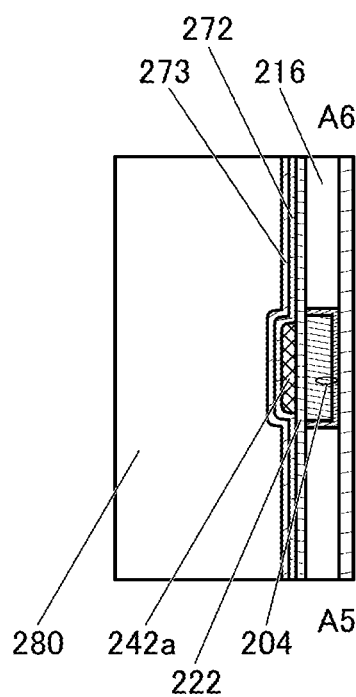
Figure 12A:
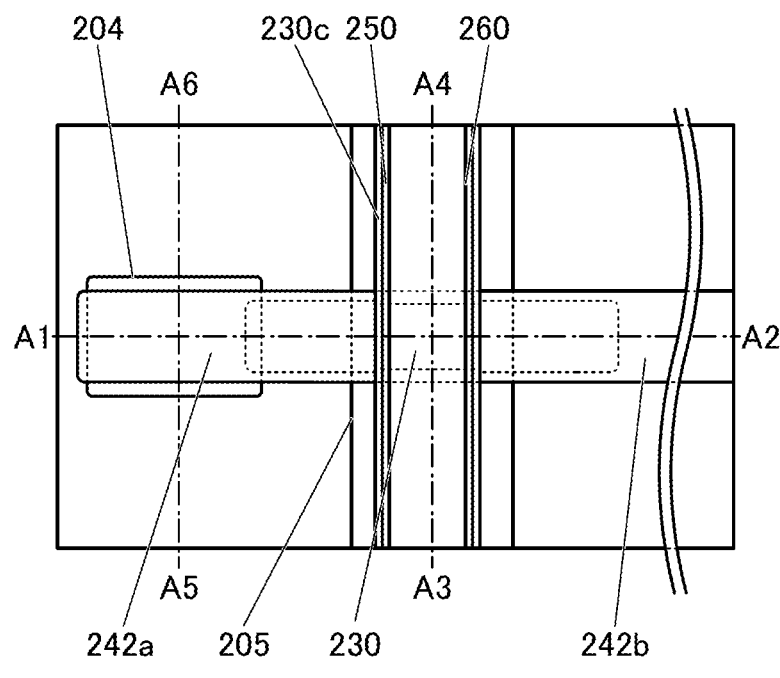
FIG. 12A is a top view illustrating a manufacturing method of a semiconductor device.
Figure 12C:
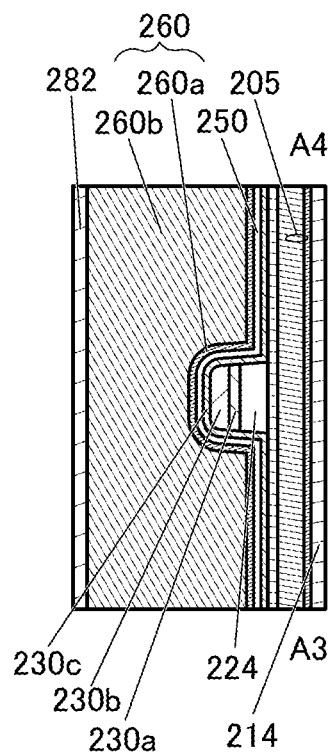
FIGS. 12B to 12D are cross-sectional views illustrating a manufacturing method of a semiconductor device.
Figure 12B:
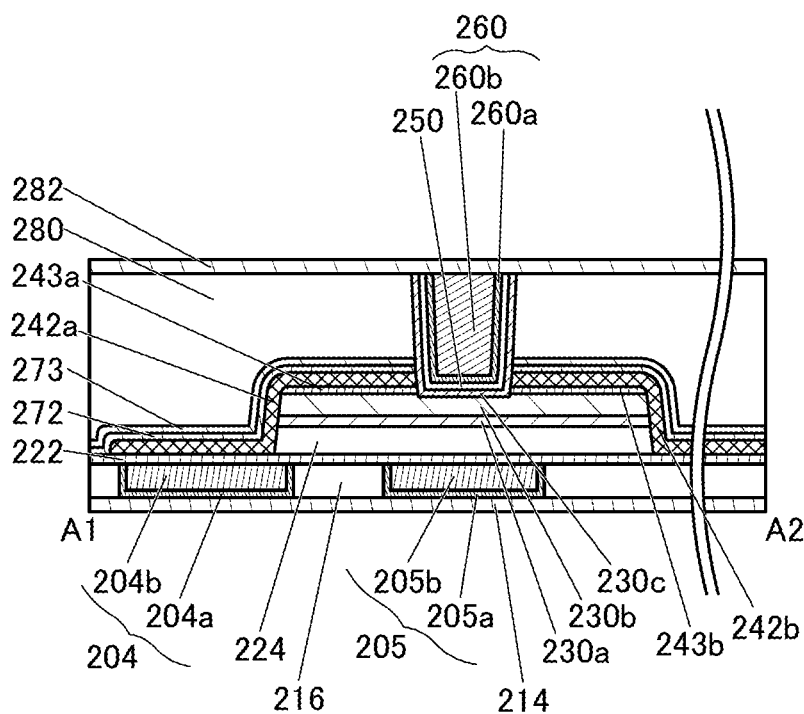
Figure 12D:
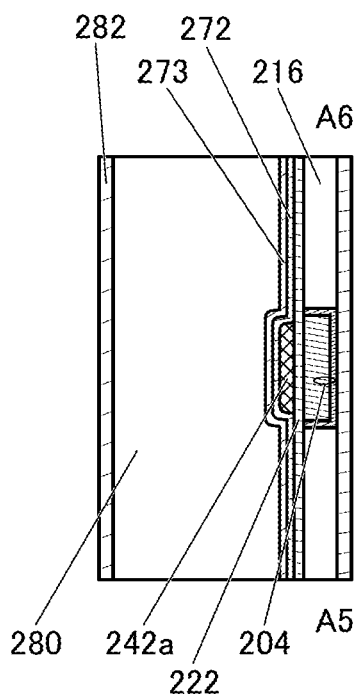
Figure 13A:
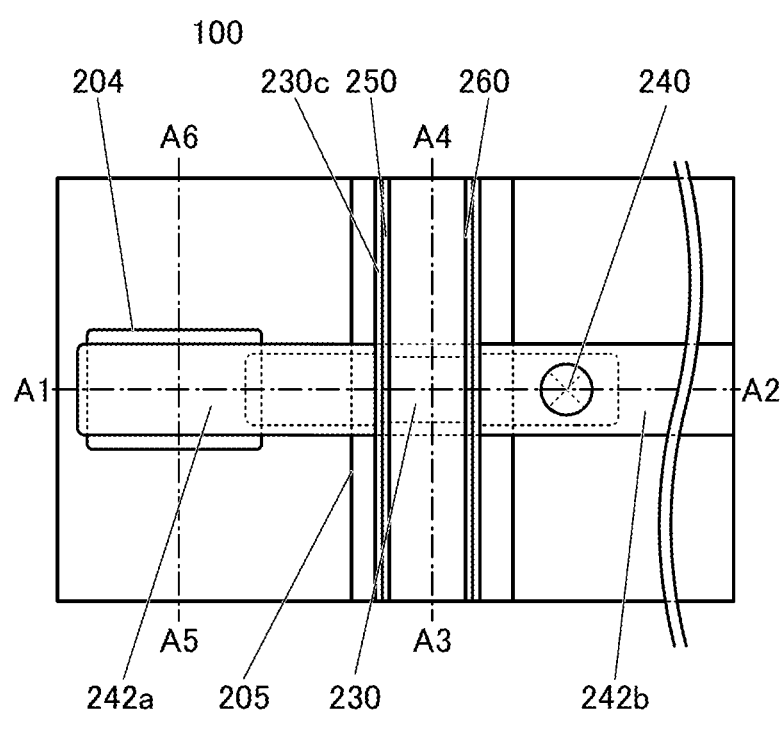
FIG. 13A is a top view illustrating a manufacturing method of a semiconductor device.
Figure 13C:
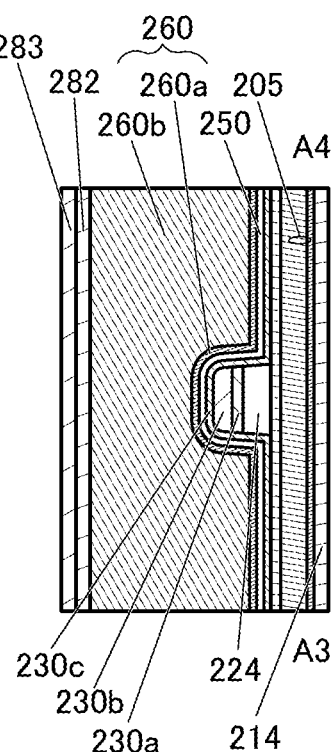
FIGS. 13B to 13D are cross-sectional views illustrating a manufacturing method of a semiconductor device.
Figure 13B:
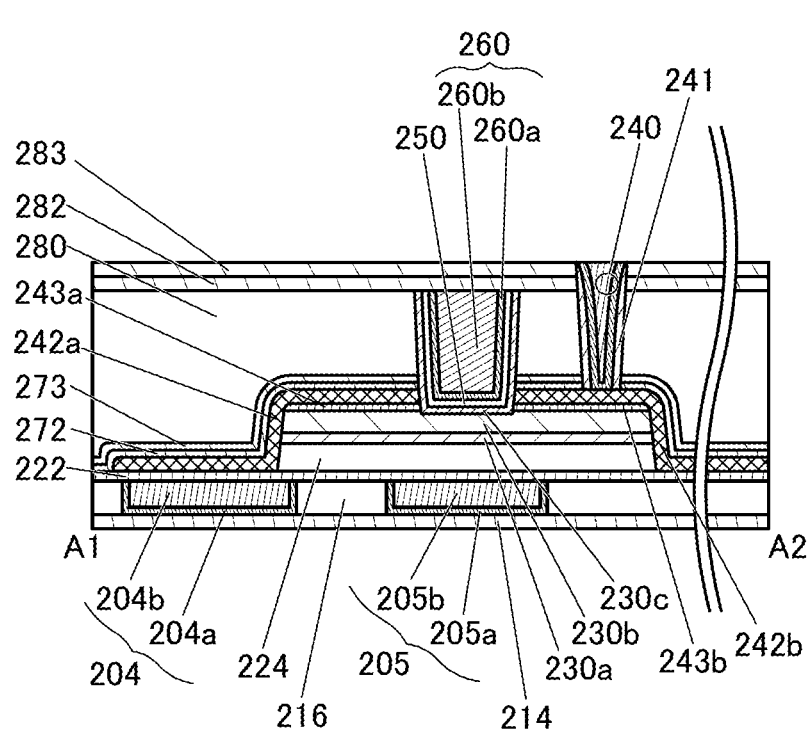
Figure 13D:
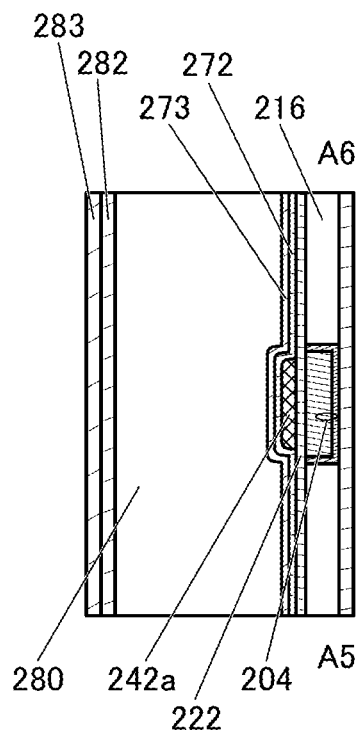
Figure 14A:
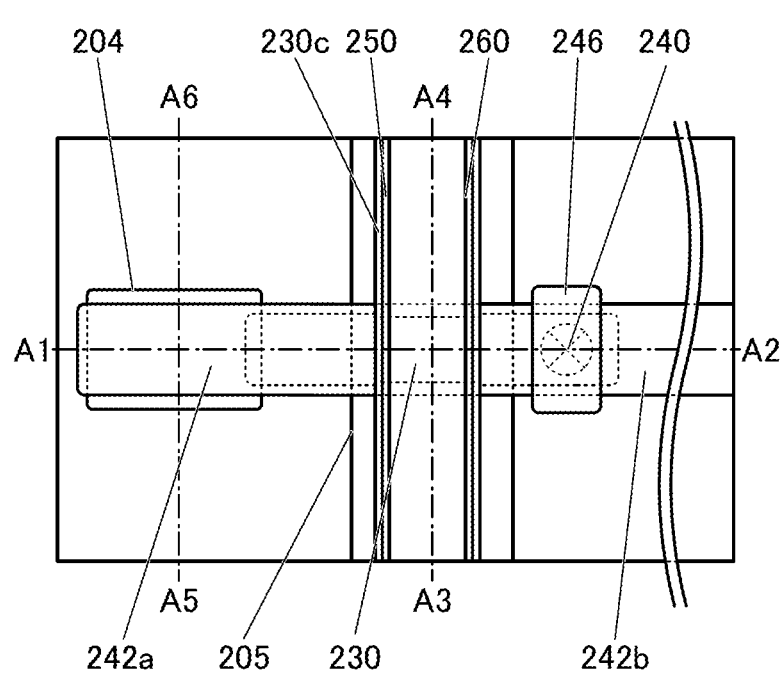
FIG. 14A is a top view illustrating a manufacturing method of a semiconductor device.
Figure 14C:
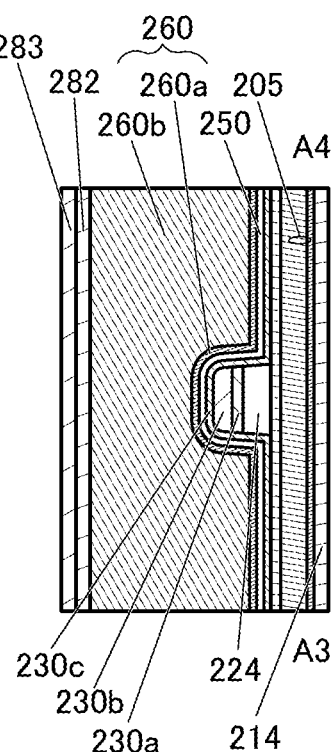
FIGS. 14B to 14D are cross-sectional views illustrating a manufacturing method of a semiconductor device.
Figure 14B:
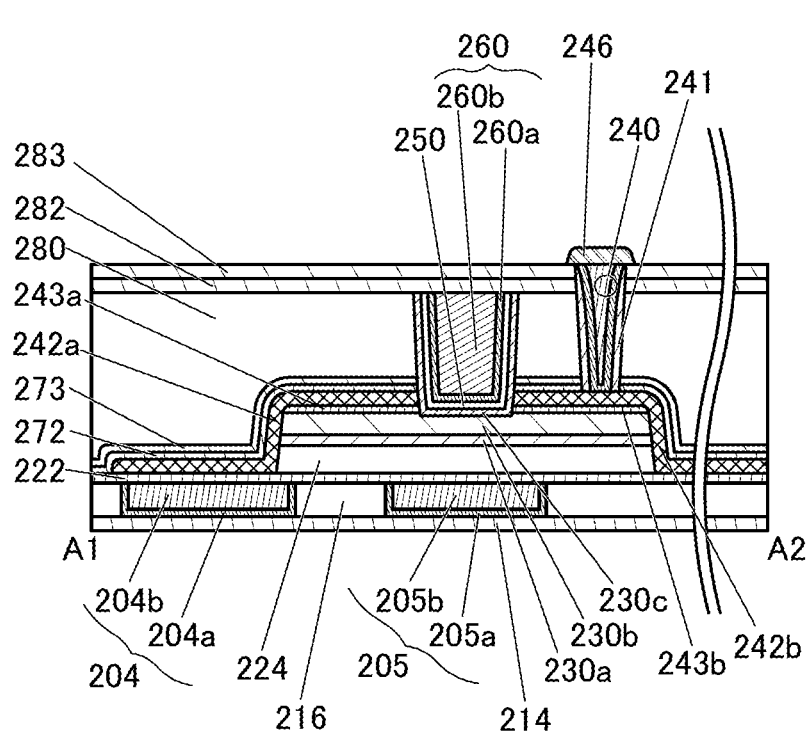
Figure 14D:
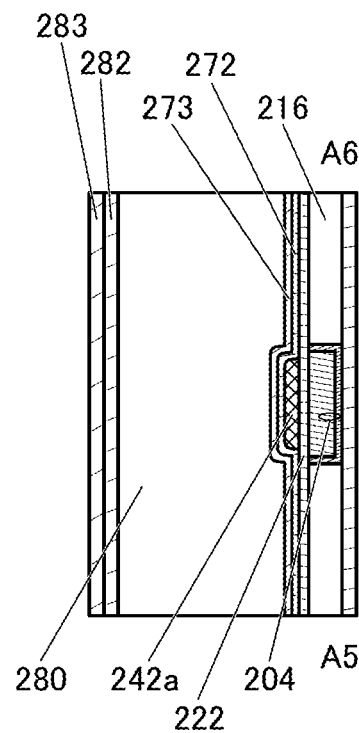

FIG. 3A is a top view of the semiconductor device including the transistor 200 and the capacitor 100. FIGS. 3B to 3D are cross-sectional views of the semiconductor device. FIG. 3B is a cross-sectional view taken along the dashed-dotted line A1-A2 in FIG. 3A, which corresponds to a cross-sectional view in the channel length direction of the transistor 200 and the capacitor 100. FIG. 3C is a cross-sectional view taken along the dashed-dotted line A3-A4 in FIG. 3A, which corresponds to a cross-sectional view in the channel width direction of the transistor 200. FIG. 3D is a cross-sectional view taken along the dashed-dotted line A5-A6 in FIG. 3A, which corresponds to a cross-sectional view in the channel width direction of a source region or a drain region of the transistor 200. Note that for simplification, some components are not illustrated in the top view in FIG. 2A.

FIG. 3A shows the following features. The conductor 205 is used as the second gate of the transistor 200 and one electrode of the capacitor 100. The conductor 242b, which functions as the source electrode or the drain electrode of the transistor 200, is connected to the conductor 204 through an opening 238. There are no conductor 240, which functions as the plug connected to the source electrode or the drain electrode of the transistor 200, no conductor 246, which is connected to the conductor 240, and no insulator 241, which is in contact with a side surface of the insulator 240. Accordingly, this modification example is different from the structure described in <Structure example of semiconductor device> with reference to FIGS. 1A to 1D. The following description explains the different points of the structure.

FIG. 3B shows that the capacitor 100 includes the conductor 205 over the insulator 214, the insulator 222 over the conductor 205, and the conductor 242a over the insulator 222.

The conductor 205 functions as one electrode of the capacitor 100 and the conductor 242a functions as the other electrode of the capacitor 100. The insulator 222 functions as a dielectric of the capacitor 100.

FIG. 3D shows that the conductor 204 over the insulator 214 is connected to the conductor 242b through the opening 238. The conductor 204 is formed in the same layer as the conductor 205. FIG. 3A shows that the conductor 204 is provided in parallel to the conductor 205 in the A1-A2 direction.

Such a structure eliminates the process of forming the conductor 240, which functions as a plug, the conductor 246, and the insulator 241, and simplifies the fabrication of the semiconductor device including the transistor 200 and the capacitor 100, leading to reduction in manufacturing costs and improvement in yield.

The other structures and the effects can refer to the semiconductor device shown in FIGS. 1A to 1D.

<Modification Example 3 of Semiconductor Device>

An example of a semiconductor device of one embodiment of the present invention including a transistor 200a, a transistor 200b, a capacitor 100a, and a capacitor 100b is described below.

Figure 16:
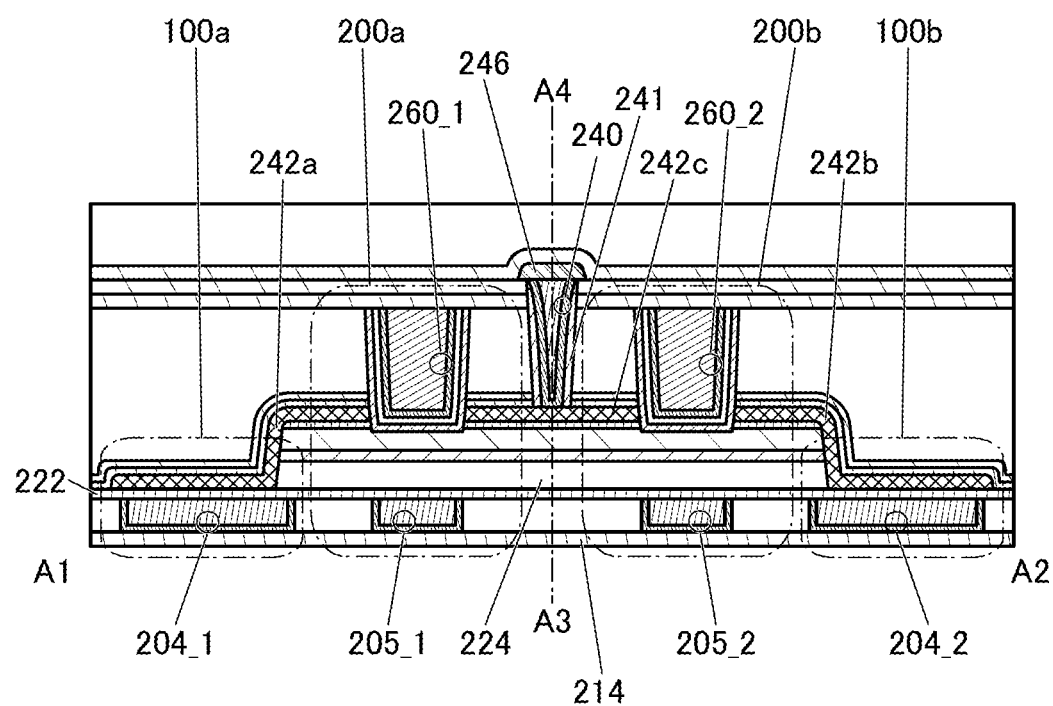
FIG. 16 is a cross-sectional view of a structure example of a semiconductor device.

FIG. 16 is a cross-sectional view in the channel length direction of the semiconductor device including the transistors 200a and 200b, the capacitors 100a and 100b. FIG. 16 shows a line-symmetric semiconductor device with respect to the dashed-dotted line A3-A4. A conductor 242c functions as a source electrode or a drain electrode of the transistor 200a and a source electrode or a drain electrode of the transistor 200b. The conductor 240, which functions as a plug, connects the conductor 246, which functions as a wiring, and the transistors 200a and 200b. The structure of the connection of the two transistors, the two capacitors, the wiring, and the plug allows the semiconductor device which can be miniaturized or highly integrated.

The structure example of the semiconductor device shown in FIGS. 1A to 1D can be referred to for the components and the effects of the transistors 200a and 200b and the capacitors 100a and 100b.

<Modification Example 4 of Semiconductor Device>

Figure 17:
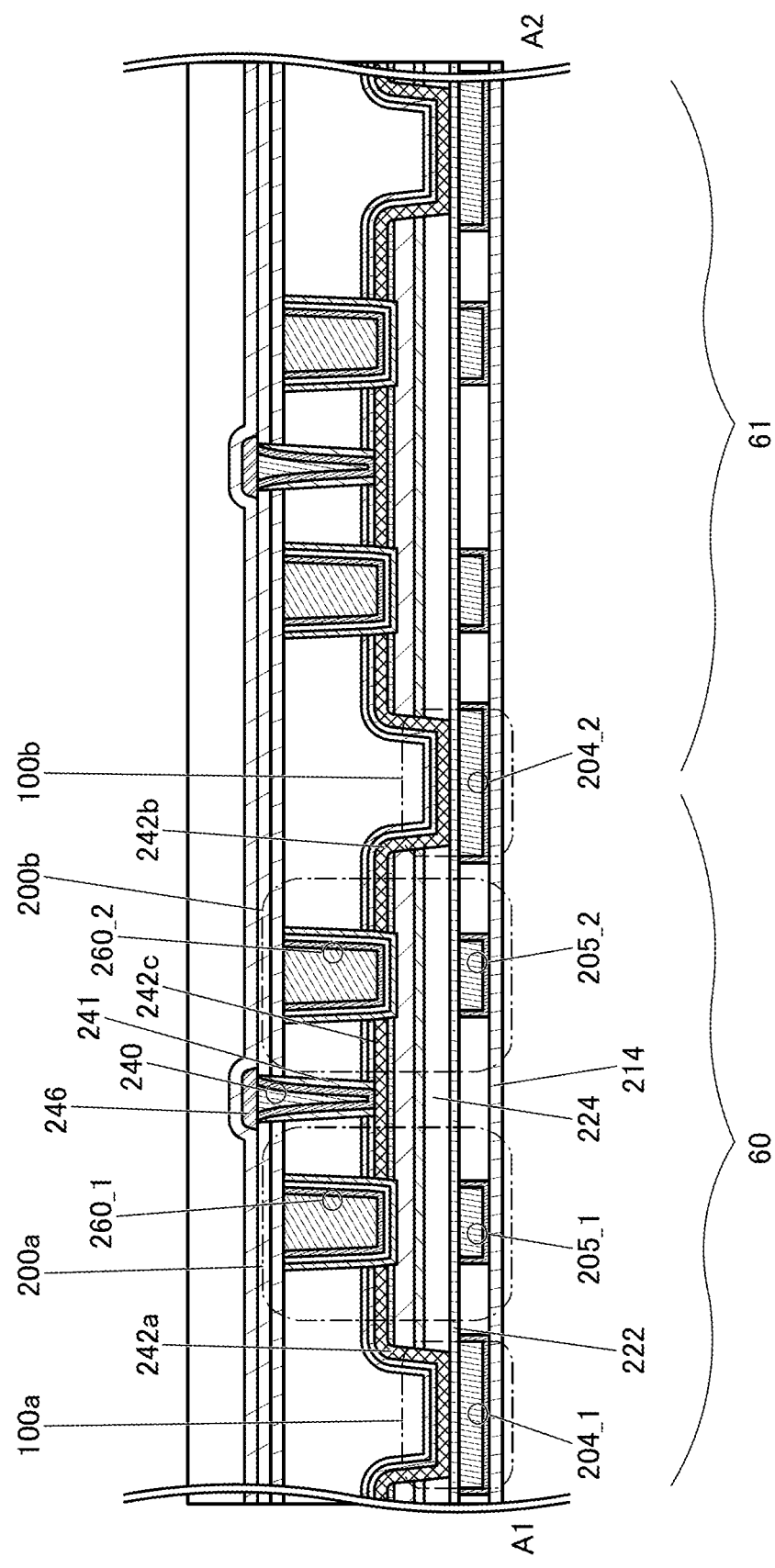
FIG. 17 is a cross-sectional view of a structure example of a semiconductor device.

In the above description, the semiconductor device including the transistors 200a and 200b and the capacitors 100a and 100b is given as a structure example; however, the semiconductor device according to this embodiment is not limited to this example. For example, semiconductor devices having the same structure may share a capacitor portion as shown in FIG. 17. Note that in this specification, a semiconductor device including the transistors 200a and 200b and the capacitors 100a and 100b is referred to as a cell. The above descriptions for the transistors 200a and 200b and the capacitors 100a and 100b can be referred to for the structures of the transistors 200a and 200b and the capacitors 100a and 100b in this modification example.

FIG. 17 is a cross-sectional view of a cell 60 and a cell 61 that are connected through a capacitor portion. The cell 60 includes the transistors 200a and 200b and the capacitors 100a and 100b, and the cell 61 has a similar structure to that of the cell 60.

FIG. 17 shows that a conductor 204_2, which functions as one electrode of the capacitor 100b of the cell 60, and the conductor 242b, which functions as the other electrode of the capacitor 100b of the cell 60, function as one electrode and the other electrode of a capacitor of the cell 61, which has a similar structure as that of the cell 60. Although not illustrated, a conductor 204_1, which functions as one electrode of the capacitor 100a of the cell 60, and the conductor 242a, which functions as the other electrode of the capacitor 100a of the cell 60, function as one electrode and the other electrode of a capacitor of a semiconductor device next to the cell 60 in the A1 direction or on the left in FIG. 17. The same applies to a capacitor of a semiconductor device next to the cell 61 in the A2 direction or on the right in FIG. 17. Thus, a cell array 600 can be formed. With this structure of the cell array 600, the space between the adjacent cells can be reduced; thus, the projected area of the cell array 600 can be reduced and high integration can be achieved. The cell arrays 600 shown in FIG. 17 are arranged in line and cross each other, which forms a matrix of cell arrays.

By forming the transistors 200a and 200b and the capacitors 100a and 100b in a structure in this embodiment, the structure can reduce the area of the cell and the semiconductor device including the cell array can be miniaturized or highly integrated.

Figure 18:
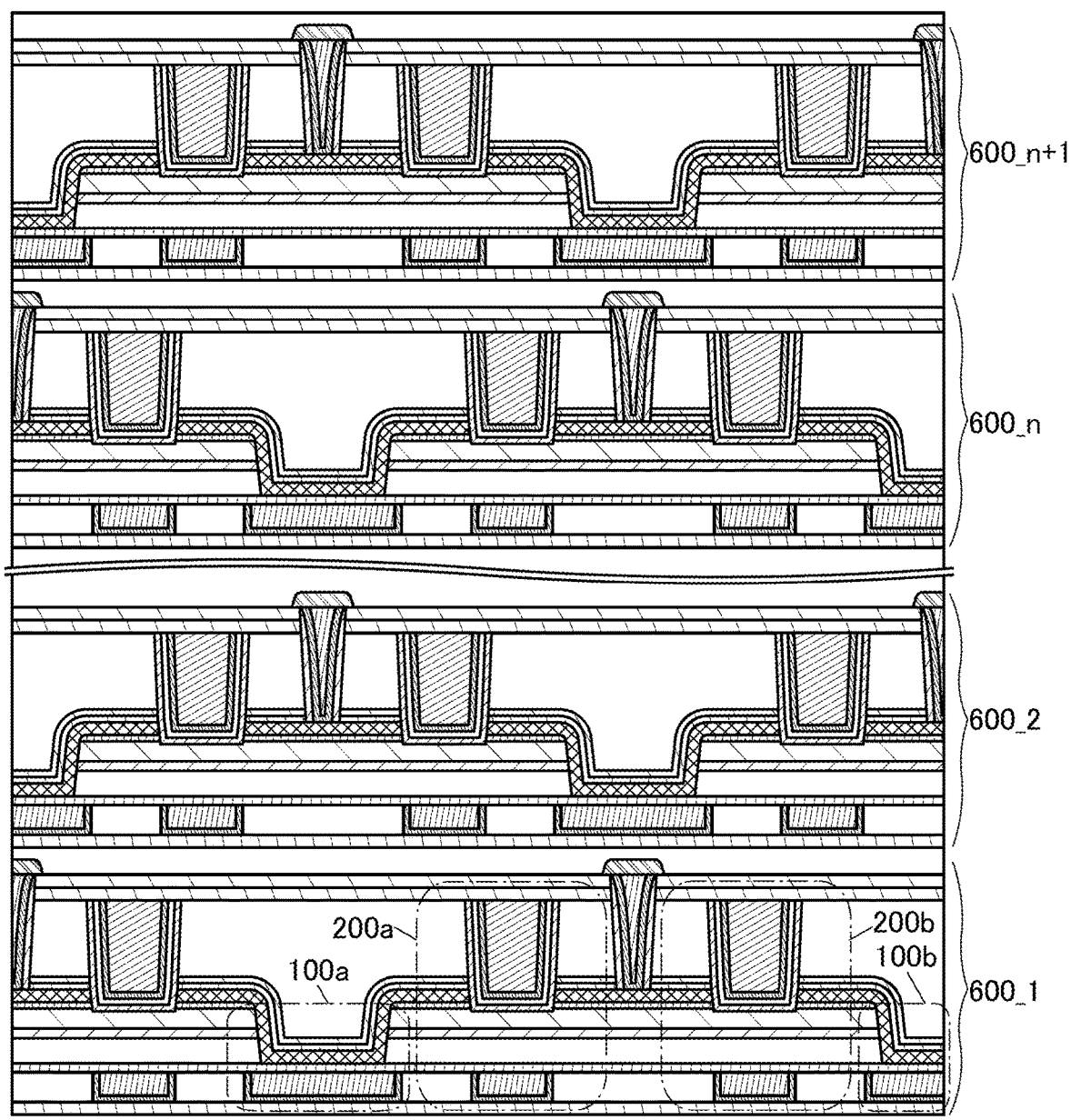
FIG. 18 is a cross-sectional view of a structure example of a semiconductor device.

Stacked cell arrays may be used instead of the single-layer cell array. FIG. 18 shows a cross-sectional view of a structure in which n+1 cell arrays 600 are stacked. The stacked cell array structure in FIG. 18 allows cells to be integrated without increasing the occupation area of the cell arrays. That is, a 3D cell array can be structured.

<Modification Example 5 of Semiconductor Device>

Figure 19:
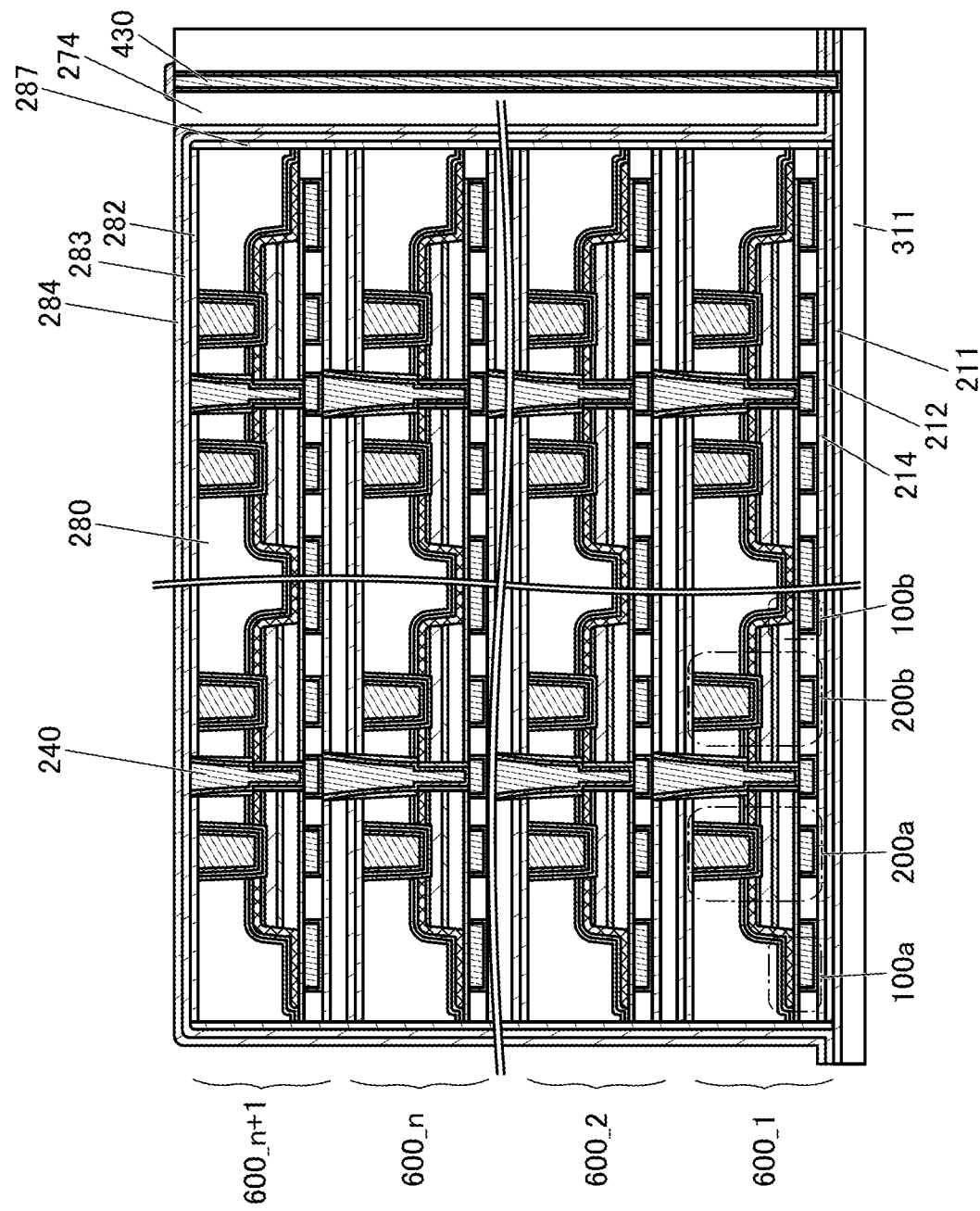
FIG. 19 is a cross-sectional view of a structure example of a memory device.

An example of a semiconductor device including the 3D cell array shown in FIG. 18 will be described below. FIG. 19 is a cross-sectional view of the semiconductor device. The semiconductor device includes a substrate 311, an insulator 211 over the substrate 311, an insulator 212 over the insulator 211, and an insulator 214 over the insulator 212, and a 3D cell array in which n+1 cell arrays 600 are stacked is positioned over the insulator 214. The cell arrays 600 are electrically connected to each other through the conductors 240 functioning as plugs. The 3D cell array is sealed by the insulator 211, the insulator 212, the insulator 214, an insulator 287, the insulator 282, the insulator 283, and the insulator 284. Such a structure is referred to as a sealing structure below for convenience. The insulator 274 is provided near the insulator 284. A conductor 430 is provided in the insulators 274, 283, 284, and 211, and is electrically connected to the substrate 311.

The insulator 280 is provided in the sealing structure. The insulator 280 has a function of releasing oxygen by heating. The insulator 280 includes an excess oxygen region.

The insulators 211, 283, and 284 are suitably formed using a material having a high blocking property against hydrogen. The insulators 214, 282, and 287 are suitably formed using a material having a function of capturing or fixing hydrogen.

Examples of the material having a high blocking property against hydrogen include silicon nitride and silicon nitride oxide. Examples of the material having a function of capturing or fixing hydrogen include aluminum oxide, hafnium oxide, and an oxide containing aluminum and hafnium (hafnium aluminate).

A barrier property in this specification means a function of inhibiting diffusion of a particular substance (also referred to as a function of less easily transmitting the substance). Alternatively, a barrier property in this specification means a function of capturing or fixing (also referred to as gettering) a particular substance.

Materials for the insulators 211, 212, 214, 287, 282, 283, and 284 may have an amorphous or crystal structure, although the crystallinity of the materials is not limited thereto. For example, an amorphous aluminum oxide film is suitably used for the material having a function of capturing or fixing hydrogen. Amorphous aluminum oxide may capture or fix hydrogen more than aluminum oxide with high crystallinity.

The following model can be given for the reaction of excess oxygen in the insulator 280 with hydrogen from an oxide semiconductor in contact with the insulator 280.

The insulator 280, which is in contact with the oxide semiconductor, transmits hydrogen in the oxide semiconductor to another structure body. The hydrogen in the oxide semiconductor react with the excess oxygen in the insulator 280, which yields the OH bonding to diffuse the insulator 280. The hydrogen atom having the OH bonding reacts with the oxygen atom bonded to an atom (such as a metal atom) in the insulator 282 in reaching a material which has a function of capturing or fixing hydrogen (typically the insulator 282), and is trapped or fixed in the insulator 282. This enables the insulator 282 to capture the hydrogen atom or to fix it inside the insulator 282. The oxygen atom which had the OH bonding of the excess oxygen may remain as an excess oxygen in the insulator 280. The excess oxygen in the insulator 280 presumably transmits the hydrogen.

A manufacturing process of the semiconductor device is one of important factors for the model.

For example, the insulator 280 containing excess oxygen is formed over the oxide semiconductor, and then the insulator 282 is formed. Next, heat treatment is preferably performed. The heat treatment is performed at 350° C. or higher, preferably 400° C. or higher under an atmosphere containing oxygen, an atmosphere containing nitrogen, or a mixed atmosphere of oxygen and nitrogen. The heat treatment is performed for one hour or more, preferably four hours or more, further preferably eight hours or more.

The heat treatment enables diffusion of hydrogen from the oxide semiconductor to the outside through the insulators 280, 282, and 287. This reduces the absolute amount of hydrogen in and near the oxide semiconductor.

The insulator 283 and the insulator 284 are formed after the heat treatment. The insulators 283 and 284 have a high blocking property against hydrogen. Thus, the insulators 283 and 284 inhibits enter of outside hydrogen or the hydrogen which has been diffused to the outside into the inside, specifically, the oxide semiconductor or insulator 280 side.

The heat treatment is performed after the insulator 282 is formed in the above example; however, one embodiment of the present invention is not limited thereto. The heat treatment can be performed after each of the cell arrays 600_1 to the cell array 600_n+1 is formed, for example. Hydrogen diffuses in the upward or lateral direction.

The above manufacturing process yields the sealing structure by bonding the insulators 211 and 283.

The above-described structure and manufacturing process enable a semiconductor device using an oxide semiconductor with reduced hydrogen concentration. Thus, a highly reliable semiconductor device can be provided. One embodiment of the present invention can provide a semiconductor device with favorable electrical characteristics.

The structures, the methods, and the like described in this embodiment can be combined as appropriate with any of the structures, the methods, and the like described in the other embodiments.

Embodiment 2

Figure 20:
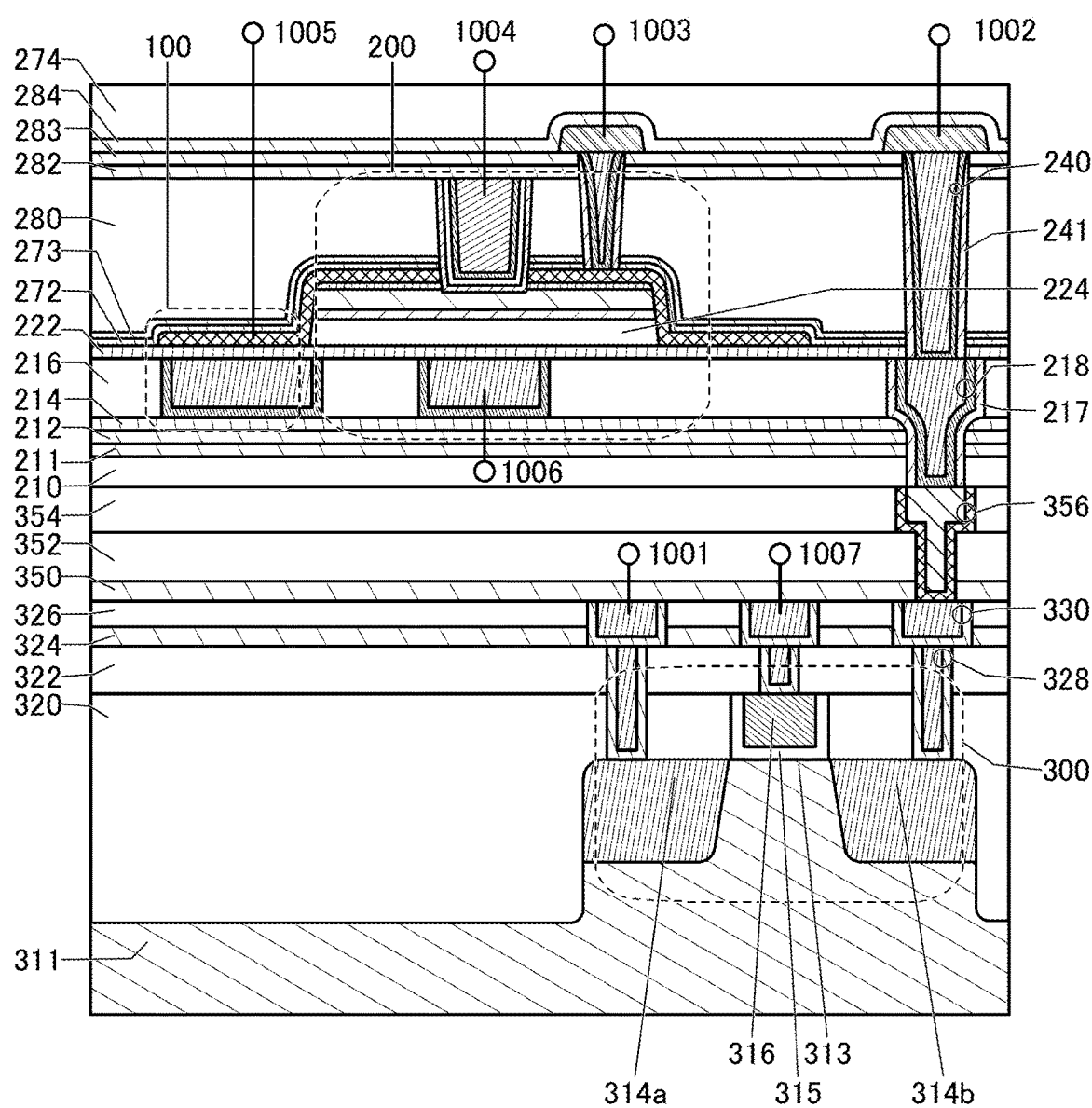
FIG. 20 is a cross-sectional view of a structure example of a memory device.

In this embodiment, one embodiment of a semiconductor device will be described with reference to FIG. 20.
[Memory Device 1]
A memory device shown in FIG. 20 includes the transistor 200, the capacitor 100, and a transistor 300. FIG. 20 is a cross-sectional view of the transistors 200 and 300 in the channel length direction.

The transistor 200 is a transistor whose channel is formed in a semiconductor layer containing an oxide semiconductor. The transistor 200 has a low off-state current. Thus, a memory device including the transistor 200 can retain stored data for a long time. This means that the memory device needs no refresh operation or an extremely small number of refresh operations, which sufficiently reduces the power consumption of the memory device.

In the memory device shown in FIG. 20, a wiring 1001 is electrically connected to one of the source and the drain of the transistor 300. A wiring 1002 is electrically connected to the other of the source and the drain of the transistor 300. A wiring 1007 is electrically connected with the gate of the transistor 300. A wiring 1003 is electrically connected to one of the source and the drain of the transistor 200. A wiring 1004 is electrically connected to the first gate of the transistor 200. A wiring 1006 is electrically connected to the second gate of the transistor 200. A wiring 1005 is electrically connected to the other electrode of the capacitor 100.

The semiconductor device shown in FIG. 20 can be used as a memory device having a transistor whose channel is formed in a semiconductor layer including an oxide semiconductor. Since the potential of one electrode of the capacitor 100 can be retained owing to the low off-state current of the transistor 200, data can be written, retained, and read.
<Structure of Memory Device 1>
The semiconductor device of one embodiment of the present invention includes the transistor 300, the transistor 200, and the capacitor 100 as shown in FIG. 20. The transistor 200 is provided over the transistor 300, and the transistor 200 and the capacitor 100 are provided in the same layer. Note that the above embodiment can be referred to for the structures of the transistor 200 and the capacitor 100.

The transistor 300 is provided in and on the substrate 311 and includes a conductor 316, an insulator 315, a semiconductor region 313 that is part of the substrate 311, and a low-resistance region 314a and a low-resistance region 314b functioning as a source region and a drain region.

The transistor 300 can be a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, or single crystal silicon. Alternatively, a material including germanium (Ge), silicon germanium (SiGe), gallium arsenide (GaAs), gallium aluminum arsenide (GaAlAs), or the like can be used. Alternatively, silicon whose effective mass is adjusted by applying stress to crystal lattices and thereby changing the lattice spacing can be used. Alternatively, a high electron mobility transistor (HEMT) may be employed as the transistor 300 with use of GaAs and GaAlAs or the like.

The low-resistance regions 314a and 314b contain an element that imparts n-type conductivity (e.g., arsenic or phosphorus) or an element that imparts p-type conductivity (e.g., boron), in addition to a semiconductor material used for the semiconductor region 313.

The conductor 316 functioning as a gate electrode can be formed using a semiconductor material such as silicon containing an element that imparts n-type conductivity (e.g., arsenic or phosphorus) or an element that imparts p-type conductivity (e.g., boron), or a conductive material such as a metal material, an alloy material, or a metal oxide material.

Note that the work function depends on a material used for the conductor; therefore, changing the material for the conductor can adjust the threshold voltage of the transistor. Specifically, titanium nitride, tantalum nitride, or the like is preferably used for the conductor. Furthermore, in order to ensure the conductivity and embeddability of the conductor, stacked layers of metal materials such as tungsten and aluminum are preferably used for the conductor. In particular, tungsten is preferable in terms of heat resistance.

The transistor 300 shown in FIG. 20 is only an example. The transistor can have a different structure and an appropriate transistor for a circuit configuration or a driving method can be used.

An insulator 320, an insulator 322, an insulator 324, and an insulator 326 are stacked in this order to cover the transistor 300.

For the insulators 320, 322, 324, and 326, for example, silicon oxide, silicon oxynitride, silicon nitride oxide, silicon nitride, aluminum oxide, aluminum oxynitride, aluminum nitride oxide, or aluminum nitride can be used.

The insulator 322 may function as a planarization film for eliminating a level difference caused by the transistor 300 or the like underlying the insulator 322. For example, a chemical mechanical polishing (CMP) method or the like may be employed to smooth the top surface of the insulator 322.

The insulator 324 is preferably formed using a film having a barrier property that prevents hydrogen or impurities from the substrate 311, the transistor 300, or the like from diffusing to a region where the transistor 200 is provided.

For the film having a barrier property against hydrogen, silicon nitride deposited by a CVD method can be used, for example. The hydrogen diffusion into a semiconductor element including an oxide semiconductor, such as the transistor 200, impairs the characteristics of the semiconductor element in some cases. Therefore, a film that inhibits hydrogen diffusion is preferably provided between the transistor 200 and the transistor 300. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 is less than or equal to $10 \times 10^{15}$ atoms/cm$^2$, preferably less than or equal to $5 \times 10^{15}$ atoms/cm$^2$ in the following conditions, for example: the amount is measured by TDS analysis, the amount of released hydrogen is converted into hydrogen atoms per unit area of the insulator 324, and a film-surface temperature range is 50° C. to 500° C.

The dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. The use of a material having a low dielectric constant for the interlayer film can reduce the parasitic capacitance between wirings.

A conductor 328, a conductor 330, and the like that are electrically connected to the transistor 300 are embedded in the insulators 320, 322, 324, and 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases, and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a layered structure. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. A low-resistance conductive material can reduce wiring resistance.

A wiring layer may be provided over the insulator 326 and the conductor 330. For example, an insulator 350, an insulator 352, and an insulator 354 are stacked in this order in FIG. 20. A conductor 356 is formed in the insulators 350, 352, and 354. The conductor 356 functions as a plug or a wiring. Note that the conductor 356 can be formed using a material similar to that for the conductor 328 and the conductor 330.

For example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed in an opening of the insulator 350 having a barrier property against hydrogen. The structure can separate the transistor 300 and the transistor 200 by a barrier layer and inhibit diffusion of hydrogen from the transistor 300 to the transistor 200.

Note that as the conductor having a barrier property against hydrogen, tantalum nitride can be used, for example. A stacked structure of tantalum nitride and tungsten having high conductivity can inhibit hydrogen diffusion from the transistor 300 while the conductivity of a wiring is ensured. In this case, a tantalum nitride layer having a barrier property against hydrogen is preferably in contact with the insulator 350 having a barrier property against hydrogen.

In the above, a wiring layer including the conductor 356 is described; however, the memory device of this embodiment is not limited thereto. The number of wiring layers similar to the wiring layer including the conductor 356 may be three or less, or five or more.

An insulator 210, the insulator 212, and the insulator 214 are stacked in this order over the insulator 354. At least one of the insulators 210, 212, and 214 includes a material having a barrier property against oxygen or hydrogen.

The insulator 210 can be formed using a material similar to that for the insulator 320, for example. An interlayer film with a relatively low dielectric constant can reduce the parasitic capacitance between wirings. A silicon oxide film or a silicon oxynitride film can be used as the insulator 212, for example.

Each of the insulators 211 and 212 is preferably formed using a film having a barrier property, and the film prevents diffusion of hydrogen or impurities from the substrate 311, a region where the transistor 300 is provided, or the like to a region where the transistor 200 is provided, for example. Therefore, each of the insulators 210 and 212 can be formed using a material similar to that for the insulator 324.

For a film having a barrier property against hydrogen, silicon nitride formed by a CVD method can be used, for example. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which a small amount of hydrogen is released.

As the film having a barrier property against hydrogen, for example, a metal oxide such as aluminum oxide, hafnium oxide, or tantalum oxide is preferably used for the insulator 214.

In particular, aluminum oxide has an excellent blocking effect that prevents transmission of oxygen and impurities such as hydrogen and moisture, which cause a change in electrical characteristics of the transistor. Accordingly, aluminum oxide can prevent the entry of impurities such as hydrogen and moisture into the transistor 200 during and after a manufacturing process of the transistor. In addition, aluminum oxide can inhibit release of oxygen from the oxide contained in the transistor 200. Therefore, aluminum oxide is suitably used for a protective film of the transistor 200.

A conductor 218, a conductor included in the transistor 200, a conductor included in the capacitor 100, and the like are provided in the insulators 210, 211, 212, 214, and 216. The conductor 218 functions as a plug or a wiring electrically connected to the transistor 200 or the transistor 300. The conductor 218 can be formed using a material similar to that for the conductors 328 and 330.

In particular, part of the conductor 218 that is in contact with the insulators 210 and 214 is preferably a conductor having a barrier property against oxygen, hydrogen, and water. The structure can separate the transistors 300 and 200 by a layer having a barrier property against oxygen, hydrogen, and water. As a result, the diffusion of hydrogen from the transistor 300 to the transistor 200 can be inhibited.

The transistor 200 and the capacitor 100 are provided over the insulator 214. Note that the structures of the transistor 200 and the capacitor 100 described in the above embodiment can be used as those of the transistor 200 and the capacitor 100 described here. Note that the transistor 200 and the capacitor 100 in FIG. 20 are examples and are not limited to the structures; an appropriate transistor and a capacitor may be used in accordance with a circuit structure or a driving method.

Furthermore, the conductor 240 is provided in contact with the conductor 218 so that a conductor which is connected to the transistor 300 is connected to a conductor over the transistor 200. Although the wiring 1002 is extended above the transistor 200 in FIG. 20, one embodiment of the present invention is not limited thereto. The wiring 1001, the wiring 1007, or the like may be extended above the transistor 200.

The above is the description of the structure example. The structure can reduce variation in electrical characteristics, and improve the reliability of a semiconductor device including a transistor using an oxide semiconductor.

The structures, the methods, and the like described in this embodiment can be combined as appropriate with any of the structures, the methods, and the like described in the other embodiments.

Embodiment 3

In this embodiment, a memory device of one embodiment of the present invention including a transistor in which an oxide is used for a semiconductor (hereinafter referred to as an OS transistor in some cases), and a capacitor (hereinafter, such a memory device is also referred to as an OS memory device in some cases), is described with reference to FIGS. 22A and 22B, and 23A to 23C. The OS memory device includes at least a capacitor and an OS transistor that controls the charging and discharging of the capacitor. Since the OS transistor has an extremely low off-state current, the OS memory device has excellent retention characteristics and can function as a nonvolatile memory.

Figure 21:
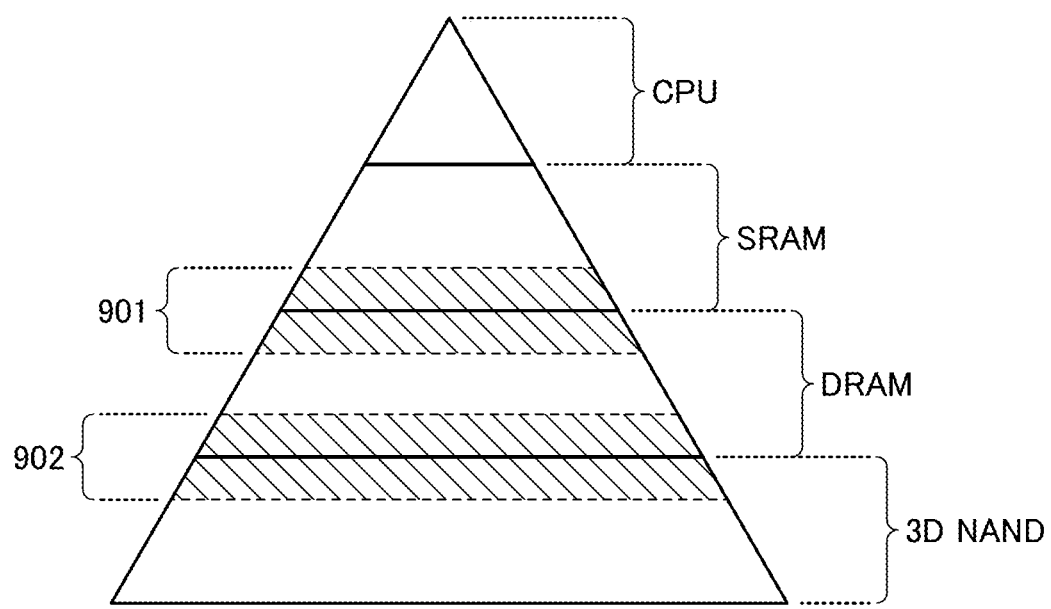
FIG. 21 is a diagram of the memory hierarchy.

In general, a variety of memory devices (memory) are used as semiconductor devices such as a computer in accordance with the intended use. FIG. 21 is a hierarchy diagram showing various memory devices with different levels. The memory devices at the upper levels of the diagram require high access speeds, and the memory devices at the lower levels require large memory capacity and high record density. In FIG. 21, sequentially from the top level, a memory combined as a register in an arithmetic processing device such as a CPU, a static random access memory (SRAM), a dynamic random access memory (DRAM), and a 3D NAND memory are shown.

The memory as the register of the arithmetic logic unit such as CPU is accessed by the arithmetic processing device frequently because an operation result is temporarily stored in it. Accordingly, rapid operation is more important than the capacity of the memory. The register also has a function of holding setting data or the like of the arithmetic processing device.

An SRAM is used for a cache, for example. The cache has a function of holding a copy of part of data held in a main memory. Copying data which is frequently used and holding the copy of the data in the cache facilitates rapid data access.

A DRAM is used for a main memory, for example. The main memory has a function of holding a program or data which are read from the storage space. The record density of a DRAM is approximately 0.1 to 0.3 Gbit/mm$^2$.

A 3D NAND memory is used for a storage space, for example. A storage space has a function of holding data which need to be stored for a long time and programs used for an arithmetic processing device, for example. Therefore, a storage space needs to have high memory capacity and a high recording density rather than operation speed. The memory density for a storage space is approximately 0.6 to 6.0 Gbit/mm$^2$.

The memory device of one embodiment of the present invention operates fast and can hold data for a long time. The memory device of one embodiment of the present invention can be favorably used as a memory device in a boundary region 901 including both the level in which cache is placed and the level in which main memory is placed. The memory device of one embodiment of the present invention can be favorably used as a memory device in a boundary region 902 including both the level in which main memory is placed and the level in which storage space is placed.

<Structure Example of Memory Device>

Figure 22A:
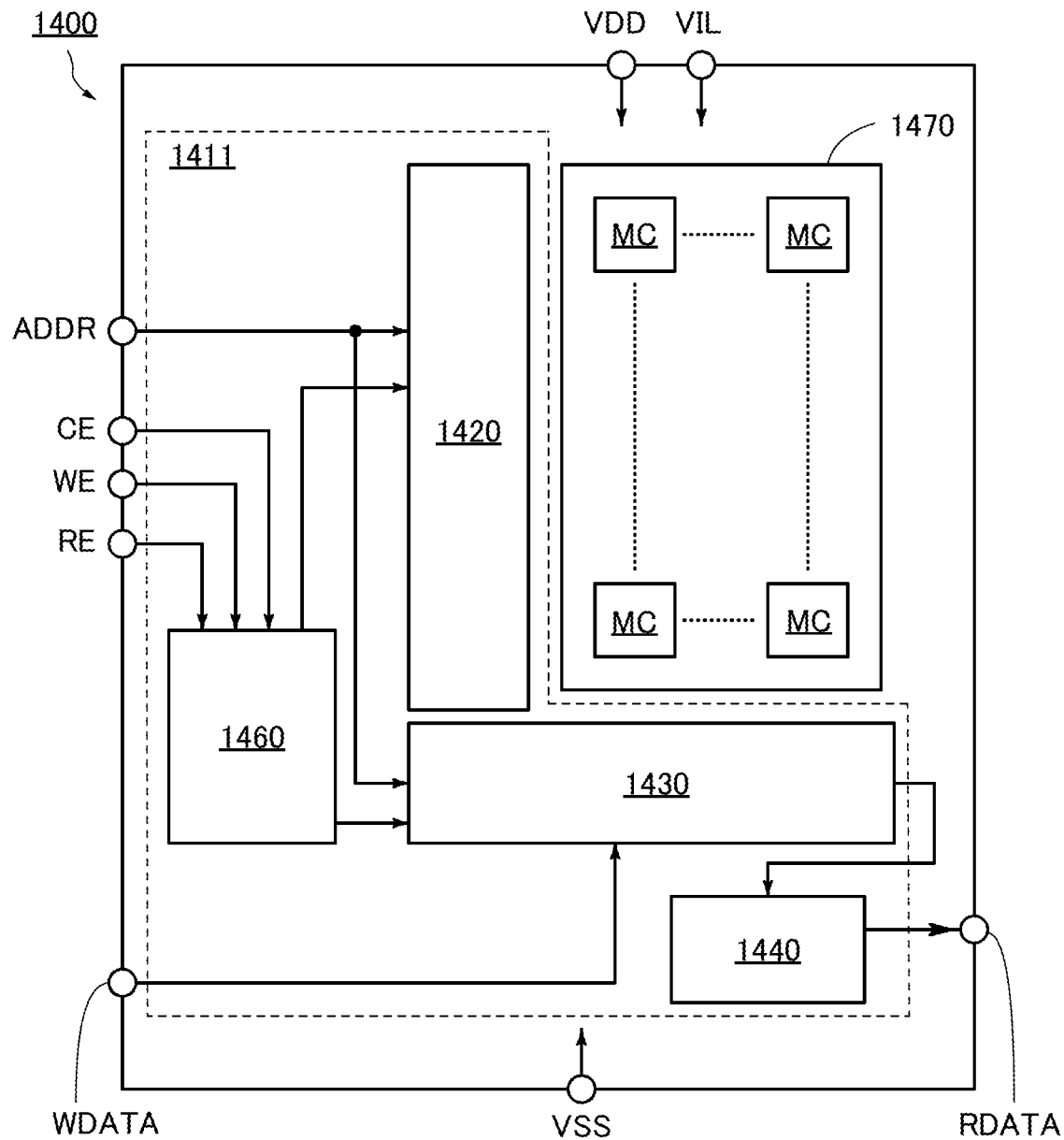
FIG. 22A is a block diagram of a structure example of a memory device.

FIG. 22A shows a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. The wirings mentioned above are connected to memory cells included in the memory cell array 1470, which will be described later in detail. The amplified data signal is output as a data signal RDATA to the outside of the memory device 1400 through the output circuit 1440. The row circuit 1420 includes a row decoder and a word line driver circuit, for example, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the signals (CE, WE, and RE) input from the outside, and generates control signals for the row decoder and the column decoder. The signal CE is a chip enable signal, the signal WE is a write enable signal, and the signal RE is a read enable signal. Signals processed by the control logic circuit 1460 are not limited thereto and other control signals may be input as necessary.

The memory cell array 1470 includes a plurality of memory cells MC arranged in a matrix and a plurality of wirings. The number of wirings that connect the memory cell array 1470 and the row circuit 1420 depends on the configuration of the memory cell MC, the number of memory cells MC in one column, and the like. The number of wirings that connect the memory cell array 1470 and the column circuit 1430 depends on the configuration of the memory cell MC, the number of memory cells MC in one row, and the like.

Figure 22B:
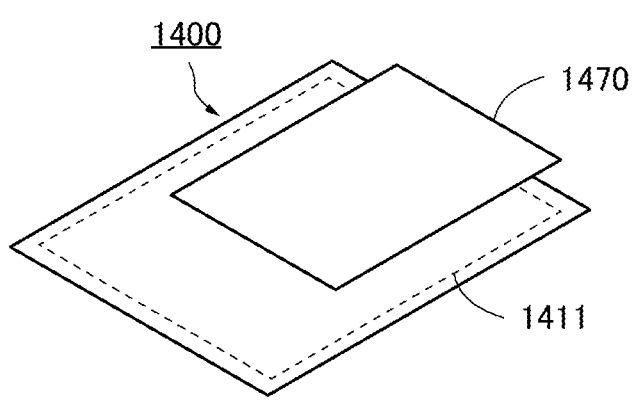
FIG. 22B is a perspective view of a structure example of a memory device.

FIG. 22A shows an example in which the peripheral circuit 1411 and the memory cell array 1470 are formed on the same plane; however, this embodiment is not limited thereto. For example, as illustrated in FIG. 22B, the memory cell array 1470 may be provided to partly overlap the peripheral circuit 1411. For example, the sense amplifier may be provided below the memory cell array 1470 so that they overlap each other.

Figure 23A:
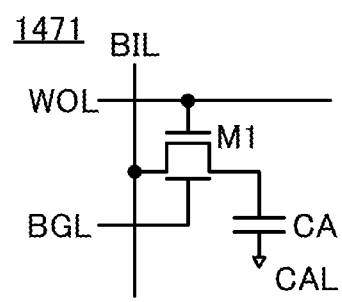
FIGS. 23A to 23C are circuit diagrams of structure examples of a memory device.
Figure 23B:
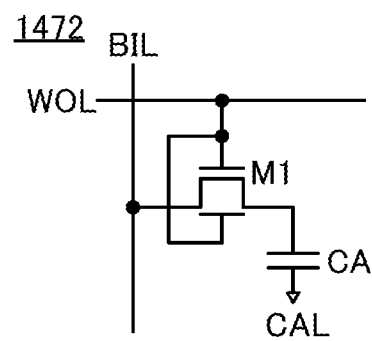
Figure 23C:
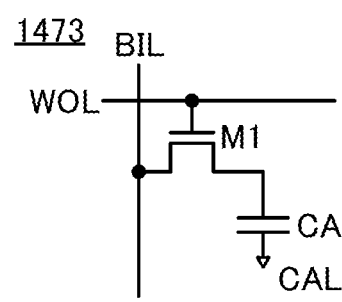

FIGS. 23A to 23C illustrate configuration examples of memory cells that can be used as the memory cell MC.

[DOSRAM]

FIGS. 23A to 23C illustrate a circuit configuration example of a memory cell of a DRAM. In this specification and the like, a DRAM using a memory cell including one OS transistor and one capacitor is sometimes referred to as a dynamic oxide semiconductor random access memory (DOSRAM). A memory cell 1471 shown in FIG. 23A includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. A low-level potential is preferably applied to the wiring CAL at the time of data writing and data reading. The wiring BGL functions as a wiring for applying a potential to the back gate of the transistor M1. The threshold voltage of the transistor M1 can be increased or decreased by supplying a given potential to the wiring BGL.

The memory cell MC is not limited to the memory cell 1471 and can have a different circuit configuration. For example, in the memory cell MC, the back gate of the transistor M1 may be connected to the wiring WOL instead of the wiring BGL as in a memory cell 1472 illustrated in FIG. 23B. As another example of the memory cell MC, the transistor M1 may be a single-gate transistor, that is, a transistor without a back gate as in a memory cell 1473 illustrated in FIG. 23C.

When the semiconductor device shown in the above embodiment is used in the memory cell 1471 and the like, the transistor 200 can be used as the transistor M1 and the capacitor 100 can be used as the capacitor CA. The use of an OS transistor for the transistor M1 enables extremely low leakage current of the transistor M1. This also enables written data to be retained for a long time, and thus decreases the frequency of refresh operation for the memory cell or eliminates refresh operation for the memory cell. In addition, since the OS transistor has an extremely low leakage current, multi-level data or analog data can be held in the memory cells 1471, 1472, and 1473.

In the DOSRAM, when the sense amplifier is provided below the memory cell array 1470 so that they overlap each other as described above, the bit line can be shortened. This reduces bit line capacity, which reduces the storage capacity of the memory cell.

The structures, the methods, and the like described in this embodiment can be combined as appropriate with any of the structures, the methods, and the like described in the other embodiments.

Embodiment 4

Figure 24A:
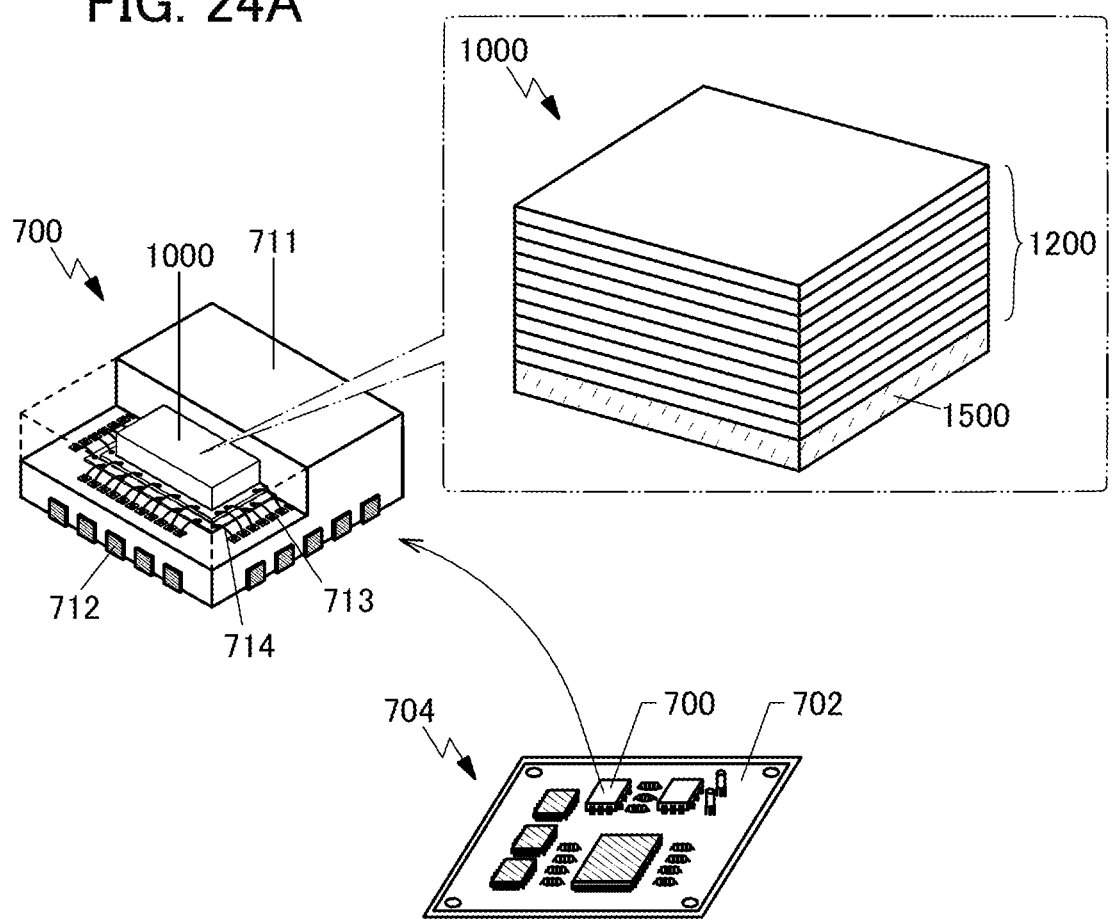
FIGS. 24A and 24B are diagrams of examples of electronic components.
Figure 24B:
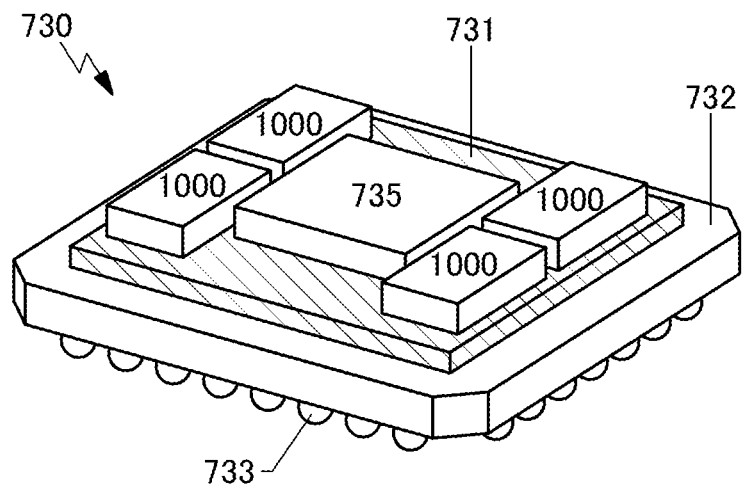

This embodiment shows examples of an electronic component and an electronic device that include the memory device of the above embodiments and the like.
<Electronic Component>
First, FIGS. 24A and 24B show examples of an electronic component including a memory device 1000.

FIG. 24A is a perspective view of an electronic component 700 and a substrate (circuit board 704) on which the electronic component 700 is mounted. The memory device 1000 includes a driver circuit layer 1500 and a memory layer 1200, which includes a plurality of memory cell arrays. The electronic component 700 in FIG. 24A includes a storage device 1000 in a mold 711. FIG. 24A omits part of the electronic component to show the inside of the electronic component 700. The electronic component 700 includes a land 712 outside the mold 711. The land 712 is electrically connected to an electrode pad 713, and the electrode pad 713 is electrically connected to the memory device 1000 via a wire 714. The electronic component 700 is mounted on a printed circuit board 702, for example. A plurality of such electronic components are combined and electrically connected to each other on the printed circuit board 702, which forms the circuit substrate 704.

FIG. 24B is a perspective view of an electronic component 730. The electronic component 730 is an example of a system in package (SiP) or a multi-chip module (MCM). In the electronic component 730, an interposer 731 is provided over a package substrate 732 (printed circuit board) and a semiconductor device 735 and a plurality of memory devices 100 are provided over the memory device 1000.

The electronic component 730 using the memory device 1000 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package substrate 732. Accordingly, the interposer is sometimes referred to as a redistribution substrate or an intermediate substrate. A through electrode may be provided in the interposer 731 to be used for electrically connecting the integrated circuit and the package substrate 732. In the case of using a silicon interposer, a through-silicon via (TSV) can also be used as the through electrode.

A silicon interposer is preferably used as the interposer 731. The silicon interposer can be manufactured at lower cost than an integrated circuit because the silicon interposer is not necessarily provided with an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon less likely occurs. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In this case, the heights of integrated circuits provided on the interposer 731 are preferably equal to each other. In the electronic component 730 of this embodiment, the heights of the memory device 1000 and the semiconductor device 735 are preferably equal to each other, for example.

An electrode 733 may be provided on the bottom portion of the package substrate 732 to mount the electronic component 730 on another substrate. FIG. 24B shows an example in which the electrode 733 is formed of a solder ball. Solder balls are provided in a matrix on the bottom portion of the package substrate 732, whereby a ball grid array (BGA) can be achieved. Alternatively, the electrode 733 may be formed of a conductive pin. When conductive pins are provided in a matrix on the bottom portion of the package substrate 732, a pin grid array (PGA) can be achieved.

The electronic component 730 can be mounted on another substrate in various manners, not limited to the BGA and the PGA. For example, a staggered pin grid array (SPGA), a land grid array (LGA), a quad flat package (QFP), a quad flat J-leaded package (QFJ), or a quad flat non-leaded package (QFN) can be employed.

This embodiment can be implemented in combination with any of the structures described in the other embodiments and the like, as appropriate.

Embodiment 5

In this embodiment, application examples of a memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. The semiconductor device described in the above embodiment is applied to removable memory devices such as memory cards (e.g., SD cards), USB memories, and solid state drives (SSD). FIGS. 25A to 25E schematically shows some structure examples of removable memory devices. For example, the semiconductor device described in the above embodiment is processed into a packaged memory chip and used in a variety of memory devices and removable memories.

Figure 25A:
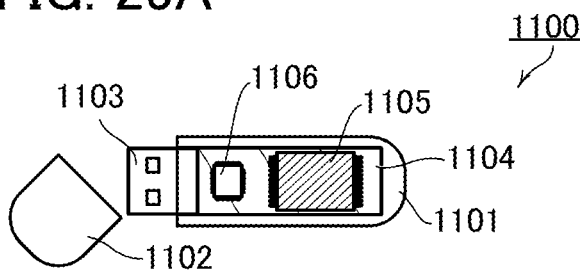
FIGS. 25A to 25E are schematic diagrams of structure examples of memory devices.

FIG. 25A is a schematic diagram of a USB memory. A USB memory 1100 includes a housing 1101, a cap 1102, a USB connector 1103, and a substrate 1104. The substrate 1104 is placed in the housing 1101. A memory chip 1105 and a controller chip 1106 are attached to the substrate 1104, for example. The semiconductor device described in the above embodiment can be incorporated in the memory chip 1105 or the like on the substrate 1104.

Figures 25B, 25C:
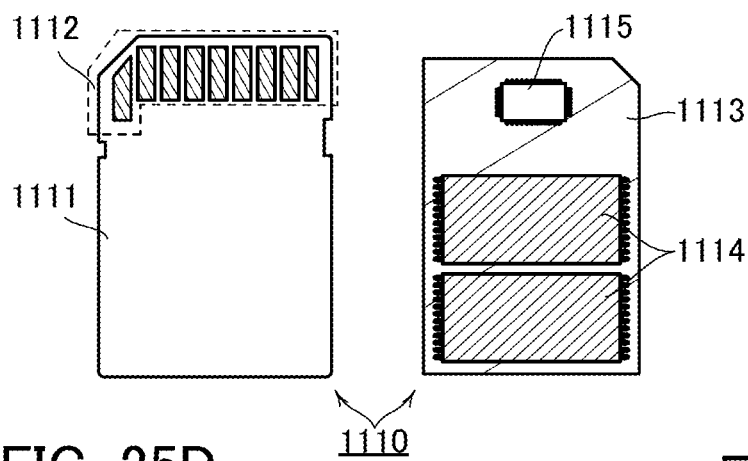

FIG. 25B is a schematic external diagram of an SD card, and FIG. 25C is a schematic diagram illustrating the internal structure of the SD card. An SD card 1110 includes a housing 1111, a connector 1112, and a substrate 1113. The substrate 1113 is placed in the housing 1111. A memory chip 1114 and a controller chip 1115 are attached to the substrate 1113, for example. The memory chip 1114 provided on the rear side of the substrate 1113 increases the capacity of the SD card 1110. In addition, a wireless chip with a wireless communication function may be provided on the substrate 1113. This enables data reading and writing of the memory chip 1114 by wireless communication between a host device and the SD card 1110. The semiconductor device described in the above embodiment can be incorporated in the memory chip 1114 or the like on the substrate 1113.

Figures 25D, 25E:
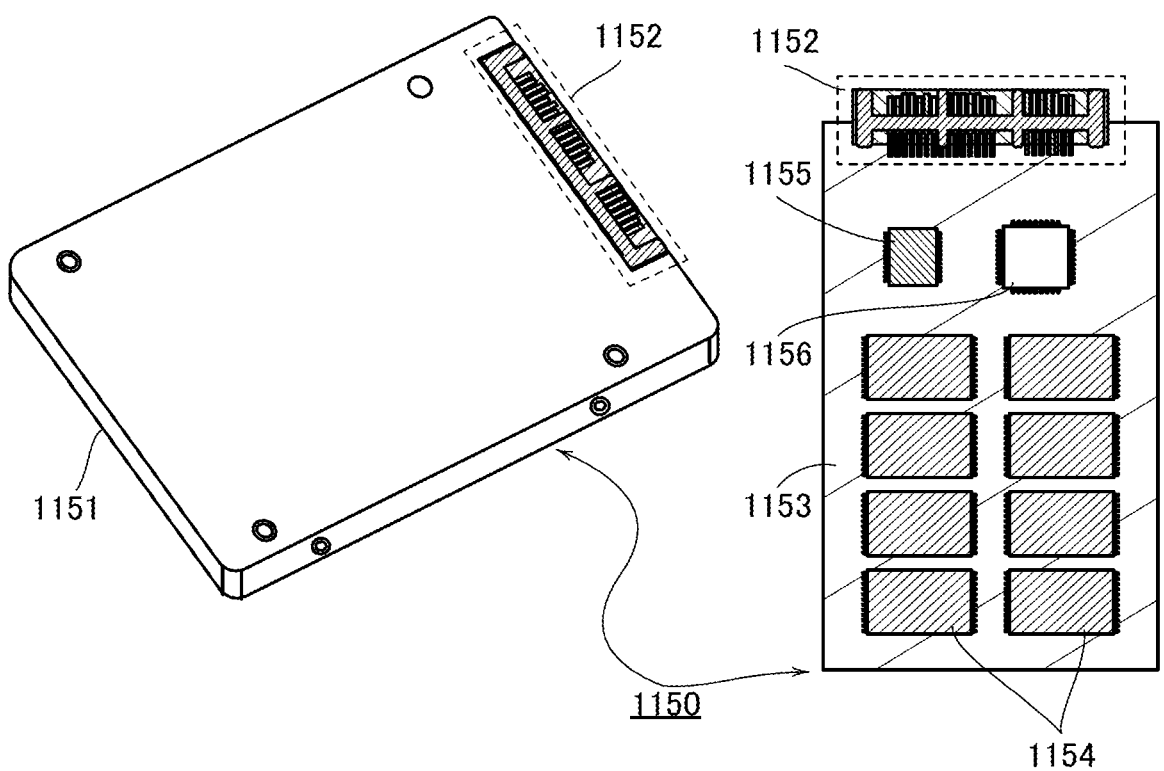

FIG. 25D is a schematic external diagram of an SSD, and FIG. 25E is a schematic diagram of the internal structure of the SSD. An SSD 1150 includes a housing 1151, a connector 1152, and a substrate 1153. The substrate 1153 is placed in the housing 1151. A memory chip 1154, a memory chip 1155, and a controller chip 1156 are attached to the substrate 1153, for example. The memory chip 1155 is a work memory for the controller chip 1156, and a DOSRAM chip can be used, for example. The memory chip 1154 provided on the rear side of the substrate 1153 increases the capacity of the SSD 1150. The semiconductor device described in the above embodiment can be incorporated in the memory chip 1154 or the like on the substrate 1153.

The structures, the methods, and the like described in this embodiment can be combined as appropriate with any of the structures, the methods, and the like described in the other embodiments.

Embodiment 6

FIGS. 26A, 26B, 26C, 26D, 26E1, 26E2, and 26F show specific examples of electronic devices in which the semiconductor device of one embodiment of the present invention can be used.

Specifically, the semiconductor device of one embodiment of the present invention can be used for processors such as a CPU or a GPU, or chips. FIGS. 26A, 26B, 26C, 26D, 26E1, 26E2, and 26F show specific examples of electronic devices including a processor, such as a CPU or a GPU, or a chip of one embodiment of the present invention.

<Electronic Devices and Systems>

The GPU or the chip of one embodiment of the present invention can be mounted on a variety of electronic devices. Examples of electronic devices include an electronic device with a large screen, such as a television device, a desktop or laptop personal computer, a monitor of a computer or the like, digital signage, and a large game machine (e.g., a pachinko machine); a camera such as a digital camera or a digital video camera; a digital photo frame; a mobile phone; a portable game console; a portable information terminal; and an audio reproducing device. In addition, when the integrated circuit or the chip of one embodiment of the present invention is provided in the electronic device, the electronic device can include artificial intelligence.

The electronic device of one embodiment of the present invention may include an antenna. With the antenna receiving signal, the electronic device can display an image, data, or the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIGS. 26A, 26B, 26C, 26D, 26E1, 26E2, and 26F show examples of electronic devices.

[Mobile Phone]

Figure 26A:
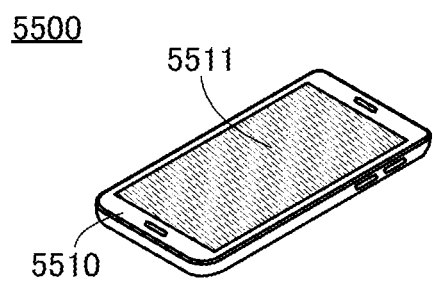

FIG. 26A illustrates a mobile phone (smartphone) which is a type of an information terminal. The information terminal 5500 includes a housing 5510 and a display portion 5511. As input interfaces, a touch panel and a button are provided in the display portion 5511 and the housing 5510, respectively.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

Figure 26B:
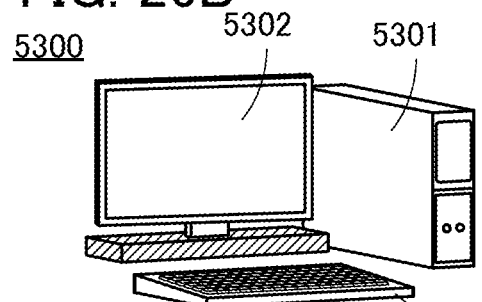

FIG. 26B shows a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the chip of one embodiment of the present invention as the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although FIGS. 26A and 26B shows a smartphone and a desktop information terminal, respectively, as examples of the electronic device, one embodiment of the present invention can also be applied to an information terminal other than the smartphone and the desktop information terminal. Examples of information terminals other than a smartphone and a desktop information terminal include a personal digital assistant (PDA), a laptop information terminal, and a workstation.

[Household Appliance]

Figure 26C:
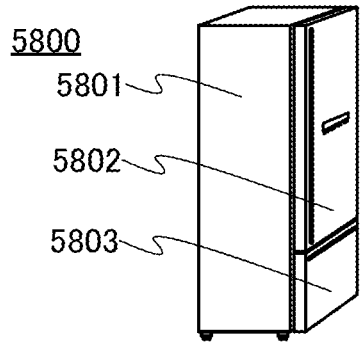

FIG. 26C shows an electric refrigerator-freezer 5800 which is an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of controlling the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machines]

Figure 26D:
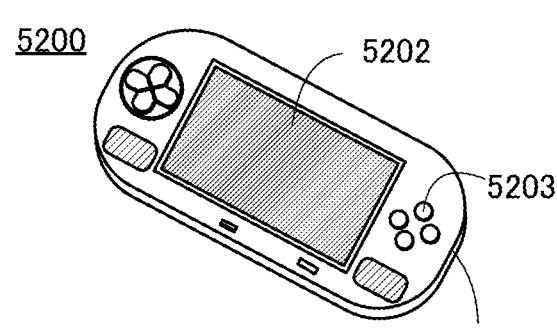
Figure 26D:
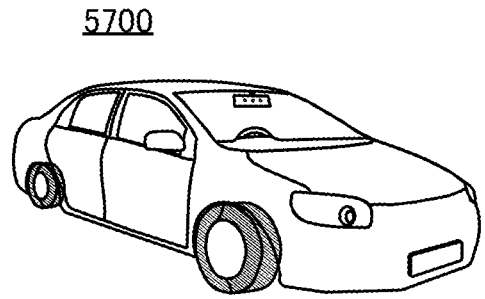
Figure 26D:
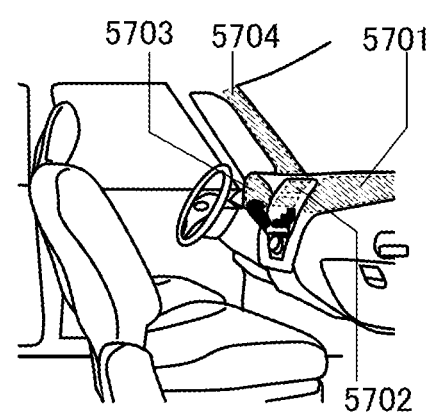

FIG. 26D shows a portable game machine 5200 as an example of a game machine. The portable game machine 5200 includes a housing 5201, a display portion 5202, a button 5203, and the like.

With the use of the GPU or the chip of one embodiment of the present invention in the portable game machine 5200, the portable game machine 5200 with low power consumption can be obtained. Furthermore, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters, and expressions of a phenomenon in the game are programed in the game; however, the use of artificial intelligence in the portable game machine 5200 enables expressions not limited by the game program. For example, questions posed by the player, the progress of the game, time, and actions and words of game characters can be changed for various expressions.

The artificial intelligence can construct a virtual game player; thus, a game that needs a plurality of players can be played by only one human game player with the portable game machine 5200, with the use of a virtual game player constructed by the artificial intelligence as an opponent.

Although the portable game machine is illustrated as an example of a game machine in FIG. 26D, the game machine using the GPU or the chip of one embodiment of the present invention is not limited thereto. Examples of the game machine using the GPU or the chip of one embodiment of the present invention include a home video game console, an arcade game machine installed in an entertainment facility (a game center, an amusement park, or the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 26E1 shows an automobile 5700 as an example of a moving vehicle, and FIG. 26E2 shows the periphery of a windshield inside the automobile. FIG. 26E2 shows a display panel 5701, a display panel 5702, and a display panel 5703 which are attached to a dashboard, and a display panel 5704 attached to a pillar.

The display panels 5701 to 5703 can provide various kinds of information by displaying a speedometer, a tachometer, a mileage, a fuel meter, a gearshift indicator, air-conditioning settings, and the like. Items displayed on the display panel, their layout, and the like can be changed as appropriate to suit the user's preferences, resulting in more sophisticated design. The display panels 5701 to 5703 can also be used as lighting devices.

The display panel 5704 can compensate for the view obstructed by the pillar (blind areas) by displaying an image taken by an imaging device (not illustrated) provided on the exterior of the automobile 5700. That is, displaying an image taken by the imaging device provided on the exterior of the automobile 5700 eliminates blind areas and enhances safety. Moreover, displaying an image to compensate for the area that a driver cannot see makes it possible for the driver to confirm safety more easily and comfortably. The display panel 5704 can also be used as a lighting device.

Because the GPU or the chip of one embodiment of the present invention can be used as a component of artificial intelligence, the chip can be used in the automatic driving system of the automobile 5700, for example. The chip can also be used for a system for navigation, risk prediction, or the like. The display panels 5701 to 5704 may display information regarding navigation information, risk prediction, and the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

Figure 26F:
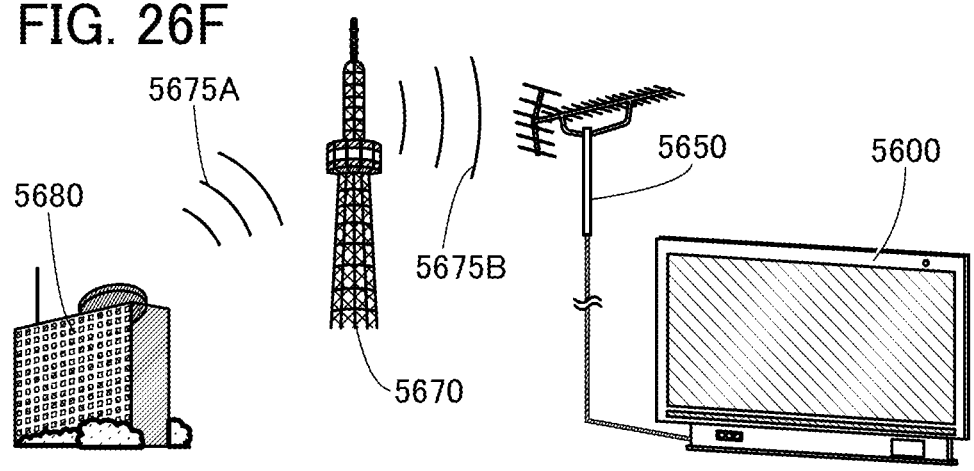

FIG. 26F schematically shows data transmission in a broadcasting system. Specifically, FIG. 26F shows a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although an ultra-high frequency (UHF) antenna is illustrated as the antenna 5650 in FIG. 26F, a BS/110° CS antenna, a CS antenna, or the like can also be used.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 26F and may be satellite broadcasting using an artificial satellite, data broadcasting using an optical line, or the like.

The above-described broadcasting system may utilize artificial intelligence by including the chip of one embodiment of the present invention. When the broadcast data is transmitted from the broadcast station 5680 to the TV 5600 at home, the broadcast data is compressed by an encoder. The antenna 5650 receives the compressed broadcast data, and then the compressed broadcast data is decompressed by a decoder of the receiving device in the TV 5600. With the use of the artificial intelligence, for example, a display pattern included in an image can be recognized in motion compensation prediction, which is one of the compressing methods for the encoder. In addition, in-frame prediction, for instance, can also be performed utilizing artificial intelligence. Furthermore, for example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As an application of artificial intelligence in the TV 5600, a recording device with artificial intelligence may be provided in the TV 5600, for example. With such a structure, the artificial intelligence in the recording device can learn the user's preference, so that TV programs that suit the user's preference can be recorded automatically.

The electronic device and its functions, an application example of the artificial intelligence and its effects, and the like described in this embodiment can be combined as appropriate with the description of another electronic device.

The structures, the methods, and the like described in this embodiment can be combined as appropriate with any of the structures, the methods, and the like described in the other embodiments.

This application is based on Japanese Patent Application Serial No. 2019-011582 filed with Japan Patent Office on Jan. 25, 2019, the entire contents of which are hereby incorporated by reference.

What is claimed is:

1. A semiconductor device comprising:
   an oxide in a channel formation region;
   a transistor; and
   a capacitor,
   wherein the transistor comprises:
      a first conductor and a second insulator which are over a first insulator;
      a third insulator over the first conductor and the second insulator;
      a fourth insulator over the third insulator;
      a first oxide over the fourth insulator;
      a second oxide and a third oxide which are over the first oxide;
      a second conductor in contact with a top surface of the third insulator, a side surface of the fourth insulator, a side surface of the first oxide, a side surface of the second oxide, and a top surface of the second oxide;
      a third conductor in contact with the top surface of the third insulator, a side surface of the fourth insulator, a side surface of the first oxide, a side surface of the third oxide, and a top surface of the third oxide;
      a fourth oxide over the first oxide;
      a fifth insulator over the fourth oxide; and
      a fourth conductor over the fifth insulator, and
   wherein the capacitor comprises:
      a fifth conductor over the first insulator;
      the third insulator over the fifth conductor; and
      the second conductor over the third insulator.

2. The semiconductor device according to claim 1,
   wherein each of the first oxide to the third oxide comprises In, an element M and Zn, and
   wherein the element M is any one of Al, Ga, Y, and Sn.

3. The semiconductor device according to claim 1,
   wherein the third insulator comprises any one of aluminum, hafnium, zirconium, and tantalum.

4. The semiconductor device according to claim 1,
   wherein the first insulator comprises silicon and nitrogen.

* * * * *